US009639413B2

(12) United States Patent
Drees et al.

(10) Patent No.: US 9,639,413 B2
(45) Date of Patent: May 2, 2017

(54) AUTOMATED FAULT DETECTION AND DIAGNOSTICS IN A BUILDING MANAGEMENT SYSTEM

(71) Applicant: Johnson Controls Technology Company, Holland, MI (US)

(72) Inventors: Kirk H. Drees, Cedarburg, WI (US); James P. Kummer, Wales, WI (US)

(73) Assignee: Johnson Controls Technology Company, Holland, MI (US)

( * ) Notice: Subject to any disclaimer, the term of this patent is extended or adjusted under 35 U.S.C. 154(b) by 447 days.

(21) Appl. No.: 14/273,381

(22) Filed: May 8, 2014

(65) Prior Publication Data

US 2014/0245071 A1 Aug. 28, 2014

Related U.S. Application Data

(63) Continuation of application No. 13/246,644, filed on Sep. 27, 2011, now Pat. No. 8,731,724, which is a
(Continued)

(51) Int. Cl.
*G05B 13/00* (2006.01)
*G09G 5/00* (2006.01)
(Continued)

(52) U.S. Cl.
CPC ............ *G06F 11/079* (2013.01); *G05B 15/02* (2013.01); *G06Q 30/0283* (2013.01);
(Continued)

(58) Field of Classification Search
CPC ... G06F 11/079; G06F 17/5004; G05B 15/02; G05B 2219/2642; G06Q 50/06; G06Q 30/0283; H02J 13/0062
(Continued)

(56) References Cited

U.S. PATENT DOCUMENTS 2,812,141 A 11/1957 Sueda et al.
3,181,791 A 5/1965 Axelrod
(Continued)

FOREIGN PATENT DOCUMENTS

JP 63-231127 A 9/1988
JP 04-062352 A 2/1992
(Continued)

OTHER PUBLICATIONS

Final Office Action on U.S. Appl. No. 13/252,092 Dated Apr. 23, 2015, 12 pages.
(Continued)

*Primary Examiner* — Robert Fennema
*Assistant Examiner* — Thomas Stevens
(74) *Attorney, Agent, or Firm* — Foley & Lardner LLP

(57) ABSTRACT

Systems and methods for building automation system management are shown and described. The systems and methods relate to fault detection via abnormal energy monitoring and detection. The systems and methods also relate to control and fault detection methods for chillers. The systems and methods further relate to graphical user interfaces for use with fault detection features of a building automation system.

18 Claims, 22 Drawing Sheets

Related U.S. Application Data continuation-in-part of application No. 12/949,660, filed on Nov. 18, 2010, now Pat. No. 8,532,839, which is a continuation-in-part of application No. 12/819,977, filed on Jun. 21, 2010, now Pat. No. 8,600,556.

(60) Provisional application No. 61/219,326, filed on Jun. 22, 2009, provisional application No. 61/234,217, filed on Aug. 14, 2009, provisional application No. 61/302,854, filed on Feb. 9, 2010.

(51) Int. Cl.
| | |
|---|---|
| G06F 11/07 | (2006.01) |
| G05B 15/02 | (2006.01) |
| G06Q 30/02 | (2012.01) |
| G06Q 50/06 | (2012.01) |
| G06F 11/00 | (2006.01) |
| G06F 17/50 | (2006.01) |
| H02J 13/00 | (2006.01) |

(52) U.S. Cl.
CPC .......... *G06Q 50/06* (2013.01); *H02J 13/0062* (2013.01); *G05B 2219/2642* (2013.01); *G06F 17/5004* (2013.01); *H02J 13/001* (2013.01); *Y02B 70/3216* (2013.01); *Y02B 70/3241* (2013.01); *Y02B 90/2638* (2013.01); *Y04S 20/221* (2013.01); *Y04S 20/227* (2013.01); *Y04S 40/124* (2013.01); *Y04S 50/14* (2013.01)

(58) Field of Classification Search
USPC .................. 345/629–637; 714/31; 700/276; 707/721, 736
See application file for complete search history.

(56) References Cited

U.S. PATENT DOCUMENTS

| | | |
|---|---|---|
| 3,641,326 A | 2/1972 | Harte |
| 3,998,093 A | 12/1976 | Bertolasi |
| 4,114,807 A | 9/1978 | Naseck et al. |
| 4,182,180 A | 1/1980 | Mott |
| 4,199,101 A | 4/1980 | Bramow et al. |
| 4,211,089 A | 7/1980 | Mueller et al. |
| 4,213,174 A | 7/1980 | Morley et al. |
| 4,257,238 A | 3/1981 | Kountz et al. |
| 4,319,461 A | 3/1982 | Shaw |
| 4,325,223 A | 4/1982 | Cantley |
| 4,346,446 A | 8/1982 | Erbstein et al. |
| 4,432,031 A | 2/1984 | Premerlani |
| 4,512,161 A | 4/1985 | Logan et al. |
| 4,557,317 A | 12/1985 | Harmon, Jr. |
| 4,558,595 A | 12/1985 | Kompelien |
| 4,607,789 A | 8/1986 | Bowman |
| 4,611,470 A | 9/1986 | Enstrom |
| 4,622,922 A | 11/1986 | Miyagaki et al. |
| 4,749,122 A | 6/1988 | Shriver et al. |
| 4,776,301 A | 10/1988 | Dziubakowski |
| 4,802,100 A | 1/1989 | Aasen et al. |
| 4,855,922 A | 8/1989 | Huddleston et al. |
| 4,866,635 A | 9/1989 | Kahn et al. |
| 4,876,858 A | 10/1989 | Shaw et al. |
| 4,897,798 A | 1/1990 | Cler |
| 4,916,909 A | 4/1990 | Mathur et al. |
| 4,942,740 A | 7/1990 | Shaw et al. |
| 4,964,126 A | 10/1990 | Musicus et al. |
| 5,042,997 A | 8/1991 | Rhodes |
| 5,074,137 A | 12/1991 | Harris et al. |
| 5,090,303 A | 2/1992 | Ahmed |
| 5,099,436 A | 3/1992 | McCown et al. |
| 5,103,391 A | 4/1992 | Barrett |
| 5,115,967 A | 5/1992 | Wedekind |
| 5,131,746 A | 7/1992 | O'Rourke et al. |
| 5,189,606 A | 2/1993 | Burns et al. |
| 5,218,525 A | 6/1993 | Amasaki et al. |
| 5,251,814 A | 10/1993 | Warashina et al. |
| 5,253,159 A | 10/1993 | Bilas et al. |
| 5,274,571 A | 12/1993 | Hesse et al. |
| 5,299,312 A | 3/1994 | Rocco, Jr. |
| 5,315,502 A | 5/1994 | Koyama et al. |
| 5,346,129 A | 9/1994 | Shah et al. |
| 5,351,855 A | 10/1994 | Nelson et al. |
| 5,355,305 A | 10/1994 | Seem et al. |
| 5,384,697 A | 1/1995 | Pascucci |
| 5,414,640 A | 5/1995 | Seem |
| 5,426,421 A | 6/1995 | Gray |
| 5,461,877 A | 10/1995 | Shaw et al. |
| 5,467,287 A | 11/1995 | Wenner et al. |
| 5,481,481 A | 1/1996 | Frey et al. |
| 5,506,768 A | 4/1996 | Seem et al. |
| 5,528,516 A | 6/1996 | Yemini et al. |
| 5,552,763 A | 9/1996 | Kirby |
| 5,555,195 A | 9/1996 | Jensen et al. |
| 5,557,546 A | 9/1996 | Fukai et al. |
| 5,566,084 A | 10/1996 | Cmar |
| 5,566,092 A | 10/1996 | Wang et al. |
| 5,568,377 A | 10/1996 | Seem et al. |
| 5,572,878 A | 11/1996 | Kapoor |
| 5,582,021 A | 12/1996 | Masauji |
| 5,590,830 A | 1/1997 | Kettler et al. |
| 5,592,147 A | 1/1997 | Wong |
| 5,596,507 A | 1/1997 | Jones et al. |
| 5,602,761 A | 2/1997 | Spoerre et al. |
| 5,663,963 A | 9/1997 | Goodwin, III |
| 5,675,979 A | 10/1997 | Shah |
| 5,682,329 A | 10/1997 | Seem et al. |
| 5,751,916 A | 5/1998 | Kon et al. |
| 5,769,315 A | 6/1998 | Drees |
| 5,791,408 A | 8/1998 | Seem |
| 5,801,940 A | 9/1998 | Russ et al. |
| 5,838,561 A | 11/1998 | Owen |
| 5,867,384 A | 2/1999 | Drees et al. |
| 5,884,072 A | 3/1999 | Rasmussen |
| 5,911,127 A | 6/1999 | Tulpule |
| 5,918,200 A | 6/1999 | Tsutsui et al. |
| 5,924,486 A | 7/1999 | Ehlers et al. |
| 5,930,773 A | 7/1999 | Crooks et al. |
| 5,960,381 A | 9/1999 | Singers et al. |
| 5,963,458 A | 10/1999 | Cascia |
| 6,005,577 A | 12/1999 | Breitlow |
| 6,006,142 A | 12/1999 | Seem et al. |
| 6,012,152 A | 1/2000 | Douik et al. |
| 6,021,401 A | 2/2000 | Oravetz et al. |
| 6,029,092 A | 2/2000 | Stein |
| 6,058,161 A | 5/2000 | Anderson et al. |
| 6,064,310 A | 5/2000 | Busak et al. |
| 6,067,083 A | 5/2000 | Glen et al. |
| 6,104,963 A | 8/2000 | Cebasek et al. |
| 6,122,603 A | 9/2000 | Budike, Jr. |
| 6,122,605 A | 9/2000 | Drees et al. |
| 6,141,595 A | 10/2000 | Gloudeman et al. |
| 6,148,306 A | 11/2000 | Seidl et al. |
| 6,157,943 A | 12/2000 | Meyer |
| 6,161,764 A | 12/2000 | Jatnieks |
| 6,178,362 B1 | 1/2001 | Woolard et al. |
| 6,185,483 B1 | 2/2001 | Drees |
| 6,216,956 B1 | 4/2001 | Ehlers et al. |
| 6,219,590 B1 | 4/2001 | Bernaden, III et al. |
| 6,223,544 B1 | 5/2001 | Seem |
| 6,253,121 B1 | 6/2001 | Cline et al. |
| 6,265,843 B1 | 7/2001 | West et al. |
| 6,269,650 B1 | 8/2001 | Shaw |
| 6,282,910 B1 | 9/2001 | Helt |
| 6,296,193 B1 | 10/2001 | West et al. |
| 6,324,659 B1 | 11/2001 | Pierro |
| 6,366,832 B2 | 4/2002 | Lomonaco et al. |
| 6,366,889 B1 | 4/2002 | Zaloom |
| 6,369,716 B1 | 4/2002 | Abbas et al. |
| 6,389,331 B1 | 5/2002 | Jensen et al. |
| 6,408,228 B1 | 6/2002 | Seem et al. |
| 6,415,276 B1 | 7/2002 | Heger et al. |
| 6,415,617 B1 | 7/2002 | Seem |

(56) References Cited

U.S. PATENT DOCUMENTS

| | | |
|---|---|---|
| 6,456,622 B1 | 9/2002 | Skaanning et al. |
| 6,477,439 B1 | 11/2002 | Bernaden, III et al. |
| 6,535,865 B1 | 3/2003 | Skaaning et al. |
| 6,556,950 B1 | 4/2003 | Schwenke et al. |
| 6,577,962 B1 | 6/2003 | Afshari |
| 6,594,554 B1 | 7/2003 | Seem et al. |
| 6,622,264 B1 | 9/2003 | Bliley et al. |
| 6,626,366 B2 | 9/2003 | Kayahara et al. |
| 6,631,299 B1 | 10/2003 | Patel et al. |
| 6,633,782 B1 | 10/2003 | Schleiss et al. |
| 6,651,034 B1 | 11/2003 | Hedlund et al. |
| 6,676,831 B2 | 1/2004 | Wolfe |
| 6,684,208 B2 | 1/2004 | Kil et al. |
| 6,687,685 B1 | 2/2004 | Sadeghi et al. |
| 6,757,668 B1 | 6/2004 | Goebel et al. |
| 6,785,592 B1 | 8/2004 | Smith et al. |
| 6,816,811 B2 | 11/2004 | Seem |
| 6,834,208 B2 | 12/2004 | Gonzales et al. |
| 6,853,882 B2 | 2/2005 | Dudley |
| 6,862,499 B1 | 3/2005 | Cretella et al. |
| 6,862,540 B1 | 3/2005 | Welch et al. |
| 6,865,449 B2 | 3/2005 | Dudley |
| 6,891,536 B2 | 5/2005 | Smith |
| 6,937,909 B2 | 8/2005 | Seem |
| 6,944,524 B2 | 9/2005 | Shier et al. |
| 6,968,295 B1 | 11/2005 | Carr |
| 6,973,793 B2 | 12/2005 | Douglas et al. |
| 6,996,508 B1 | 2/2006 | Culp et al. |
| 7,031,880 B1 | 4/2006 | Seem et al. |
| 7,036,559 B2 | 5/2006 | Stanimirovic |
| 7,043,661 B2 | 5/2006 | Valadarsky et al. |
| 7,096,387 B2 | 8/2006 | Durrant et al. |
| 7,110,919 B2 | 9/2006 | Brindac et al. |
| 7,113,890 B2 | 9/2006 | Frerichs et al. |
| 7,113,988 B2 | 9/2006 | Chirashnya et al. |
| 7,124,637 B2 | 10/2006 | Singhal et al. |
| 7,181,648 B2 | 2/2007 | Bjorsne et al. |
| 7,212,887 B2 | 5/2007 | Shah et al |
| 7,216,021 B2 | 5/2007 | Matsubara et al. |
| 7,218,974 B2 | 5/2007 | Rumi et al. |
| 7,222,800 B2 | 5/2007 | Wruck |
| 7,225,089 B2 | 5/2007 | Culp et al. |
| 7,231,281 B2 | 6/2007 | Costa |
| 7,246,039 B2 | 7/2007 | Moorhouse |
| 7,251,582 B2 | 7/2007 | Singh et al. |
| 7,257,744 B2 | 8/2007 | Sabet et al. |
| 7,284,372 B2 | 10/2007 | Crow |
| 7,356,548 B1 | 4/2008 | Culp et al. |
| 7,409,303 B2 | 8/2008 | Yeo et al. |
| 7,434,413 B2 | 10/2008 | Wruck |
| 7,444,251 B2 | 10/2008 | Nikovski et al. |
| 7,451,003 B2 | 11/2008 | Chester et al. |
| 7,451,017 B2 | 11/2008 | McNally |
| 7,519,485 B2 | 4/2009 | MacGregor |
| 7,552,033 B1 | 6/2009 | Culp et al. |
| 7,567,844 B2 | 7/2009 | Thomas et al. |
| 7,567,888 B2 | 7/2009 | Chang et al. |
| 7,577,550 B2 | 8/2009 | Ozonat et al. |
| 7,578,734 B2 | 8/2009 | Ahmed et al. |
| 7,636,613 B2 | 12/2009 | Borah et al. |
| 7,685,830 B2 | 3/2010 | Thybo et al. |
| 7,698,233 B1 | 4/2010 | Edwards et al. |
| 7,705,269 B2 | 4/2010 | Daniel |
| 7,729,789 B2 | 6/2010 | Blevins et al. |
| 7,822,709 B2 | 10/2010 | Godwin |
| 7,827,813 B2 | 11/2010 | Seem |
| 7,844,366 B2 | 11/2010 | Singh |
| 7,844,370 B2 | 11/2010 | Pollack et al. |
| 7,873,442 B2 | 1/2011 | Tsui |
| 7,873,485 B2 | 1/2011 | Castelli et al. |
| 7,880,602 B2 | 2/2011 | Kasamatsu |
| 7,881,889 B2 | 2/2011 | Barclay et al. |
| 7,908,126 B2 | 3/2011 | Bahel et al. |
| 7,918,407 B2 | 4/2011 | Patch |
| 7,962,536 B2 | 6/2011 | Culp et al. |
| 7,965,178 B1 | 6/2011 | Schmuttor et al. |
| 8,027,742 B2 | 9/2011 | Seem et al. |
| 8,103,465 B2 | 1/2012 | Brzezowski et al. |
| 8,172,154 B1 | 5/2012 | Figley et al. |
| 8,200,344 B2 | 6/2012 | Li et al. |
| 8,200,345 B2 | 6/2012 | Li et al. |
| 8,200,449 B2 | 6/2012 | Mark |
| 8,200,456 B2 | 6/2012 | Marik et al. |
| 8,219,250 B2 | 7/2012 | Dempster et al. |
| 8,239,168 B2 | 8/2012 | House et al. |
| 8,374,725 B1 | 2/2013 | Ols |
| 8,417,392 B2 | 4/2013 | Higgins |
| 8,543,244 B2 | 9/2013 | Keeling et al. |
| 8,682,612 B2 | 3/2014 | Mousavi et al. |
| 8,826,165 B2 | 9/2014 | Harrod et al. |
| 2001/0045960 A1 | 11/2001 | Keeley |
| 2002/0010563 A1 | 1/2002 | Ratteree et al. |
| 2002/0016639 A1 | 2/2002 | Smith et al. |
| 2002/0030114 A1 | 3/2002 | Kayahara et al. |
| 2002/0038169 A1 | 3/2002 | Cline et al. |
| 2002/0045995 A1 | 4/2002 | Shimazaki et al. |
| 2002/0055820 A1 | 5/2002 | Scannell |
| 2002/0138782 A1 | 9/2002 | Durrant et al. |
| 2002/0152298 A1 | 10/2002 | Kikta et al. |
| 2002/0178047 A1 | 11/2002 | Or et al. |
| 2002/0183988 A1 | 12/2002 | Skaanning et al. |
| 2003/0014160 A1 | 1/2003 | Nordquist et al. |
| 2003/0028350 A1 | 2/2003 | Seem |
| 2003/0031164 A1 | 2/2003 | Nabkel et al. |
| 2003/0074304 A1 | 4/2003 | Okada |
| 2003/0079483 A1 | 5/2003 | Komatsu et al. |
| 2003/0090371 A1 | 5/2003 | Teowee et al. |
| 2003/0093186 A1 | 5/2003 | Patterson et al. |
| 2003/0105556 A1 | 6/2003 | Enis et al. |
| 2003/0114942 A1 | 6/2003 | Varone et al. |
| 2003/0135339 A1 | 7/2003 | Gristina et al. |
| 2003/0172087 A1 | 9/2003 | Godwin |
| 2003/0177705 A1 | 9/2003 | Forbis et al. |
| 2003/0229572 A1 | 12/2003 | Raines et al. |
| 2004/0002776 A1 | 1/2004 | Bickford |
| 2004/0010733 A1 | 1/2004 | S. et al. |
| 2004/0024494 A1 | 2/2004 | Bayoumi et al. |
| 2004/0072535 A1 | 4/2004 | Schneider et al. |
| 2004/0078094 A1* | 4/2004 | Nagatsuka ......... G05B 19/042 700/9 |
| 2004/0102924 A1 | 5/2004 | Jarrell et al. |
| 2004/0102937 A1 | 5/2004 | Ibrahim |
| 2004/0143474 A1 | 7/2004 | Haeberle et al. |
| 2004/0143510 A1 | 7/2004 | Haeberle et al. |
| 2004/0143810 A1 | 7/2004 | Ahmed et al. |
| 2004/0153819 A1 | 8/2004 | Bjorsne et al. |
| 2004/0158417 A1 | 8/2004 | Bonet |
| 2004/0164690 A1 | 8/2004 | Degner et al. |
| 2004/0186630 A1 | 9/2004 | Shier et al. |
| 2004/0225513 A1 | 11/2004 | Haeberle et al. |
| 2004/0267385 A1 | 12/2004 | Lingemann |
| 2004/0267395 A1 | 12/2004 | Discenzo et al. |
| 2005/0006488 A1 | 1/2005 | Stanimirovic |
| 2005/0033458 A1 | 2/2005 | Brindac et al. |
| 2005/0033481 A1 | 2/2005 | Budhraja et al. |
| 2005/0040250 A1 | 2/2005 | Wruck |
| 2005/0114311 A1 | 5/2005 | Cheng et al. |
| 2005/0159847 A1 | 7/2005 | Shah et al. |
| 2005/0160324 A1 | 7/2005 | Przytula et al. |
| 2005/0192680 A1 | 9/2005 | Cascia et al. |
| 2005/0192915 A1 | 9/2005 | Ahmed et al. |
| 2005/0256661 A1 | 11/2005 | Salsbury et al. |
| 2005/0278047 A1 | 12/2005 | Ahmed |
| 2006/0015195 A1 | 1/2006 | Lehman et al. |
| 2006/0058900 A1 | 3/2006 | Johanson et al. |
| 2006/0058923 A1 | 3/2006 | Kruk et al. |
| 2006/0090467 A1 | 5/2006 | Crow |
| 2006/0106739 A1 | 5/2006 | Holzbauer et al. |
| 2006/0125422 A1 | 6/2006 | Costa |
| 2006/0144057 A1 | 7/2006 | You et al. |
| 2006/0167591 A1 | 7/2006 | McNally |
| 2006/0173256 A1 | 8/2006 | Ridder et al. |
| 2006/0186214 A1 | 8/2006 | Simon et al. |
| 2006/0206240 A1 | 9/2006 | Tsui |

(56) References Cited

U.S. PATENT DOCUMENTS

| | | |
|---|---|---|
| 2006/0224254 A1 | 10/2006 | Rumi et al. |
| 2006/0259285 A1 | 11/2006 | Bahel et al. |
| 2007/0006124 A1 | 1/2007 | Ahmed et al. |
| 2007/0023533 A1 | 2/2007 | Liu |
| 2007/0061046 A1 | 3/2007 | Mairs et al. |
| 2007/0067062 A1 | 3/2007 | Mairs et al. |
| 2007/0139183 A1 | 6/2007 | Kates |
| 2007/0143045 A1 | 6/2007 | MacGregor |
| 2007/0225868 A1 | 9/2007 | Terlson et al. |
| 2007/0244573 A1 | 10/2007 | McFarland |
| 2008/0028778 A1 | 2/2008 | Millet |
| 2008/0033674 A1 | 2/2008 | Nikovski et al. |
| 2008/0054082 A1 | 3/2008 | Evans et al. |
| 2008/0082183 A1 | 4/2008 | Judge |
| 2008/0097651 A1 | 4/2008 | Shah et al. |
| 2008/0147465 A1 | 6/2008 | Raines et al. |
| 2008/0171396 A1 | 7/2008 | Fung et al. |
| 2008/0172258 A1 | 7/2008 | Weger et al. |
| 2008/0179408 A1 | 7/2008 | Seem |
| 2008/0183424 A1 | 7/2008 | Seem |
| 2008/0231437 A1 | 9/2008 | Singhal et al. |
| 2008/0275674 A1 | 11/2008 | Reghetti et al. |
| 2008/0277486 A1 | 11/2008 | Seem et al. |
| 2008/0300963 A1 | 12/2008 | Seetharaman et al. |
| 2009/0012654 A1 | 1/2009 | Culp et al. |
| 2009/0076790 A1 | 3/2009 | Fein et al. |
| 2009/0078401 A1 | 3/2009 | Cichanowicz |
| 2009/0083583 A1 | 3/2009 | Seem et al. |
| 2009/0099889 A1 | 4/2009 | Okamoto et al. |
| 2009/0105846 A1 | 4/2009 | Hesse et al. |
| 2009/0106178 A1 | 4/2009 | Chu |
| 2009/0112522 A1 | 4/2009 | Rasmussen |
| 2009/0132096 A1 | 5/2009 | Swarztrauber et al. |
| 2009/0138203 A1 | 5/2009 | Iossifov et al. |
| 2009/0204267 A1 | 8/2009 | Sustaeta et al. |
| 2009/0216469 A1 | 8/2009 | Marik et al. |
| 2009/0308941 A1 | 12/2009 | Patch |
| 2009/0327890 A1 | 12/2009 | Mertz et al. |
| 2010/0004882 A1 | 1/2010 | Chu et al. |
| 2010/0042453 A1 | 2/2010 | Scaramellino et al. |
| 2010/0049676 A1 | 2/2010 | Devitt et al. |
| 2010/0070907 A1 | 3/2010 | Harrod et al. |
| 2010/0082161 A1 | 4/2010 | Patch |
| 2010/0106316 A1 | 4/2010 | Curry et al. |
| 2010/0106319 A1 | 4/2010 | Grohman et al. |
| 2010/0106321 A1 | 4/2010 | Hadzidedic |
| 2010/0106328 A1 | 4/2010 | Li et al. |
| 2010/0106331 A1 | 4/2010 | Li et al. |
| 2010/0114385 A1 | 5/2010 | Dempster et al. |
| 2010/0207951 A1 | 8/2010 | Plaisted et al. |
| 2010/0211222 A1 | 8/2010 | Ghosn |
| 2010/0257108 A1 | 10/2010 | Skeels et al. |
| 2010/0274366 A1 | 10/2010 | Fata et al. |
| 2010/0280774 A1 | 11/2010 | Ewing et al. |
| 2010/0283606 A1 | 11/2010 | Tsypin et al. |
| 2010/0286937 A1* | 11/2010 | Hedley .................. G06Q 30/02 702/60 |
| 2010/0324741 A1 | 12/2010 | House et al. |
| 2010/0324962 A1 | 12/2010 | Nesler et al. |
| 2011/0029422 A1 | 2/2011 | Rey |
| 2011/0046970 A1 | 2/2011 | Fontenot |
| 2011/0061015 A1 | 3/2011 | Drees et al. |
| 2011/0178977 A1 | 7/2011 | Drees |
| 2011/0204720 A1 | 8/2011 | Ruiz et al. |
| 2011/0231320 A1 | 9/2011 | Irving |
| 2011/0246381 A1 | 10/2011 | Fitch et al. |
| 2011/0285656 A1* | 11/2011 | Yaksick .............. G06F 3/04886 345/173 |
| 2011/0320045 A1 | 12/2011 | Salsbury et al. |
| 2012/0072039 A1 | 3/2012 | Anderson et al. |
| 2013/0103201 A1 | 4/2013 | Huizenga et al. |

FOREIGN PATENT DOCUMENTS

| | | |
|---|---|---|
| JP | 10-047738 A | 2/1998 |
| JP | 06-079426 A | 3/2006 |
| JP | 2006-079426 A | 3/2006 |
| SU | 535103 | 11/1976 |
| WO | WO-00/68744 A1 | 11/2000 |
| WO | WO-2009/012269 A2 | 1/2009 |
| WO | WO-2009/012282 A2 | 1/2009 |

OTHER PUBLICATIONS

Non-Final Office Action on U.S. Appl. No. 13/439,779 Dated Nov. 3, 2015, 13 pages.
Notice of Allowance on U.S. Appl. No. 13/252,092 Dated Nov. 2, 2015, 9 pages.
Notice of Allowance on U.S. Appl. No. 14/021,948 Dated Feb. 1, 2016, 5 pages.
Supplemental Notice of Allowance on U.S. Appl. No. 13/252,092 Dated Nov. 16, 2015, 2 pages.
Office Action on U.S. Appl. No. 14/320,203 Dated Mar. 31, 2016, 33 pages.
Notice of Allowance on U.S. Appl. No. 14/091,261 Dated Apr. 25, 2016, 8 pages.
Andersen, Stochastic Modeling of Energy Systems, Technical University of Denmark, Department of Informatics and Mathematical Modeling, 2001, 212 pages.
ANSI/ASHRAE/IESNA 90.1 User's Manual, Energy Standard for Buildings Except Low-Rise Residential Buildings, 2004, 7 pages.
Ashrae Guideline 14-2002, Measurement of Energy and Demand Savings, 2002, 170 pages.
Ashrae Standard 90.1-2004, Energy Standard for Buildings Except Low-Rise Residential Buildings, 2004, 4 pages.
Barnett et al., Outliers in Statistical Data, 1994, 14 pages.
Cowan, Review of Recent Commercial Roof Top Unit Field Studies in the Pacific Northwest and California, Oct. 8, 2004, 18 pages.
DOE Federal Emergency Management Program, Actions You Can Take to Reduce Cooling Costs, http://www1.eere.energy.gov/femp/pdfs/om_cooling.pdf, May 2005, 8 pages.
Edelson, Building Automation Security in Office Building, Elsevier, 2004, 3 pages.
Financial Times Energy, Inc. Economizers, Energy Design Resources, taken from http://www.energydesignresources.com/resource/28/, Jan. 2007, 32 pages.
Geweke, Efficient Simulation from the Multivariate Normal and Student-T Distributions Subject to Linear Constraints and the Evaluation of Constraint Probabilities, Computing Science and Statistics, Seattle, Apr. 22-24, 1991, 14 pages.
House et al., An Expert Rule Set for Fault Detection in Air-Handling Units, ASHRAE Transactions, 2001, 32 pages.
Iglewicz et al., vol. 16: How to Detect and Handle Outliers, The ASQC Basic References in Quality Control: Statistical Techniques, 1993, 15 pages.
International Performance Measurement & Verification Protocol, Concepts and Options for Determining Energy and Water Savings, Mar. 2002, 93 pages.
International Search Report and Written Opinion for International Patent Application No. PCT/US2008/070091, mailed Sep. 30, 2009, 13 pages.
International Search Report and Written Opinion for International Patent Application No. PCT/US2008/070118, mailed Oct. 19, 2009, 11 pages.
International Search Report and Written Opinion for International Patent Application No. PCT/US2011/024079, mailed Oct. 24, 2011, 9 pages.
Jaehn, The Zone Control Chart, Quality Progress, Jul. 1991, 6 pages.
Kastner, Communication Systems for Building Automation and Control, 2005, 26 pages.
Katipamula et al., Methods for Fault Detection, Diagnostics, and Prognostics for Building Systems-A Review, Part I, American Society of Heating, 2005, 24 pages.

(56) References Cited

OTHER PUBLICATIONS

Katipamula et al., Methods of Fault Detection, Diagnostics, and Prognostics for Building Systems—A Review, Part II, American Society of Heating, Refrigerating and Air Conditioning Engineers, 2005, 19 pages.
Kim et al., Performance Enhancement of Cyclostationarity Detector by Utilizing Multiple Cyclic Frequencies of OFDM Signals, IEEE DySPAN, 2010, 8 pages.
Leblanc, Sur l'electrification des Chemins de fer au Moyen de Courants Alternatifs de Frequence Elevee, Revue Generale de l'Electricite, 1922, 4 pages.
Leyva et al., MPPT of Photovoltaic Systems using Extremum-Seeking Control, IEEE Transactions on Aerospace and Electronic Systems, Jan. 2006, 10 pages.
Li et al., Extremum Seeking Control of a Tunable Thermoacoustic Cooler, IEEE Transactions on Control Systems Technology, Jul. 2005, 10 pages.
Martin et al., Supervisory Control for Energy Savings and Thermal Comfort in Commercial Building HVAC Systems, AAAI Technical Report, 2002, 8 pages.
Mathews et al., A Tool for Integrated HVAC, Building, Energy, and Control Analysis Part 1: Overview of QUICK Control, 1999, 21 pages.
Nelson, Best Target Value for a Production Process, Journal of Quality Technology, Apr. 1978, 4 pages.
Office Action for U.S. Appl. No. 11/699,859, mail date Mar. 15, 2010, 12 pages.
Office Action for U.S. Appl. No. 11/699,860, mail date Aug. 20, 2009, 18 pages.
Office Action for U.S. Appl. No. 11/699,860, mail date Jun. 9, 2010, 9 pages.
Office Action for U.S. Appl. No. 12/819,977, mail date Sep. 13, 2012, 21 pages.
Office Action for U.S. Appl. No. 12/916,145, mail date Oct. 8, 2013, 23 pages.
Office Action for U.S. Appl. No. 12/949,660, mail date Nov. 7, 2012, 33 pages.
Office Action for U.S. Appl. No. 13/023,392, mail date Nov. 7, 2012, 31 pages.
Office Action for U.S. Appl. No. 13/077,508, mail date Dec. 3, 2013, 39 pages.
Office Action for U.S. Appl. No. 13/077,508, mail date May 22, 2013, 26 pages.
Office Action for U.S. Appl. No. 13/167,571, mail date Jun. 26, 2013, 40 pages.
Office Action for U.S. Appl. No. 13/167,571, mail date Nov. 5, 2013, 43 pages.
Office Action for U.S. Appl. No. 13/252,092, mail date Nov. 19, 2013, 12 pages.
Quesenberry, SPC Methods of Quality Improvement, 1997, 49 pages.
Rosner, Percentage Points for a Generalized ESD Many-Outlier Procedure, Technometrics, May 1983, 10 pages.
Salsbury, A Controller for HVAC Systems with Embedded Fault Detection Capabilities Based on Simulation Models, Sep. 1999, 8 pages.
Sane et al., Building HVAC Control Systems—Role of Controls and Optimization, Jun. 2006, 6 pages.
Shakeri et al., "Optimal and Near-Optimal Algorithms for Multiple Fault Diagnosis with Unreliable Tests", IEEE, 1996,pp. 473-482.
Sreedharan et al., Comparison of Chiller Models for Use in Model-Based Fault Detection, eScholarship, 2001, 12 pages.
Teel, Lyapunov Methods in Nonsmooth Optimization, Part I: Quasi-Newton Algorithms for Lipschitz, Regular Functions, Dec. 2000, 8 pages.
Teel, Lyapunov Methods in Nonsmooth Optimization, Part II: Persistently Exciting Finite Differences, Dec. 2000, 8 pages.
Titica et al., Adaptive Extremum Seeking Control of Fed-Batch Bioreactors, European Journal of Control, 2003, 14 pages.
Tudoroiu et al., "Fault Detection and Diagnostic of Valve Actuators in HVAC System", IEEE, 2005, pp. 1281-1286.
U.S. Department of Energy, M&V Guidelines: Measurement and Verification for Federal Energy Projects, Apr. 2008, 306 pagees.
Uraikul et al., Artificial Intelligence for Monitoring and Supervisory Control of Process Systems, 2006, 17 pages.
Wong et al., Building Automation in the 21st Century, IEEE, 1997, 6 pages.
Non-Final Office Action on U.S. Appl. No. 13/252,092 Dated Sep. 29, 2014, 11 pages.
Non-Final Office Action on U.S. Appl. No. 13/439,779 Dated Sep. 10, 2014, 13 pages.
Non-Final Office Action on U.S. Appl. No. 14/021,948 Dated Oct. 2, 2014, 17 pages.
U.S. Appl. No. 61/302,854, filed Feb. 9, 2010, Drees, K.
Final Office Action on U.S. Appl. No. 13/485,682 Dated Sep. 1, 2015, 29 pages.
Final Office Action on U.S. Appl. No. 14/021,948 Dated Jul. 14, 2015, 8 pages.
Non-Final Office Action on U.S. Appl. No. 14/320,203 Dated Sep. 15, 2015, 16 pages.
Non-Final Office Action on U.S. Appl. No. 14/091,261 Dated Aug. 28, 2015, 8 pages.
Notice of Allowance on U.S. Appl. No. 13/167,571 Dated Aug. 3, 2015, 8 pages.
Sanchez-Pena et al., "Iterative Identification and Control Design: Methodology and Applications," Identification and Control: The Gap Between Theory and Practice (2007), Chapter 9, 34 pages.
U.S. Department of Energy, International Performance Measurement & Verification Protocol, 2002, DOE/GO-102002-1554, 93 pages.
Final Office Action on U.S. Appl. No. 13/167,571, mail date Jan. 29, 2015, 6 pages.
Final Office Action on U.S. Appl. No. 13/439,779 Dated Apr. 2,2015, 15 pages.
Non-Final Office Action on U.S. Appl. No. 13/485,682, mail date Feb. 6, 2015, 24 pages.
Non-Final Office Action on U.S. Appl. No. 14/021,948 Dated Mar. 5, 2015, 13 pages.
Notice of Allowance for U.S. Appl. No. 12/819,977, mail date Jul. 30, 2013, 9 pages.
Notice of Allowance for U.S. Appl. No. 12/949,660 mail date May 13, 2013, 6 pages.
Notice of Allowance for U.S. Appl. No. 13/023,392, mail date May 9, 2013, 6 pages.
Notice of Allowance on U.S. Appl. No. 12/916,145 Dated Mar. 13, 2014, 8 pages.
Notice of Allowance on U.S. Appl. No. 13/246,644 Dated Feb. 3, 2014, 6 pages.
Notice of Allowance on U.S. Appl. No. 13/485,682 Dated Mar. 14, 2016,15, 12 pgs.
Notice of Allowance on U.S. Appl. No. 14/021,971 Dated Feb. 24, 2015, 7 pages.
Notice of Allowance on U.S. Appl. No. 13/439,779 Dated Nov. 18, 2016, 12 pages.
Notice of Allowance on U.S. Appl. No. 14/320,203 Dated Oct. 4, 2016, 7 pages.
Notice of Allowance on U.S. Appl. No. 15/016,243 Dated Oct. 12, 2016, 8 pages.
Office Action for U.S. Appl. No. 12/819,977, mail date Feb. 13, 2013, 40 pages.
Office Action for U.S. Appl. No. 12/916,145, mail date Mar. 14, 2013, 21 pages.
Office Action for U.S. Appl. No. 13/246,644, mail date Oct. 4, 2013, 15 pages.
Office Action on U.S. Appl. No. 14/021,971 Dated Oct. 8, 2014. 21 pages.
Shengwei et al., Parameter Estimation of Internal Thermal Mass of Building Dynamic Models Using Genetic Algorithm:, Elsevier, vol. 47, Issues 13, Aug. 14, 2006, pp. 1927-1941.
Xu et al., "A Simplified Dynamic Model for Existing Buildings Using CTF and Thermal Network Models", Elsevier, vol. 47, Issue 9, Sep. 2008, pp. 1249-1262.

* cited by examiner

AUTOMATED FAULT DETECTION AND DIAGNOSTICS IN A BUILDING MANAGEMENT SYSTEM

CROSS-REFERENCE TO RELATED APPLICATIONS

This application is a continuation of U.S. application Ser. No. 13/246,644, filed Sep. 27, 2011; which is a continuation in part of U.S. application Ser. No. 12/949,660, filed Nov. 18, 2010; which is a continuation in part of U.S. application Ser. No. 12/819,977, filed Jun. 21, 2010; which claims the benefit of U.S. Provisional Application No. 61/219,326, filed Jun. 22, 2009, U.S. Provisional Application No. 61/234,217, filed Aug. 14, 2009, and U.S. Provisional Application No. 61/302,854, filed Feb. 9, 2010. The entireties of U.S. application Ser. Nos. 13/246,644, 12/949,660, 12/819,977 and U.S. Provisional Applications Nos. 61/302,854, 61/219,326, and 61/234,217 are incorporated by reference herein.

BACKGROUND

The present invention relates generally to the field of building management systems. The present invention more particularly relates to systems and methods for statistical control and fault detection in a building management system. The present invention also relates to model-based analysis of chillers in a building. The present invention also relates to user interfaces for building management systems.

SUMMARY

One embodiment of the invention relates to a controller for presenting an estimate of fault cost in a building management system. The controller includes a processing circuit configured to maintain a history of energy usage values for the building management system and at least one threshold parameter relative to the history of energy usage values. The processing circuit is configured to identify energy outlier days by comparing energy use for a day to the history of energy usage values and the at least one threshold parameters. The processing circuit is further configured to subtract an estimated average daily cost, calculated with the outlier days, to an estimated average daily cost calculated excluding the outlier days to estimate a cost of the energy outlier days. The processing circuit assigns the estimated cost of the energy outlier days to the estimate of the fault cost in the building management system.

Another embodiment of the invention relates to a computerized method for detecting chiller faults. The method includes comparing an actual performance of a chiller to an expected performance of the chiller. The method further includes applying a statistical analysis to the comparison to identify a significant deviation from the expected performance. The method also includes generating an output signal indicative of a chiller fault in response to the identification of the significant deviation from the expected performance.

Alternative exemplary embodiments relate to other features and combinations of features as may be generally recited in the claims.

BRIEF DESCRIPTION OF THE FIGURES

The disclosure will become more fully understood from the following detailed description, taken in conjunction with the accompanying figures, wherein like reference numerals refer to like elements, in which.

DETAILED DESCRIPTION OF THE EXEMPLARY EMBODIMENTS

The invention relates to a building management system configured to improve building efficiency, to enable greater or improved use of renewable energy sources, and to provide more comfortable and productive buildings.

A building management system (BMS) is, in general, hardware and/or software configured to control, monitor, and manage devices in or around a building or building area. BMS subsystems or devices can include heating, ventilation, and air conditioning (HVAC) subsystems or devices, security subsystems or devices, lighting subsystems or devices, fire alerting subsystems or devices, elevator subsystems or devices, other devices that are capable of managing building functions, or any combination thereof.

Figure 1A:
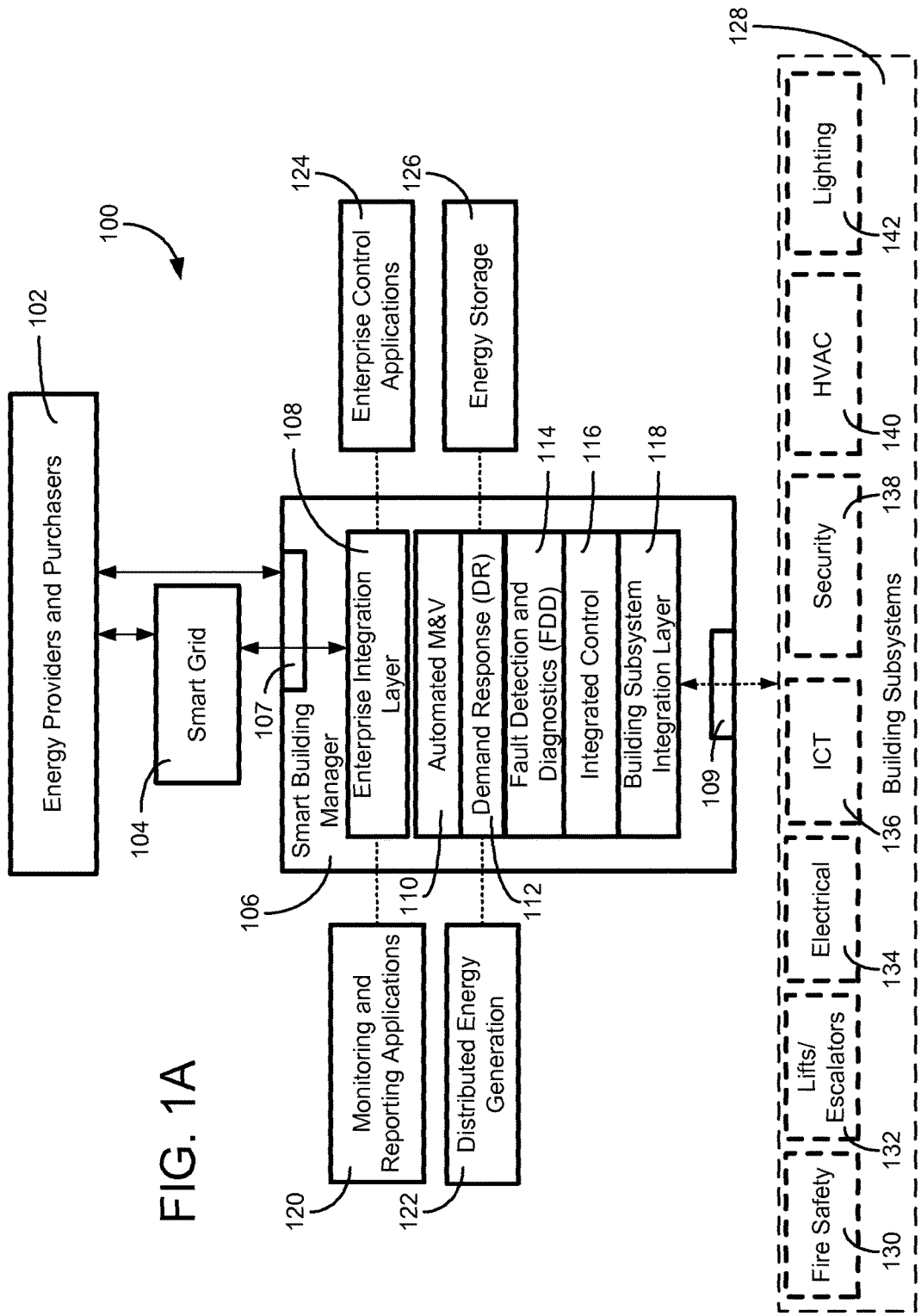
FIG. 1A is a block diagram of a building manager connected to a smart grid and a plurality of building subsystems, according to an exemplary embodiment.

Referring now to FIG. 1A, a block diagram of a system 100 including a smart building manager 106 is shown, according to an exemplary embodiment. Smart building manager 106 is connected to a smart grid 104 and a plurality of building subsystems 128. The building subsystems 128 may include a building electrical subsystem 134, an information communication technology (ICT) subsystem 136, a security subsystem 138, a HVAC subsystem 140, a lighting subsystem 142, a lift/escalators subsystem 132, and a fire safety subsystem 130. The building subsystems 128 can include fewer, additional, or alternative subsystems. For example, building subsystems 128 may also or alternatively include a refrigeration subsystem, an advertising or signage subsystem, a cooking subsystem, a vending subsystem, or a printer or copy service subsystem. Conventionally, these systems are autonomous and managed by separate control systems. The smart building manager 106 described herein is configured to achieve energy consumption and energy demand reductions by integrating the management of the building subsystems.

Each of building subsystems 128 includes any number of devices, controllers, and connections for completing its individual functions and control activities. For example, HVAC subsystem 140 may include a chiller, a boiler, any number of air handling units, economizers, field controllers, supervisory controllers, actuators, temperature sensors, and other devices for controlling the temperature within a building. As another example, lighting subsystem 142 may include any number of light fixtures, ballasts, lighting sensors, dimmers, or other devices configured to controllably adjust the amount of light provided to a building space. Security subsystem 138 may include occupancy sensors, video surveillance cameras, digital video recorders, video processing servers, intrusion detection devices, access control devices and servers, or other security-related devices.

In an exemplary embodiment, the smart building manager 106 is configured to include a communications interface 107 to the smart grid 104 outside the building, an interface 109 to disparate subsystems 128 within a building (e.g., HVAC, lighting security, lifts, power distribution, business, etc.), and an interface to applications 120, 124 (network or local) for allowing user control and the monitoring and adjustment of the smart building manager 106 or subsystems 128. Enterprise control applications 124 may be configured to provide subsystem-spanning control to a graphical user interface (GUI) or to any number of enterprise-level business applications (e.g., accounting systems, user identification systems, etc.). Enterprise control applications 124 may also or alternatively be configured to provide configuration GUIs for configuring the smart building manager 106. In yet other embodiments, enterprise control applications 124 can work with layers 110-118 to optimize building performance (e.g., efficiency, energy use, comfort, or safety) based on inputs received at the interface 107 to the smart grid and the interface 109 to building subsystems 128. In an exemplary embodiment, smart building manager 106 is integrated within a single computer (e.g., one server, one housing, etc.). In various other exemplary embodiments the smart building manager 106 can be distributed across multiple servers or computers (e.g., that can exist in distributed locations).

Figure 1B:
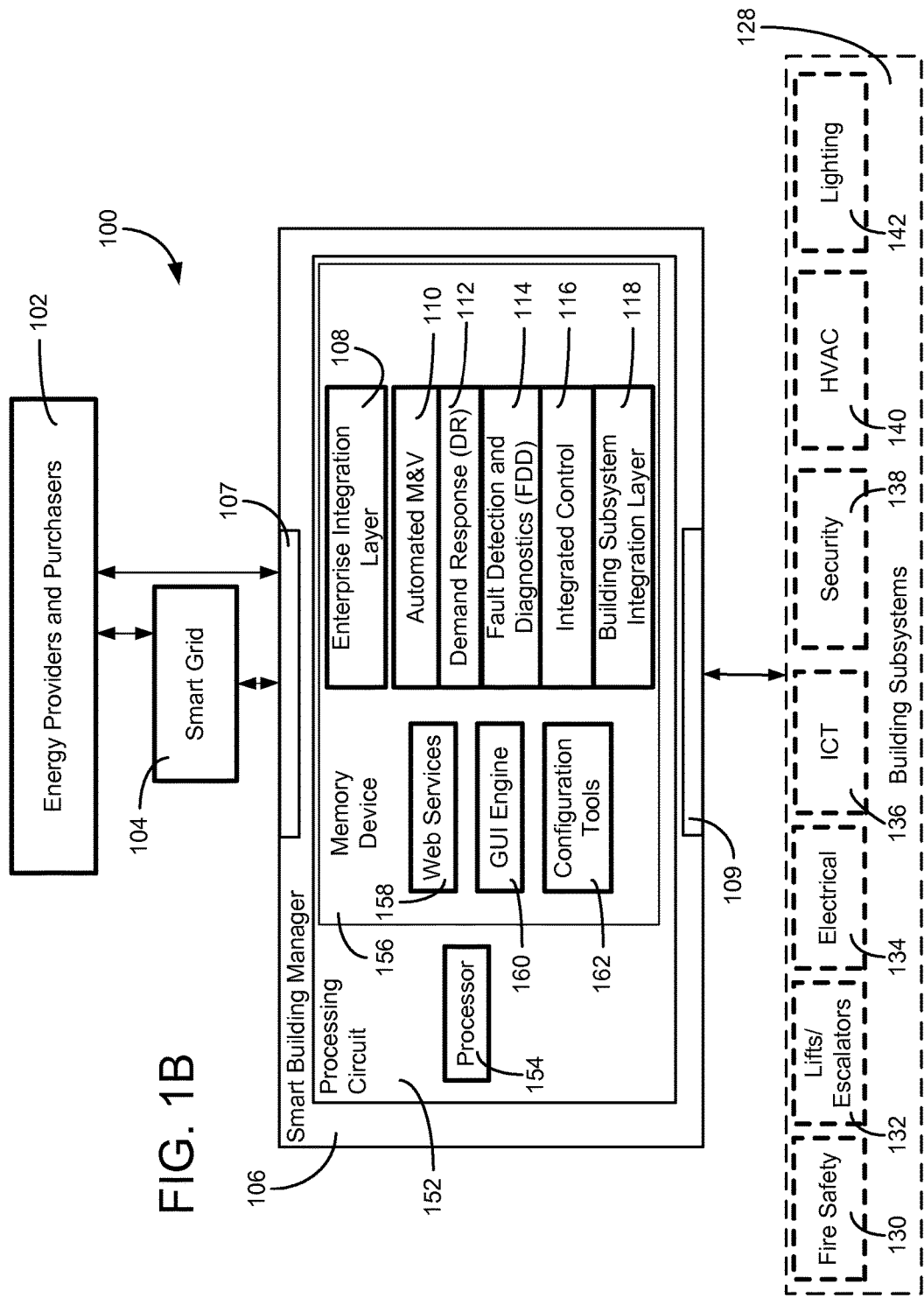
FIG. 1B is a more detailed block diagram of the building manager shown in FIG. 1A, according to an exemplary embodiment.

FIG. 1B illustrates a more detailed view of smart building manager 106, according to an exemplary embodiment. In particular, FIG. 1B illustrates smart building manager 106 as having a processing circuit 152. Processing circuit 152 is shown to include a processor 154 and memory device 156. Processor 154 can be implemented as a general purpose processor, an application specific integrated circuit (ASIC), one or more field programmable gate arrays (FPGAs), a group of processing components, or other suitable electronic processing components. Memory device 156 (e.g., memory, memory unit, storage device, etc.) is one or more devices (e.g., RAM, ROM, Flash memory, hard disk storage, etc.) for storing data and/or computer code for completing or facilitating the various processes, layers and modules described in the present application. Memory device 156 may be or include volatile memory or non-volatile memory. Memory device 156 may include database components, object code components, script components, or any other type of information structure for supporting the various activities and information structures described in the present application. According to an exemplary embodiment, memory device 156 is communicably connected to processor 154 via processing circuit 152 and includes computer code for executing (e.g., by processing circuit 152 and/or processor 154) one or more processes described herein.

Communications interfaces 107, 109 can be or include wired or wireless interfaces (e.g., jacks, antennas, transmitters, receivers, transceivers, wire terminals, etc.) for conducting data communications with, e.g., smart grid 104, energy providers and purchasers 102, building subsystems 128, or other external sources via a direct connection or a network connection (e.g., an Internet connection, a LAN, WAN, or WLAN connection, etc.). For example, communications interfaces 107, 109 can include an Ethernet card and port for sending and receiving data via an Ethernet-based communications link or network. In another example, communications interfaces 107, 109 can include a WiFi transceiver for communicating via a wireless communications network. In another example, one or both of interfaces 107, 109 may include cellular or mobile phone communications transceivers. In one embodiment, communications interface 107 is a power line communications interface and communications interface 109 is an Ethernet interface. In other embodiments, both communications interface 107 and communications interface 109 are Ethernet interfaces or are the same Ethernet interface. Further, while FIG. 1A shows applications 120 and 124 as existing outside of smart building manager 106, in some embodiments, applications 120 and 124 may be hosted within smart building manager 106 generally or memory device 156 more particularly.

Building Subsystem Integration Layer

Referring further to FIG. 1B, the building subsystem integration layer 118 is configured to manage communications between the rest of the smart building manager 106's components and the building subsystems. The building subsystem integration layer 118 may also be configured to manage communications between building subsystems. The building subsystem integration layer 118 may be configured to translate communications (e.g., sensor data, input signals, output signals, etc.) across a plurality of multi-vendor/multi-protocol systems. For example, the building subsystem integration layer 118 may be configured to integrate data from subsystems 128.

Figure 2:
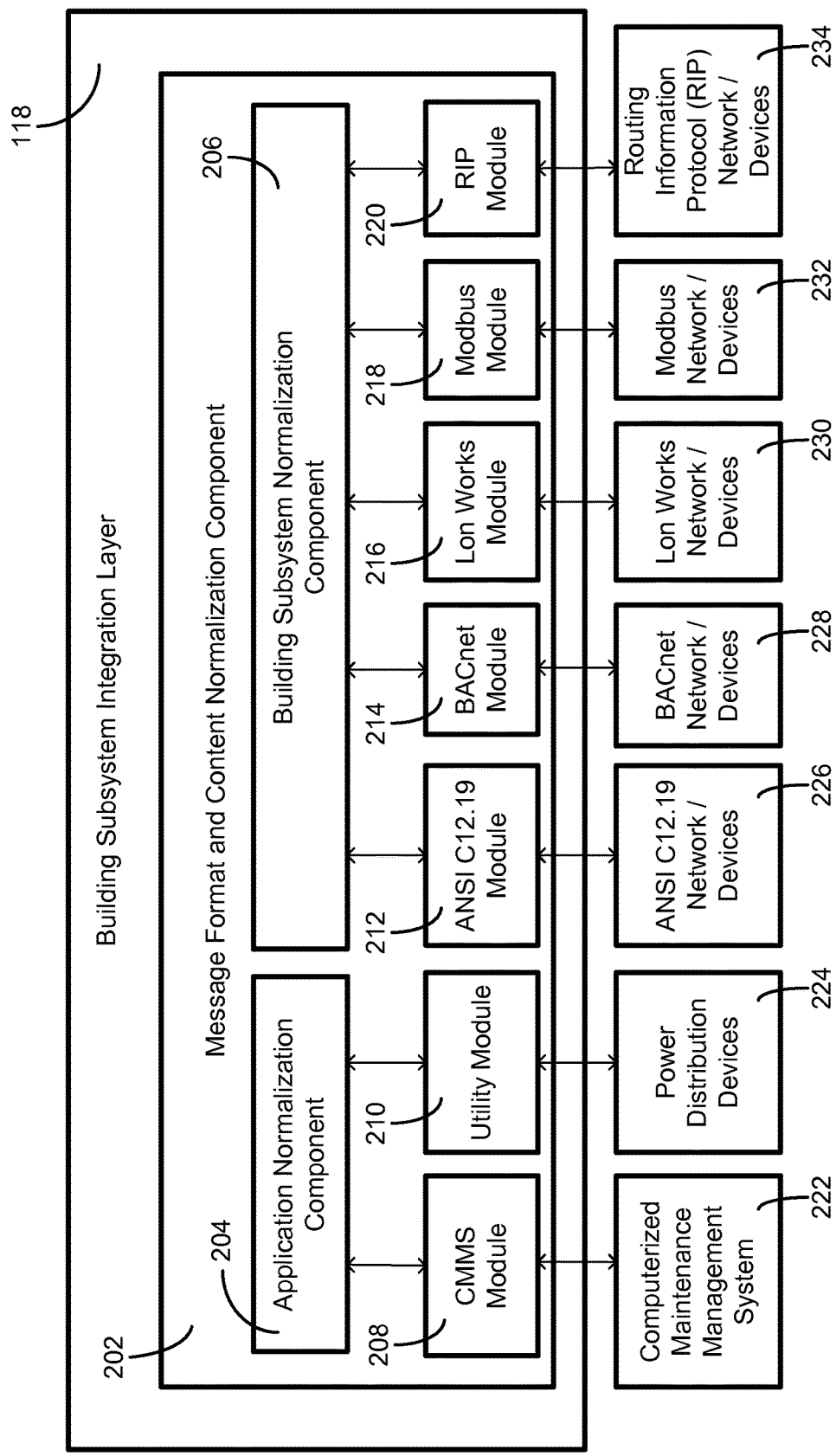
FIG. 2 is a block diagram of the building subsystem integration layer shown in FIG. 1A, according to an exemplary embodiment.

In FIG. 2, the building subsystem integration layer 118 is shown in greater detail to include a message format and content normalization component 202. The message format and content normalization component 202 is configured to convert data messages for and from disparately protocolled devices or networks (e.g., different building subsystems, differently protocolled smart-grid sources, etc.). The message format and content normalization component 202 is shown to include two subcomponents, an application normalization component 204 and a building subsystem normalization component 206. The application normalization component 204 is a computer function, object, service, or combination thereof configured to drive the conversion of communications for and from applications (e.g., enterprise level applications 120, 124 shown in FIG. 1A, a computerized maintenance management system 222, utility company applications via smart grid 104 shown in FIG. 1A, etc.). The building subsystem normalization component 206 is a computer function, object, service, or combination thereof configured to drive the conversion of communications for and from building subsystems (e.g., building subsystems 128 shown in FIG. 1A, building subsystem controllers, building devices, security systems, fire systems, etc.). The application normalization component 204 and the building subsystem normalization component 206 are configured to accommodate multiple communications or data protocols. In some embodiments, the application normalization component 204 and the building subsystem normalization component 206 are configured to conduct the conversion for each protocol based on information stored in modules 208-220 (e.g., a table, a script, in memory device 156 shown in FIG. 1B) for each of systems or devices 222-234. The protocol modules 208-220 may be, for example, schema maps or other descriptions of how a message for one protocol should be translated to a message for a second protocol. In some embodiments the modules 208-220 may be "plug-in" drivers that can be easily installed to or removed from a building subsystem integration layer 118 (e.g., via an executable installation routine, by placing a file in an interfaces folder, etc.) during setup. For example, modules 208-220 may be vendor specific (e.g., Johnson Controls, Honeywell, Siemens, etc.), standards-based (e.g., BACnet, ANSI C12.19, Lon Works, Modbus, RIP, SNMP, SOAP, web services, HTML, HTTP/HTTPS, XML, XAML, TFTP, DHCP, DNS, SMTP, SNTP, etc.), user built, user selected, or user customized. In some embodiments the application normalization component 204 or building subsystem normalization component 206 are configured for compatibility with new modules or drivers (e.g., user defined or provided by a vendor or third party). In such embodiments, message format and content normalization component 202 may advantageously be scaled for future applications or case-specific requirements (e.g., situations calling for the use of additional cyber security standards such as data encryption/decryption) by changing the active module set or by installing a new module.

Using message format and content normalization component 202, the building subsystem integration layer 118 can be configured to provide a service-oriented architecture for providing cross-subsystem control activities and cross-subsystem applications. The message format and content normalization component 202 can be configured to provide a relatively small number of straightforward interfaces (e.g., application programming interfaces (APIs)) or protocols (e.g., open protocols, unified protocols, common protocols) for use by layers 108-116 (shown in FIG. 1A) or external applications (e.g., 120, 124 shown in FIG. 1A) and to "hide" such layers or applications from the complexities of the underlying subsystems and their particular data transport protocols, data formats, semantics, interaction styles, and the like. Configuration of the message format and content normalization component 202 may occur automatically (e.g., via a building subsystem and device discovery process), via user configuration, or by a combination of automated discovery and user configuration. User configuration may be driven by providing one or more graphical user interfaces or "wizards" to a user, the graphical user interfaces allowing the user to map an attribute from one protocol to an attribute of another protocol. Configuration tool 162 shown in FIG. 1B may be configured to drive such an association process. The configuration tool 162 may be served to clients (local or remote) via web services 158 and/or GUI engine 160 (both shown in FIG. 1B). The configuration tool 162 may be provided as a thin web client (e.g., that primarily interfaces with web services 158) or a thick client (e.g., that only occasionally draws upon web services 158 and/or GUI engine 160). Configuration tool 162 may be configured to use a W3C standard intended to harmonize semantic information from different systems to controllably define, describe and store relationships between the data/protocols (e.g., define the modules 208-220). For example, the W3C standard used may be the Web Ontology Language (OWL). In some exemplary embodiments, configuration tool 162 may be configured to prepare the message format and content normalization component 202 (and device/protocol modules 208-220 thereof) for machine level interoperability of data content.

Once the building subsystem integration layer 118 is configured, developers of applications may be provided with a software development kit to allow rapid development of applications compatible with the smart building manager (e.g., with an application-facing protocol or API of the building subsystem integration layer). Such an API or application-facing protocol may be exposed at the enterprise integration layer 108 shown in FIGS. 1A and 1B. In various exemplary embodiments, the smart building manager 106 including building subsystem integration layer 118 includes the following features or advantages: it is seamless in that heterogeneous applications and subsystems may be integrated without varying or affecting the behavior of the external facing interfaces or logic; it is open in that it allows venders to develop products and applications by coding adapters (e.g. modules 208-220 shown in FIG. 2) or features according to a well-defined specification; it is multi-standard in that it supports subsystems that operate according to standards as well as proprietary protocols; it is extensible in that it accommodates new applications and subsystems with little to no modification; it is scalable in that it supports many applications and subsystems; it is adaptable in that it allows for the addition or deletion of applications or subsystems without affecting system consistency; it is user-configurable in that it is adjustable to changes in the business environment, business rules, or business workflows; and it is secure in that it protects information transferred through the integration channel. Additional details with respect to building subsystem integration layer 118 are described below with respect to FIG. 3.

Integrated Control Layer

Referring further to FIGS. 1A and 1B, the integrated control layer 116 is configured to use the data input or output of the building subsystem integration layer 118 to make control decisions. Due to the subsystem integration provided by the building subsystem integration layer 118, the integrated control layer 116 can integrate control activities of the subsystems 128 such that the subsystems 128 behave as a single integrated supersystem. In an exemplary embodiment, the integrated control layer 116 includes control logic that uses inputs and outputs from a plurality of building subsystems to provide greater comfort and energy savings relative to the comfort and energy savings that separate subsystems could provide alone. For example, information from a first building subsystem may be used to control a second building subsystem. By way of a more particular example, when a building employee badges in at a parking garage, a message may be sent from the parking subsystem to the building subsystem integration layer 118, converted into an event recognized as a universal occupancy (e.g., "badge-in") event and provided to integrated control layer 116. Integrated control layer 116 may include logic that turns on the lights in the building employee's office, begins cooling the building employee's office in response to the anticipated occupancy, and boots up the employee's computer. The decision to turn the devices on is made by integrated control layer 116 and integrated control layer 116 may cause proper "on" commands to be forwarded to the particular subsystems (e.g., the lighting subsystem, the IT subsystem, the HVAC subsystem). The integrated control layer 116 passes the "on" commands through building subsystem integration layer 118 so that the messages are properly formatted or protocolled for receipt and action by the subsystems. As is illustrated in FIGS. 1A-B, the integrated control layer 116 is logically above the building subsystems and building subsystem controllers. The integrated control layer 116, by having access to information from multiple systems, is configured to use inputs from one or more building subsystems 128 to make control decisions for control algorithms of other building subsystems. For example, the "badge-in" event described above can be used by the integrated control layer 116 (e.g., a control algorithm thereof) to provide new setpoints to an HVAC control algorithm of the HVAC subsystem.

While conventional building subsystem controllers are only able to process inputs that are directly relevant to the performance of their own control loops, the integrated control layer 116 is configured to use an input from a first subsystem to make an energy-saving control decision for a second subsystem. Results of these decisions can be communicated back to the building subsystem integration layer 116 via, for example, the message format and content normalization component 202 shown in FIG. 2A. Therefore, advantageously, regardless of the particular HVAC system or systems connected to the smart building manager, and due to the normalization at the building subsystem integration layer 118, the integrated control layer's control algorithms can determine a control strategy using normalized temperature inputs, and provide an output including a normalized setpoint temperature to the building subsystem integration layer. The building subsystem integration layer 118 can translate the normalized setpoint temperature into a command specific to the building subsystem or controller for which the setpoint adjustment is intended. If multiple subsystems are utilized to complete the same function (e.g., if multiple disparately protocolled HVAC subsystems are provided in different regions of a building), the building subsystem integration layer 118 can convert a command decision (e.g., to lower the temperature setpoint by 2 degrees) to multiple different commands for receipt and action by the multiple disparately protocolled HVAC subsystems. In this way, functions of the integrated control layer 116 may be executed using the capabilities of building subsystem integration layer 118. In an exemplary embodiment, the integrated control layer is configured to conduct the primary monitoring of system and subsystem statuses and interrelationships for the building. Such monitoring can cross the major energy consuming subsystems of a building to allow for cross-subsystem energy savings to be achieved (e.g., by the demand response layer 112).

The integrated control layer 116 is shown to be logically below the demand response layer 112. The integrated control layer 116 is configured to enhance the effectiveness of the demand response layer 112 by enabling building subsystems 128 and their respective control loops to be controlled in coordination with the demand response layer 112. This configuration may advantageously reduce disruptive demand response behavior relative to conventional systems. For example, the integrated control layer 116 may be configured to assure that a demand response-driven upward adjustment to the setpoint for chilled water temperature (or another component that directly or indirectly affects temperature) does not result in an increase in fan energy (or other energy used to cool a space) that would result in greater total building energy use than was saved at the chiller. The integrated control layer 116 may also be configured to provide feedback to the demand response layer 112 so that the demand response layer 112 checks that constraints (e.g., temperature, lighting levels, etc.) are properly maintained even while demanded load shedding is in progress. The constraints may also include setpoint or sensed boundaries relating to safety, equipment operating limits and performance, comfort, fire codes, electrical codes, energy codes, and the like. The integrated control layer 116 is also logically below the fault detection and diagnostics layer 114 and the automated measurement and validation layer 110. The integrated control layer may be configured to provide calculated inputs (e.g., aggregations) to these "higher levels" based on outputs from more than one building subsystem.

Control activities that may be completed by the integrated control layer 116 (e.g., software modules or control algorithms thereof) include occupancy-based control activities. Security systems such as radio frequency location systems (RFLS), access control systems, and video surveillance systems can provide detailed occupancy information to the integrated control layer 116 and other building subsystems 128 via the smart building manager 106 (and more particularly, via the building subsystem integration layer 118). Integration of an access control subsystem and a security subsystem for a building may provide detailed occupancy data for consumption by the integrated control layer 116 (e.g., beyond binary "occupied" or "unoccupied" data available to some conventional HVAC systems that rely on, for example, a motion sensor). For example, the exact number of occupants in the building (or building zone, floor, conference room, etc.) may be provided to the integrated control layer 116 or aggregated by the integrated control layer 116 using inputs from a plurality of subsystems. The exact number of occupants in the building can be used by the integrated control layer 116 to determine and command appropriate adjustments for building subsystems 128 (such as HVAC subsystem 140 or lighting subsystem 142). Integrated control layer 116 may be configured to use the number of occupants, for example, to determine how many of the available elevators to activate in a building. If the building is only 20% occupied, the integrated control layer 116, for example, may be configured to power down 80% of the available elevators for energy savings. Further, occupancy data may be associated with individual workspaces (e.g., cubicles, offices, desks, workstations, etc.) and if a workspace is determined to be unoccupied by the integrated control layer, a control algorithm of the integrated control layer 116 may allow for the energy using devices serving the workspace to be turned off or commanded to enter a low power mode. For example, workspace plug-loads, task lighting, computers, and even phone circuits may be affected based on a determination by the integrated control layer that the employee associated with the workspace is on vacation (e.g., using data inputs received from a human-resources subsystem). Significant electrical loads may be shed by the integrated control layer 116, including, for example, heating and humidification loads, cooling and dehumidification loads, ventilation and fan loads, electric lighting and plug loads (e.g. with secondary thermal loads), electric elevator loads, and the like. The integrated control layer 116 may further be configured to integrate an HVAC subsystem or a lighting subsystem with sunlight shading devices or other "smart window" technologies. Natural day-lighting can significantly offset lighting loads but for optimal comfort may be controlled by the integrated control layer to prevent glare or over-lighting. Conversely, shading devices and smart windows may also be controlled by the integrated control layer 116 to calculably reduce solar heat gains in a building space, which can have a significant impact on cooling loads. Using feedback from sensors in the space, and with knowledge of the HVAC control strategy, the integrated control layer 116 may further be configured to control the transmission of infrared radiation into the building, minimizing thermal transmission when the HVAC subsystem is cooling and maximizing thermal transmission when the HVAC subsystem is heating. As a further example of an occupancy-based control strategy that may be implemented by the integrated control layer 116, inputs from a video security subsystem may be analyzed by a control algorithm of the integrated control layer 116 to make a determination regarding occupancy of a building space. Using the determination, the control algorithm may turn off the lights, adjust HVAC set points, power-down ICT devices serving the space, reduce ventilation, and the like, enabling energy savings with an acceptable loss of comfort to occupants of the building space.

Figure 3:
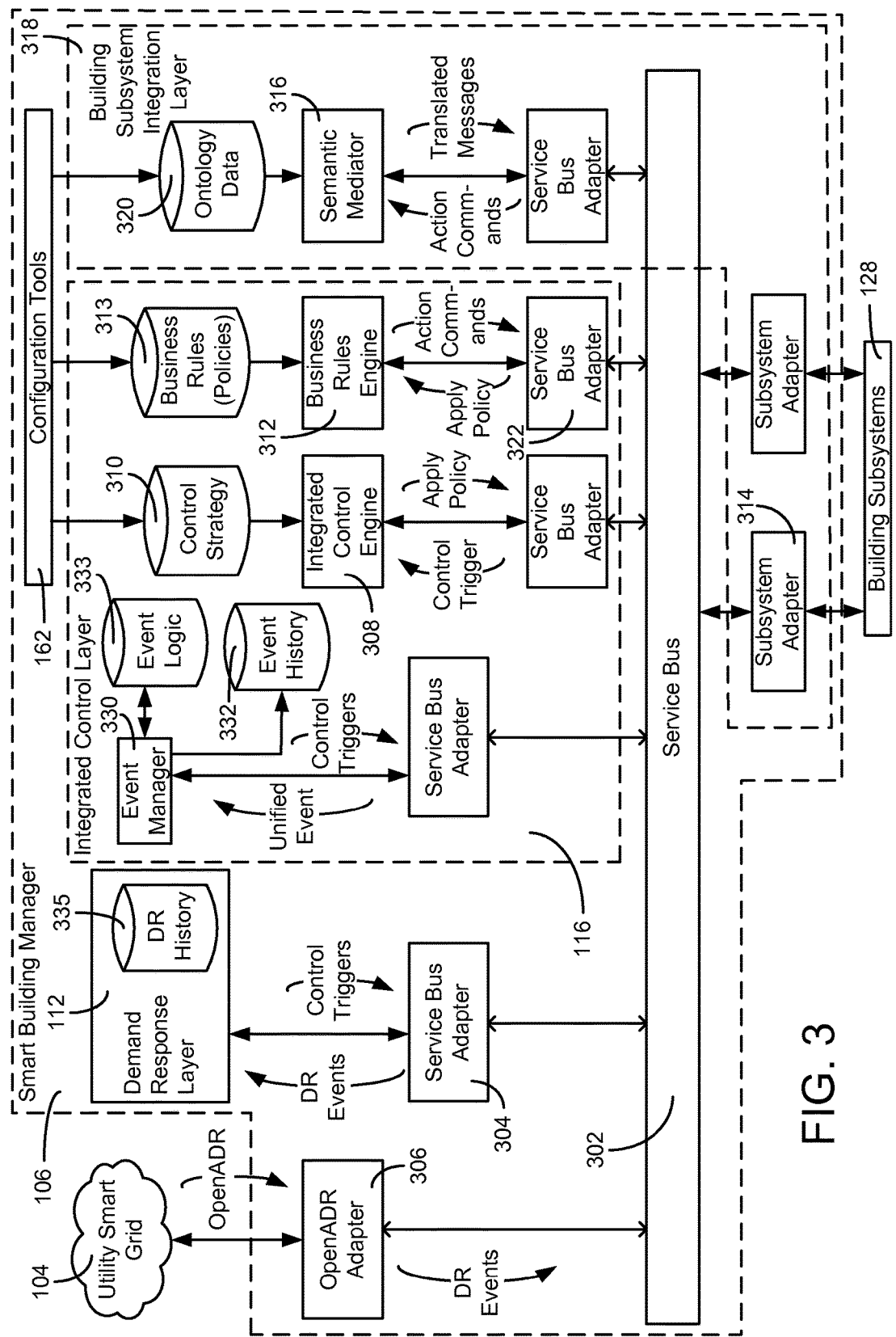
FIG. 3 is a detailed diagram of a portion of a smart building manager as shown in FIGS. 1A and 1B, according to an exemplary embodiment.

Referring now to FIG. 3, a detailed diagram of a portion of smart building manager 106 is shown, according to an exemplary embodiment. In particular, FIG. 3 illustrates a detailed embodiment of integrated control layer 116. Configuration tools 162 can allow a user to define (e.g., via graphical user interfaces, via prompt-driven "wizards," etc.) how the integrated control layer 116 should react to changing conditions in the building subsystems 128. In an exemplary embodiment, configuration tools 162 allow a user to build and store condition-response scenarios that can cross multiple building subsystems and multiple enterprise control applications (e.g., work order management system applications, entity resource planning (ERP) applications, etc.).

Building subsystems 128, external sources such as smart grid 104, and internal layers such as demand response layer 112 can regularly generate events (e.g., messages, alarms, changed values, etc.) and provide the events to integrated control layer 116 or another layer configured to handle the particular event. For example, demand response (DR) events (e.g., a change in real time energy pricing) may be provided to smart building manager 106 as Open Automated Demand Response ("OpenADR") messages (a protocol developed by Lawrence Berkeley National Laboratories). The DR messages may be received by OpenADR adapter 306 (which may be a part of enterprise application layer 108 shown in FIGS. 1A and 1B). The OpenADR adapter 306 may be configured to convert the OpenADR message into a DR event configured to be understood (e.g., parsed, interpreted, processed, etc.) by demand response layer 112. The DR event may be formatted and transmitted according to or via a service bus 302 for the smart building manager 106.

Service bus adapter 304 may be configured to "trap" or otherwise receive the DR event on the service bus 302 and forward the DR event on to demand response layer 112. Service bus adapter 304 may be configured to queue, mediate, or otherwise manage demand response messages for demand response layer 112. Once a DR event is received by demand response layer 112, logic thereof can generate a control trigger in response to processing the DR event. The integrated control engine 308 of integrated control layer 116 is configured to parse the received control trigger to determine if a control strategy exists in control strategy database 310 that corresponds to the received control trigger. If a control strategy exists, integrated control engine 308 executes the stored control strategy for the control trigger. In some cases the output of the integrated control engine 308 will be an "apply policy" message for business rules engine 312 to process. Business rules engine 312 may process an "apply policy" message by looking up the policy in business rules database 313. A policy in business rules database 313 may take the form of a set of action commands for sending to building subsystems 128. The set of action commands may include ordering or scripting for conducting the action commands at the correct timing, ordering, or with other particular parameters. When business rules engine 312 processes the set of action commands, therefore, it can control the ordering, scripting, and other parameters of action commands transmitted to the building subsystems 128.

Action commands may be commands for relatively direct consumption by building subsystems 128, commands for other applications to process, or relatively abstract cross-subsystem commands. Commands for relatively direct consumption by building subsystems 128 can be passed through service bus adapter 322 to service bus 302 and to a subsystem adapter 314 for providing to a building subsystem in a format particular to the building subsystem. Commands for other applications to process may include commands for a user interface application to request feedback from a user, a command to generate a work order via a computerized maintenance management system (CMMS) application, a command to generate a change in an ERP application, or other application level commands.

More abstract cross-subsystem commands may be passed to a semantic mediator 316 which performs the task of translating those actions to the specific commands required by the various building subsystems 128. For example, a policy might contain an abstract action to "set lighting zone X to maximum light." The semantic mediator 316 may translate this action to a first command such as "set level to 100% for lighting object O in controller C" and a second command of "set lights to on in controller Z, zone_id_no 3141593." In this example both lighting object O in controller C and zone_id_no 3141593 in controller Z may affect lighting in zone X. Controller C may be a dimming controller for accent lighting while controller Z may be a non-dimming controller for the primary lighting in the room. The semantic mediator 316 is configured to determine the controllers that relate to zone X using ontology database 320. Ontology database 320 stores a representation or representations of relationships (the ontology) between building spaces and subsystem elements and subsystems elements and concepts of the integrated building supersystem. Using the ontology stored in ontology database 320, the semantic mediator can also determine that controller C is dimming and requires a numerical percentage parameter while controller Z is not dimming and requires only an on or off command. Configuration tool 162 can allow a user to build the ontology of ontology database 320 by establishing relationships between subsystems, building spaces, input/output points, or other concepts/objects of the building subsystems and the building space.

Events other than those received via OpenADR adapter 306, demand response layer 112, or any other specific event-handing mechanism can be trapped by subsystem adapter 314 (a part of building integration subsystem layer 318) and provided to a general event manager 330 via service bus 302 and a service bus adapter. By the time an event from a building subsystem 128 is received by event manager 330, it may have been converted into a unified event (i.e., "common event," "standardized event", etc.) by subsystem adapter 314 and/or other components of building subsystem integration layer 318 such as semantic mediator 316. The event manager 330 can utilize an event logic DB to lookup control triggers, control trigger scripts, or control trigger sequences based on received unified events. Event manager 330 can provide control triggers to integrated control engine 308 as described above with respect to demand response layer 112. As events are received, they may be archived in event history 332 by event manager 330. Similarly, demand response layer 112 can store DR events in DR history 335. One or both of event manager 330 and demand response layer 112 may be configured to wait until multi-event conditions are met (e.g., by processing data in history as new events are received). For example, demand response layer 112 may include logic that does not act to reduce energy loads until a series of two sequential energy price increases are received. In an exemplary embodiment event manager 330 may be configured to receive time events (e.g., from a calendaring system). Different time events can be associated with different triggers in event logic database 333.

In an exemplary embodiment, the configuration tools 162 can be used to build event conditions or trigger conditions in event logic 333 or control strategy database 310. For example, the configuration tools 162 can provide the user with the ability to combine data (e.g., from subsystems, from event histories) using a variety of conditional logic. In varying exemplary embodiments, the conditional logic can range from simple logical operators between conditions (e.g., AND, OR, XOR, etc.) to pseudo-code constructs or complex programming language functions (allowing for more complex interactions, conditional statements, loops, etc.). The configuration tools 162 can present user interfaces for building such conditional logic. The user interfaces may allow users to define policies and responses graphically. In some embodiments, the user interfaces may allow a user to select a pre-stored or pre-constructed policy and adapt it or enable it for use with their system.

Referring still to FIG. 3, in some embodiments, integrated control layer 116 generally and integrated control engine 308 can operate as a "service" that can be used by higher level layers of smart building manager 106, enterprise applications, or subsystem logic whenever a policy or sequence of actions based on the occurrence of a condition is to be performed. In such embodiments, control operations do not need to be reprogrammed Instead, applications or logic can rely on the integrated control layer 116 to receive an event and to execute the related subsystem functions. For example, demand response layer 112, fault detection and diagnostics layer 114 (shown in FIGS. 1A and 1B), enterprise integration 108, and applications 120, 124 may all utilize a shared control strategy 310 and integrated control engine 308 to initiate response sequences to events.

Fault Detection and Diagnostics Layer

Figure 4:
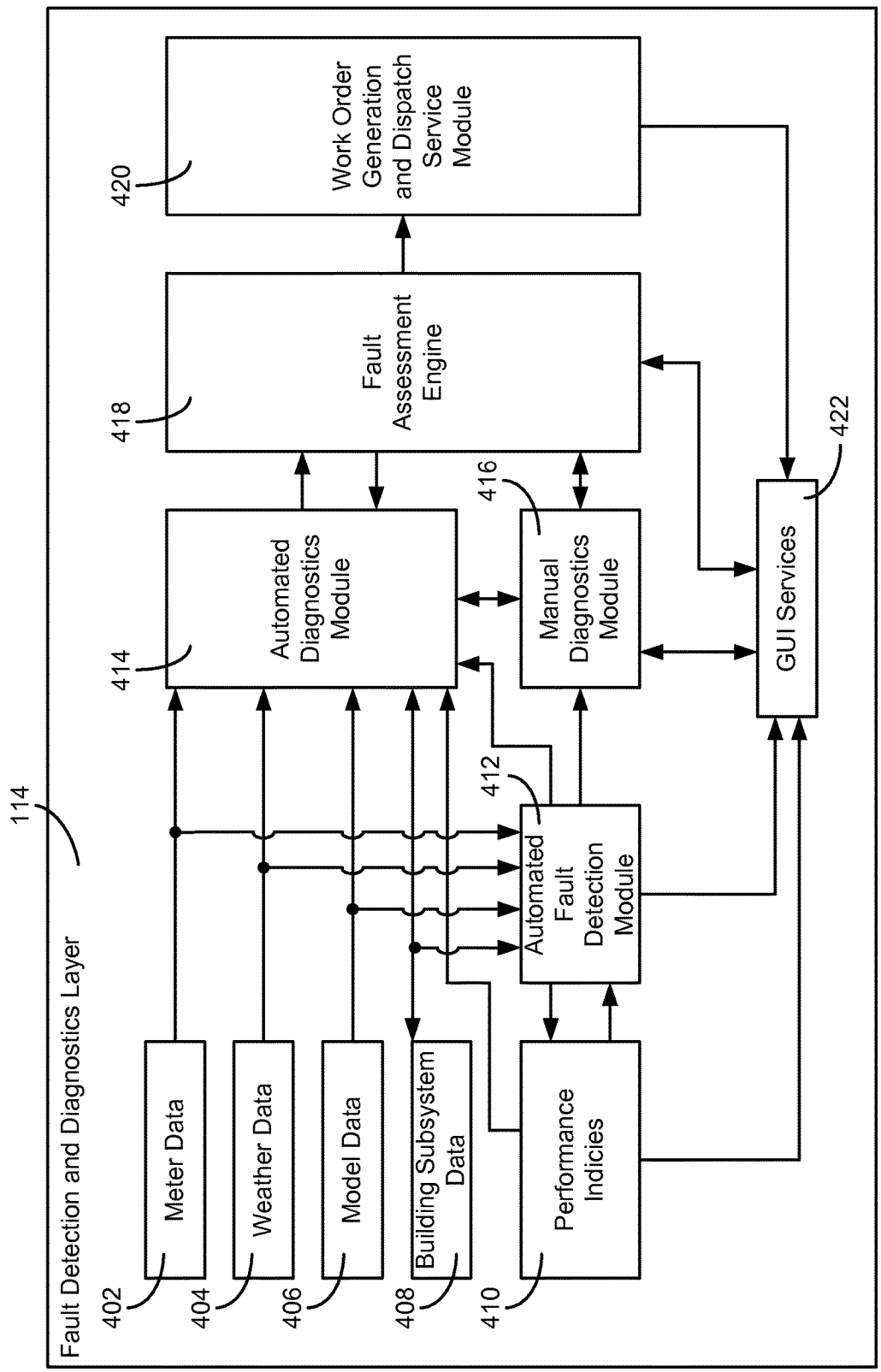
FIG. 4 is a detailed diagram of a fault detection and diagnostics layer as shown in FIGS. 1A and 1B, according to an exemplary embodiment.

Referring now to FIG. 4, the fault detection and diagnostics (FDD) layer 114 is shown in greater detail, according to an exemplary embodiment. Fault detection and diagnostics (FDD) layer 114 is configured to provide on-going fault detection of building subsystems, building subsystem devices, and control algorithms of the integrated control layer. The FDD layer 114 may receive its inputs from the integrated control layer, directly from one or more building subsystems or devices, or from the smart grid. The FDD layer 114 may automatically diagnose and respond to detected faults. The responses to detected or diagnosed faults may include providing an alert message to a user, a maintenance scheduling system, or a control algorithm configured to attempt to repair the fault or to work-around the fault. In other exemplary embodiments FDD layer 114 is configured to provide "fault" events to integrated control layer as described with reference to FIG. 3 and the integrated control layer of FIG. 3 is configured to execute control strategies and policies in response to the received fault events. According to an exemplary embodiment, the FDD layer 114 (or a policy executed by an integrated control engine or business rules engine) may shut-down systems or direct control activities around faulty devices or systems to reduce energy waste, extend equipment life, or assure proper control response. The FDD layer 114 may be configured to use statistical analysis of near real-time or historical building subsystem data to rapidly identify faults in equipment operation.

As shown in FIG. 4, the FDD layer 114 is configured to store or access a variety of different system data stores (or data points for live data) 402-410. FDD layer 114 may use some content of data stores 402-410 to identify faults at the equipment level (e.g., specific chiller, specific AHU, specific terminal unit, etc.) and other content to identify faults at component or subsystem levels. The FDD layer 114 may be configured to output a specific identification of the faulty component or cause of the fault (e.g., loose damper linkage) using detailed subsystem inputs available at the building subsystem integration layer (shown in previous Figures). Such specificity and determinations may be calculated by the FDD layer 114 based on such subsystem inputs and, for example, automated fault detection module 412. Automated fault detection module 412 can utilize pattern recognition methods, pattern classification methods, rule-based classification methods, outlier analysis, statistical quality control charting techniques, or the like to conduct its statistical analysis. In some embodiments automated fault detection module 412 more particularly is configured to calculate or update performance indices 410.

Performance indices 410 may be calculated based on exponentially-weighted moving averages (EWMAs) to provide statistical analysis features which allow outlier and statistical process control (SPC) techniques to be used to identify faults. For example, the FDD layer 114 may be configured to use meter data 402 outliers to detect when energy consumption becomes abnormal. Statistical fault detection module 412 may also or alternatively be configured to analyze the meter data 402 using statistical methods that provide for data clustering, outlier analysis, or quality control determinations. The meter data 402 may be received from, for example, a smart meter, a utility, or calculated based on the building-use data available to the smart building manager.

Once a fault is detected by the FDD layer 114 (e.g., by statistical fault detection module 412), the FDD layer 114 may be configured to generate one or more alarms or events to prompt manual fault diagnostics or to initiate an automatic fault diagnostics activity via automated diagnostics module 414. Automatic fault diagnostics module 414 may be configured to use meter data 402, weather data 404, model data 406 (e.g., performance models based on historical building equipment performance), building subsystem data 408, performance indices 410, or other data available at the building subsystem integration layer to complete its fault diagnostics activities.

In an exemplary embodiment, when a fault is detected, the automated diagnostics module 414 is configured to investigate the fault by initiating expanded data logging and error detection/diagnostics activities relative to the inputs, outputs, and systems related to the fault. For example, the automated diagnostics module 414 may be configured to poll sensors associated with an air handling unit (AHU) (e.g., temperature sensors for the space served by the AHU, air flow sensors, position sensors, etc.) on a frequent or more synchronized basis to better diagnose the source of a detected AHU fault.

Automated fault diagnostics module 414 may further be configured to compute residuals (differences between measured and expected values) for analysis to determine the fault source. For example, automated fault diagnostics module 414 may be configured to implement processing circuits or methods described in U.S. patent application Ser. No. 12/487,594, filed Jun. 18, 2009, titled "Systems and Methods for Fault Detection of Air Handling Units," the entirety of which is incorporated herein by reference. Automated fault diagnostics module 414 can use a finite state machine and input from system sensors (e.g., temperature sensors, air mass sensors, etc.) to diagnose faults. State transition frequency (e.g., between a heating state, a free cooling state, and a mechanical cooling state) may also be used by the statistical fault detection module 412 and the automated diagnostics module 414 to identify and diagnose unstable control issues. The FDD layer 114 may also or alternatively be configured for rule-based predictive detection and diagnostics (e.g., to determine rule thresholds, to provide for continuous monitoring and diagnostics of building equipment).

In addition to or as an alternative to an automated diagnostics process provided by automated diagnostics module 414, FDD layer 114 can drive a user through a manual diagnostic process using manual diagnostics module 416. One or both of automated diagnostics module 414 and manual diagnostics module 416 can store data regarding the fault and the diagnosis thereof for further assessment by manual or automated fault assessment engine 418. Any manually driven process of assessment engine 418 can utilize graphical or textual user interfaces displayed to a user to receive feedback or input from a user. In some embodiments assessment engine 418 will provide a number of possible reasons for a fault to the user via a GUI. The user may select one of the faults for manual investigation or calculation. Similarly, an automated process of assessment engine 418 may be configured to select the most probable cause for a fault based on diagnostics provided by modules 414 or 416. Once a cause is detected or estimated using assessment engine 418, a work order can be generated by work order generation and dispatch service 420. Work order generation and dispatch service can transmit the work order to a service management system or a work dispatch service 420 for action.

Data and processing results from modules 412, 414, 416, 418 or other data stored or modules of a fault detection and diagnostics layer can be provided to the enterprise integration layer shown in FIGS. 1A and 1B. Monitoring and reporting applications 120 can then access the data or be pushed the data so that real time "system health" dashboards can be viewed and navigated by a user (e.g., a building engineer). For example, monitoring and reporting applications 120 may include a web-based monitoring application that includes several graphical user interface (GUI) elements (e.g., widgets, dashboard controls, windows, etc.) for displaying key performance indicators (KPI) or other information to users of a GUI using FDD layer 114 information or analyses. In addition, the GUI elements may summarize relative energy use and intensity across different buildings (real or modeled), different campuses, or the like. Other GUI elements or reports may be generated and shown based on available data that allow facility managers to assess performance across a group of buildings from one screen. The user interface or report (or underlying data engine) may be configured to aggregate and categorize faults by building, building type, equipment type, fault type, times of occurrence, frequency of occurrence, severity, and the like. The GUI elements may include charts or histograms that allow the user to visually analyze the magnitude of occurrence of specific faults or equipment for a building, time frame, or other grouping. A "time series" pane of the GUI may allow users to diagnose a fault remotely by analyzing and comparing interval time-series data, trends, and patterns for various input/output points tracked/logged by the FDD layer 114. The FDD layer 114 may include one or more GUI servers or services 422 (e.g., a web service) to support such applications. Further, in some embodiments, applications and GUI engines may be included outside of the FDD layer 114 (e.g., monitoring and reporting applications 120 shown in FIG. 1A, web services 158 shown in FIG. 1B, GUI engine 160 shown in FIG. 1B). The FDD layer 114 may be configured to maintain detailed historical databases (e.g., relational databases, XML databases, etc.) of relevant data and includes computer code modules that continuously, frequently, or infrequently query, aggregate, transform, search, or otherwise process the data maintained in the detailed databases. The FDD layer 114 may be configured to provide the results of any such processing to other databases, tables, XML files, or other data structures for further querying, calculation, or access by, for example, external monitoring and reporting applications.

In an exemplary embodiment, the automated diagnostics module 414 automatically prioritizes detected faults. The prioritization may be conducted based on customer-defined criteria. The prioritization may be used by the manual or automated fault assessment module 418 to determine which faults to communicate to a human user via a dashboard or other GUI. Further, the prioritization can be used by the work order dispatch service to determine which faults are worthy of immediate investigation or which faults should be investigated during regular servicing rather than a special work request. The FDD layer 114 may be configured to determine the prioritization based on the expected financial impact of the fault. The fault assessment module 418 may retrieve fault information and compare the fault information to historical information. Using the comparison, the fault assessment module 418 may determine an increased energy consumption and use pricing information from the smart grid to calculate the cost over time (e.g., cost per day). Each fault in the system may be ranked according to cost or lost energy. The fault assessment module 418 may be configured to generate a report for supporting operational decisions and capital requests. The report may include the cost of allowing faults to persist, energy wasted due to the fault, potential cost to fix the fault (e.g., based on a service schedule), or other overall metrics such as overall subsystem or building reliability (e.g., compared to a benchmark). The fault assessment module 418 may further be configured to conduct equipment hierarchy-based suppression of faults (e.g., suppressed relative to a user interface, suppressed relative to further diagnostics, etc.). For such suppression, module 318 may use the hierarchical information available at, e.g., integrated control layer 116 or building subsystem integration layer 318 shown in FIG. 3. For example, module 318 may utilize building subsystem hierarchy information stored in ontology database 320 to suppress lower level faults in favor of a higher level fault (suppress faults for a particular temperature sensor and air handling unit in favor of a fault that communicates "Inspect HVAC Components Serving Conference Room 30").

FDD layer 114 may also receive inputs from lower level FDD processes. For example, FDD layer 114 may receive inputs from building subsystem supervisory controllers or field controllers having FDD features. In an exemplary embodiment, FDD layer 114 may receive "FDD events," process the received FDD events, query the building subsystems for further information, or otherwise use the FDD events in an overall FDD scheme (e.g., prioritization and reporting). U.S. Pat. No. 6,223,544 (titled "Integrated Control and Fault Detection of HVAC Equipment," issued May 1, 2001)(incorporated herein by reference) and U.S. Pub. No. 2009/0083583 (titled "Fault Detection Systems and Methods for Self-Optimizing Heating, Ventilation, and Air Conditioning Controls", filed Nov. 25, 2008, published Mar. 26, 2009)(incorporated herein by reference) may be referred to as examples of FDD systems and methods that may be implemented by FDD layer 114 (and/or lower level FDD processes for providing information to FDD layer 114).

Demand Response Layer

FIGS. 1A and 1B are further shown to include a demand response (DR) layer 112. The DR layer 112 is configured to optimize electrical demand in response to time-of-use prices, curtailment signals, or energy availability. Data regarding time-of-use prices, energy availability, and curtailment signals may be received from the smart grid 104, from energy providers and purchasers 102 (e.g., an energy aggregator) via the smart grid 104, from energy providers and purchasers 102 via a communication network apart from the smart grid, from distributed energy generation systems 122, from energy storage banks 126, or from other sources. According to an exemplary embodiment, the DR layer 112 includes control logic for responding to the data and signals it receives. These responses can include communicating with the control algorithms in the integrated control layer 116 to "load shed," changing control strategies, changing setpoints, or shutting down building devices or subsystems in a controlled manner. The architecture and process for supporting DR events is shown in and described with reference to FIG. 3. The DR layer 112 may also include control logic configured to determine when to utilize stored energy based on information from the smart grid and information from a local or remote energy storage system. For example, when the DR layer 112 receives a message indicating rising energy prices during a future "peak use" hour, the DR layer 112 can decide to begin using power from the energy storage system just prior to the beginning of the "peak use" hour.

In some exemplary embodiments the DR layer 112 may include a control module configured to actively initiate control actions (e.g., automatically changing setpoints) which minimize energy costs based on one or more inputs representative of or based on demand (e.g., price, a curtailment signal, a demand level, etc.). The DR layer 112 may further include or draw upon one or more DR policy definitions (e.g., databases, XML files, etc.). The policy definitions may be edited or adjusted by a user (e.g., via a graphical user interface) so that the control actions initiated in response to demand inputs may be tailored for the user's application, desired comfort level, particular building equipment, or based on other concerns. For example, the DR policy definitions can specify which equipment may be turned on or off in response to particular demand inputs, how long a system or piece of equipment should be turned off, what setpoints can be changed, what the allowable set point adjustment range is, how long to hold a "high demand" setpoint before returning to a normally scheduled setpoint, how close to approach capacity limits, which equipment modes to utilize, the energy transfer rates (e.g., the maximum rate, an alarm rate, other rate boundary information, etc.) into and out of energy storage devices (e.g., thermal storage tanks, battery banks, etc.), and when to dispatch on-site generation of energy (e.g., via fuel cells, a motor generator set, etc.). One or more of the policies and control activities may be located within control strategy database 310 or business rules database 313. Further, as described above with reference to FIG. 3, some of the DR responses to events may be processed and completed by integrated control layer 116 with or without further inputs or processing by DR layer 112.

A plurality of market-based DR inputs and reliability based DR inputs may be configured (e.g., via the DR policy definitions or other system configuration mechanisms) for use by the DR layer 112. The smart building manager 106 may be configured (e.g., self-configured, manually configured, configured via DR policy definitions, etc.) to select, deselect or differently weigh varying inputs in the DR layer's calculation or execution of control strategies based on the inputs. DR layer 112 may automatically (or via the user configuration) calculate outputs or control strategies based on a balance of minimizing energy cost and maximizing comfort. Such balance may be adjusted (e.g., graphically, via rule sliders, etc.) by users of the smart building manager via a configuration utility or administration GUI.

The DR layer 112 may be configured to receive inputs from other layers (e.g., the building subsystem integration layer, the integrated control layer, etc.). The inputs received from other layers may include environmental or sensor inputs such as temperature, carbon dioxide levels, relative humidity levels, air quality sensor outputs, occupancy sensor outputs, room schedules, and the like. The inputs may also include inputs such as electrical use (e.g., expressed in kWh), thermal load measurements, pricing information, projected pricing, smoothed pricing, curtailment signals from utilities, and the like from inside the system, from the smart grid 104, or from other remote sources.

Some embodiments of the DR layer 112 may utilize industry standard "open" protocols or emerging National Institute of Standards and Technology (NIST) standards to receive real-time pricing (RTP) or curtailment signals from utilities or power retailers. In other embodiments, proprietary protocols or other standards may be utilized. As mentioned above, in some exemplary embodiments, the DR layer 112 is configured to use the OpenADR protocol to receive curtailment signals or RTP data from utilities, other independent system operators (ISOs), or other smart grid sources. The DR layer 112, or another layer (e.g., the enterprise integration layer) that serves the DR layer 112 may be configured to use one or more security schemes or standards such as the Organization for the Advancement of Structured Information Standards (OASIS) Web Service Security Standards to provide for secure communications to/from the DR layer 112 and the smart grid 104 (e.g., a utility company's data communications network). If the utility does not use a standard protocol (e.g., the OpenADR protocol), the DR layer 112, the enterprise integration layer 108, or the building subsystem integration layer 118 may be configured to translate the utility's protocol into a format for use by the utility. The DR layer 112 may be configured to bi-directionally communicate with the smart grid 104 or energy providers and purchasers 102 (e.g., a utility, an energy retailer, a group of utilities, an energy broker, etc.) to exchange price information, demand information, curtailable load calculations (e.g., the amount of load calculated by the DR layer to be able to be shed without exceeding parameters defined by the system or user), load profile forecasts, and the like. DR layer 112 or an enterprise application 120, 124 in communication with the DR layer 112 may be configured to continuously monitor pricing data provided by utilities/ISOs across the nation, to parse the useful information from the monitored data, and to display the useful information to a user to or send the information to other systems or layers (e.g., integrated control layer 116).

The DR layer 112 may be configured to include one or more adjustable control algorithms in addition to or as an alternative from allowing the user creation of DR profiles. For example, one or more control algorithms may be automatically adjusted by the DR layer 112 using dynamic programming or model predictive control modules. In one embodiment, business rules engine 312 is configured to respond to a DR event by adjusting a control algorithm or selecting a different control algorithm to use (e.g., for a lighting system, for an HVAC system, for a combination of multiple building subsystems, etc.).

The smart building manager 106 (e.g., using the demand response layer 112) can be configured to automatically (or with the help of a user) manage energy spend. The smart building manager 106 (with input from the user or operating using pre-configured business rules shown in FIG. 3) may be configured to accept time-of-use pricing signals or information from a smart grid (e.g., an energy provider, a smart meter, etc.) and, using its knowledge of historical building system data, control algorithms, calendar information, and/or weather information received from a remote source, may be configured to conduct automatic cost forecasting. The smart building manager 106 (e.g., the demand response layer 112) may automatically (or with user approval) take specific load shedding actions or control algorithm changes in response to different cost forecasts.

The smart building manager 106 may also be configured to monitor and control energy storage systems 126 (e.g., thermal, electrical, etc.) and distributed generation systems 122 (e.g., a solar array for the building, etc.). The smart building manager 106 or DR layer 112 may also be configured to model utility rates to make decisions for the system. All of the aforementioned processing activities or inputs may be used by the smart building manager 106 (and more particularly, a demand response layer 112 thereof) to limit, cap, profit-from, or otherwise manage the building or campus's energy spend. For example, using time-of-use pricing information for an upcoming hour that indicates an unusually high price per kilowatt hour, the system may use its control of a plurality of building systems to limit cost without too drastically impacting occupant comfort. To make such a decision and to conduct such activity, the smart building manager 106 may use data such as a relatively high load forecast for a building and information that energy storage levels or distributed energy levels are low. The smart building manager 106 may accordingly adjust or select a control strategy to reduce ventilation levels provided to unoccupied areas, reduce server load, raise a cooling setpoint throughout the building, reserve stored power for use during the expensive period of time, dim lights in occupied areas, turn off lights in unoccupied areas, and the like.

The smart building manager 106 may provide yet other services to improve building or grid performance. For example, the smart building manager 106 may provide for expanded user-driven load control (allowing a building manager to shed loads at a high level of system/device granularity). The smart building manager 106 may also monitor and control power switching equipment to route power to/from the most efficient sources or destinations. The smart building manager 106 may communicate to the power switching equipment within the building or campus to conduct "smart" voltage regulation. For example, in the event of a brownout, the smart building manager 106 may prioritize branches of a building's internal power grid— tightly regulating and ensuring voltage to high priority equipment (e.g., communications equipment, data center equipment, cooling equipment for a clean room or chemical factory, etc.) while allowing voltage to lower priority equipment to dip or be cut off by the smart grid (e.g., the power provider). The smart building manager 106 or the DR layer 112 may plan these activities or proactively begin load shedding based on grid services capacity forecasting conducted by a source on the smart grid or by a local algorithm (e.g., an algorithm of the demand response layer). The smart building manager 106 or the DR layer 112 may further include control logic for purchasing energy, selling energy, or otherwise participating in a real-time or near real-time energy market or auction. For example, if energy is predicted to be expensive during a time when the DR layer 112 determines it can shed extra load or perhaps even enter a net-positive energy state using energy generated by solar arrays, or other energy sources of the building or campus, the DR layer 112 may offer units of energy during that period for sale back to the smart grid (e.g., directly to the utility, to another purchaser, in exchange for carbon credits, etc.).

In some exemplary embodiments, the DR layer 112 may also be configured to support a "Grid Aware" plug-in hybrid electric vehicle (PHEV)/electric vehicle charging system instead of (or in addition to) having the charging system in the vehicles be grid-aware. For example, in buildings that have vehicle charging stations (e.g., terminals in a parking lot for charging an electric or hybrid vehicle), the DR layer 112 can decide when to charge the vehicles (e.g., when to enable the charging stations, when to switch a relay providing power to the charging stations, etc.) based upon time, real time pricing (RTP) information from the smart grid, or other pricing, demand, or curtailment information from the smart grid. In other embodiments, each vehicle owner could set a policy that is communicated to the charging station and back to the DR layer 112 via wired or wireless communications that the DR layer 112 could be instructed to follow. The policy information could be provided to the DR layer 112 via an enterprise application 124, a vehicle information system, or a personal portal (e.g., a web site vehicle owners are able to access to input, for example, at what price they would like to enable charging). The DR layer 112 could then activate the PHEV charging station based upon that policy unless a curtailment event is expected (or occurs) or unless the DR layer 112 otherwise determines that charging should not occur (e.g., decides that electrical storage should be conducted instead to help with upcoming anticipated peak demand). When such a decision is made, the DR layer 112 may pre-charge the vehicle or suspend charge to the vehicle (e.g., via a data command to the charging station). Vehicle charging may be restricted or turned off by the smart building manager during periods of high energy use or expensive energy. Further, during such periods, the smart building manager 106 or the DR layer 112 may be configured to cause energy to be drawn from plugged-in connected vehicles to supplement or to provide back-up power to grid energy.

Using the real time (or near real-time) detailed information regarding energy use in the building, the smart building manager 106 may maintain a greenhouse gas inventory, forecast renewable energy use, surpluses, deficits, and generation, and facilitate emission allocation, emission trading, and the like. Due to the detailed and real-time or near real-time nature of such calculations, the smart building manager 106 may include or be coupled to a micro-transaction emission trading platform.

The DR layer 112 may further be configured to facilitate the storage of on-site electrical or thermal storage and to controllably shift electrical loads from peak to off peak times using the stored electrical or thermal storage. The DR layer 112 may be configured to significantly shed loads during peak hours if, for example, high price or contracted curtailment signals are received, using the stored electrical or thermal storage and without significantly affecting building operation or comfort. The integrated control layer 116 may be configured to use a building pre-cooling algorithm in the night or morning and rely on calculated thermal storage characteristics for the building in order to reduce peak demand for cooling. Further, the integrated control layer 116 may be configured to use inputs such as utility rates, type of cooling equipment, occupancy schedule, building construction, climate conditions, upcoming weather events, and the like to make control decisions (e.g., the extent to which to pre-cool, etc.).

Automated Measurement & Verification Layer

FIGS. 1A and 1B are further shown to include an automated measurement and validation layer 110 configured to evaluate building system (and subsystem) performance. The automated measurement and validation (AM&V) layer 110 may implement various methods or standards of the international performance measurement and validation (IPMVP) protocol. In an exemplary embodiment, the AM&V layer 110 is configured to automatically (e.g., using data aggregated by the AM&V layer 110, integrated control layer 116, building subsystem integration layer 118, FDD layer 114, or otherwise) verify the impact of the integrated control layer 116, the FDD layer 114, the DR layer 112, or other energy-saving strategies of the smart building manager 106. For example, the AM&V layer 110 may be used to validate energy savings obtained by capital intensive retrofit projects that are monitored or managed post retrofit by the smart building manager. The AM&V layer 110 may be configured to calculate, for example, a return on investment date, the money saved using pricing information available from utilities, and the like. The AM&V layer 110 may allow for user selection of the validation method(s) it uses. For example, the AM&V layer 110 may allow for the user to select IPMVP Option C which specifies a method for the direct comparison of monthly or daily energy use from a baseline model to actual data from the post-installation measurement period. IPMVP Option C, for example, may specify for adjustments to be made of the base-year energy model analysis to account for current year over base year changes in energy-governing factors such as weather, metering period, occupancy, or production volumes. The AM&V layer 110 may be configured to track (e.g., using received communications) the inputs for use by such a validation method at regular intervals and may be configured to make adjustments to an "adjusted baseline energy use" model against which to measure savings. The AM&V layer 110 may further allow for manual or automatic non-routine adjustments of factors such as changes to the facility size, building envelope, or major equipment. Algorithms according to IPMVP Option B or Option A may also or alternatively be used or included with the AM&V layer 110. IPMVP Option B and IPMVP Option A involve measuring or calculating energy use of a system in isolation before and after it is retrofitted. Using the building subsystem integration layer (or other layers of the BMS), relevant data may be stored and the AM&V layer 110 may be configured to track the parameters specified by IPMVP Option B or A for the computation of energy savings for a system in isolation (e.g., flow rates, temperatures, power for a chiller, etc.).

The AM&V layer 110 may further be configured to verify that control strategies commanded by, for example, the integrated control layer or the DR layer are working properly. Further, the AM&V layer 110 may be configured to verify that a building has fulfilled curtailment contract obligations. The AM&V layer 110 may further be configured as an independent verification source for the energy supply company (utility). One concern of the utility is that a conventional smart meter may be compromised to report less energy (or energy consumed at the wrong time). The AM&V layer 110 can be used to audit smart meter data (or other data used by the utility) by measuring energy consumption directly from the building subsystems or knowledge of building subsystem usage and comparing the measurement or knowledge to the metered consumption data. If there is a discrepancy, the AM&V layer may be configured to report the discrepancy directly to the utility. Because the AM&V layer may be continuously operational and automated (e.g., not based on a monthly or quarterly calculation), the AM&V layer may be configured to provide verification of impact (e.g., of demand signals) on a granular scale (e.g., hourly, daily, weekly, etc.). For example, the AM&V layer may be configured to support the validation of very short curtailment contracts (e.g., drop X kW/h over 20 minutes starting at 2:00 pm) acted upon by the DR layer 112. The DR layer 112 may track meter data to create a subhourly baseline model against which to measure load reductions. The model may be based on average load during a period of hours prior to the curtailment event, during the five prior uncontrolled days, or as specified by other contract requirements from a utility or curtailment service provider (e.g., broker). The calculations made by the AM&V layer 110 may be based on building system energy models and may be driven by a combination of stipulated and measured input parameters to estimate, calculate, apportion, and/or plan for load reductions resulting from the DR control activities.

The AM&V layer 110 may yet further be configured to calculate energy savings and peak demand reductions in accordance with standards, protocols, or best practices for enterprise accounting and reporting on greenhouse gas (GHG) emissions. An application may access data provided or calculated by the AM&V layer 110 to provide for web-based graphical user interfaces or reports. The data underlying the GUIs or reports may be checked by the AM&V layer 110 according to, for example, the GHG Protocol Corporate Accounting Standard and the GHG Protocol for Project Accounting. The AM&V layer 110 preferably consolidates data from all the potential sources of GHG emissions at a building or campus and calculates carbon credits, energy savings in dollars (or any other currency or unit of measure), makes adjustments to the calculations or outputs based on any numbers of standards or methods, and creates detailed accountings or inventories of GHG emissions or emission reductions for each building. Such calculations and outputs may allow the AM&V layer 110 to communicate with electronic trading platforms, contract partners, or other third parties in real time or near real time to facilitate, for example, carbon offset trading and the like.

The AM&V Layer 110 may be further configured to become a "smart electric meter" a or substitute for conventional electric meters. One reason the adoption rate of the "Smart Electric Grid" has conventionally been low is that currently installed electric meters must be replaced so that the meters will support Real Time Pricing (RTP) of energy and other data communications features. The AM&V layer 110 can collect interval-based electric meter data and store the data within the system. The AM&V layer 110 can also communicate with the utility to retrieve or otherwise receive Real Time Pricing (RTP) signals or other pricing information and associate the prices with the meter data. The utility can query this information from the smart building manager (e.g., the AM&V layer 110, the DR layer 112) at the end of a billing period and charge the customer using a RTP tariff or another mechanism. In this manner, the AM&V layer 110 can be used as a "Smart Electric Meter".

When the AM&V layer 110 is used in conjunction with the DR layer 112, building subsystem integration layer 118, and enterprise integration layer 108, the smart building manager 106 can be configured as an energy service portal (ESP). As an ESP, the smart building manager 106 may communicably or functionally connect the smart grid (e.g., energy supply company, utility, ISO, broker, etc.) network to the metering and energy management devices in a building (e.g., devices built into appliances such as dishwashers or other "smart" appliances). In other words, the smart building manager 106 may be configured to route messages to and from other data-aware (e.g., Real Time Pricing (RTP) aware, curtailment signal aware, pricing aware, etc.) devices and the energy supply company. In this configuration, building subsystems that are not RTP aware will be managed by the DR layer 112 while devices that are RTP aware can get signals directly from the utility. For example, if a vehicle (e.g., PHEV) is programmed to charge only when the price of electricity is below $0.1/kWh, the PHEV can query the utility through the smart building manager and charge independently from the DR layer 112.

In an exemplary embodiment, the AM&V layer described in U.S. Provisional Application No. 61/302,854, filed Feb. 9, 2010 can be used as AM&V layer 110 or a part thereof.

Enterprise Integration Layer

The enterprise integration layer 108 shown in FIG. 1A or FIG. 1B is configured to serve clients or local applications with information and services to support a variety of enterprise-level applications. The enterprise integration layer 108 may be configured to communicate (in real time or near real time) with the smart grid 104 and energy providers and purchasers 102. More particularly, in some embodiments the enterprise integration layer 108 may communicate with "smart meters," automated meter interfaces with utilities, carbon emission tracking and accounting systems, energy reporting systems, a building occupant interface, and traditional enterprise productivity applications (e.g., maintenance management systems, financial systems, workplace and supply chain management systems, etc.). The enterprise integration layer 108 may be configured to use protocols and methods as described above with respect to other layers or otherwise.

Communication and Security Features

Referring again to FIG. 3, the smart building manager may be configured to provide drivers for BACnet, LON, N2, Modbus, OPC, OBIX, MIG, SMTP, XML, Web services, and various other wireless communications protocols including Zigbee. These drivers may be implemented within or used by the service bus adapters or subsystem adapters. The service bus for the smart building manager may be configured to communicate using any number of smart grid communications standards. Such standards may be utilized for intra-manager communication as well as communication with a smart grid component (e.g., utility company, smart meter, etc.). For example, the smart building manager may be configured to use the ANSI C12.22/C12.19 protocol for some internal communications (e.g., DR events) as well as for communications with the smart grid. The service bus adapters and subsystem adapters convert received messages into a normalized messaging format for use on the service bus. In an exemplary embodiment the service bus is flexible, making use of IT-centric message queuing technologies (e.g., Open AMQ, MSMQ, and WebSphere MQ) to assure reliability, security, scalability, and performance. Service bus adapters enable layers and applications to communicate among one another and/or to the various in-building or external systems (e.g., via subsystem adapters). Stored communications rules may be used by the service bus adapters, subsystem adapters, or other components of the system to catch or correct communications failures. Communications and action-failure rules may also be configured for use by the action layers of the system. For example, the DR layer can check for whether an action requested or commanded by the DR layer has completed. If not, the DR layer can take a different action or a corrective action (e.g., turn off an alternate load, adjust additional setpoints, trigger a focused FDD activity, etc.) to ensure that DR needs are met. The smart building manager can also determine if someone has provided a DR override command to the system and take corrective action if available. If corrective action is unavailable, an appropriate message or warning may be sent to a DR partner (e.g., a utility co., an energy purchaser via the smart grid, etc.).

The smart building manager 106 may reside on (e.g., be connected to) an IP Ethernet network utilizing standard network infrastructure protocols and applications (e.g., DNS, DHCP, SNTP, SNMP, Active Directory, etc.) and can also be secured using IT security best practices for those standard network infrastructure protocols and applications. For example, in some embodiments the smart building manager may include or be installed "behind" infrastructure software or hardware such as firewalls or switches. Further, configurations in the smart building manager 106 can be used by the system to adjust the level of security of the smart building manager 106. For example, the smart building manager 106 (or particular components thereof) can be configured to allow its middle layers or other components to communicate only with each other, to communicate with a LAN, WAN, or Internet, to communicate with select devices having a building service, or to restrict communications with any of the above mentioned layers, components, data sources, networks, or devices. The smart building manager 106 may be configured to support a tiered network architecture approach to communications which may provide for some measure of security. Outward facing components are placed in a less secure "tier" of the network to act as a point of entry to/from the smart building manager 106. These outward facing components are minimized (e.g., a web server receives and handles all requests from client applications) which limits the number of ways the system can be accessed and provides an indirect communications route between external devices, applications, and networks and the internal layers or modules of the smart building manager 106. For example, "behind" the outward facing "first tier" may lie a more secure tier of the network that requires authentication and authorization to occur at the first tier before functions of the more secure tier are accessed. The smart building manager 106 may be configured to include firewalls between such tiers or to define such tiers to protect databases or core components of the system from direct unauthorized access from outside networks.

In addition to including or implementing "infrastructure" type security measures as the type disclosed above, the smart building manager may be configured to include a communications security module configured to provide network message security between the smart building manager and an outside device or application. For example, if SOAP messaging over HTTP is used for communication at the enterprise integration layer, the SOAP messages may be concatenated to include an RC2 encrypted header containing authentication credentials. The authentication credentials may be checked by the receiving device (e.g., the smart building manager, the end application or device, etc.). In some embodiments the encrypted header may also contain information (e.g., bits) configured to identify whether the message was tampered with during transmission, has been spoofed, or is being "replayed" by an attacker. If a message does not conform to an expected format, or if any part of the authentication fails, the smart building manager may be configured to reject the message and any other unauthorized commands to the system. In some embodiments that use HTTP messages between the application and the smart building manager, the smart building manager may be configured to provide SSL for message content security (encryption) and/or Forms authentication for message authentication.

The smart building manager 106 may yet further include an access security module that requires any application to be authenticated with user credentials prior to logging into the system. The access security module may be configured to complete a secure authentication challenge, accomplished via a public or private key exchange (e.g., RSA keys) of a session key (e.g., an RC2 key), after a login with user credentials. The session key is used to encrypt the user credentials for the authentication challenge. After the authentication challenge, the session key is used to encrypt the security header of the messages. Once authenticated, user actions within the system are restricted by action-based authorizations and can be limited. For example, a user may be able to command and control HVAC points, but may not be able to command and control Fire and Security points. Furthermore, actions of a user within the smart building manager are written to memory via an audit trail engine, providing a record of the actions that were taken. The database component of the smart building manager 106 (e.g., for storing device information, DR profiles, configuration data, pricing information, or other data mentioned herein or otherwise) can be accessible via an SQL server that is a part of the building management server or located remotely from the smart building manager 106. For example, the database server component of the smart building manager 106 may be physically separated from other smart building manager components and located in a more secure tier of the network (e.g., behind another firewall). The smart building manager 106 may use SQL authentication for secure access to one or more of the aforementioned databases. Furthermore, in an exemplary embodiment the smart building manager can be configured to support the use of non-default instances of SQL and a non-default TCP port for SQL. The operating system of the smart building manager may be a Windows-based operating system.

Each smart building manager 106 may provide its own security and is not reliant on a central server to provide the security. Further, the same robustness of the smart building manager 106 that provides the ability to incorporate new building subsystem communications standards, modules, drivers and the like also allows it to incorporate new and changing security standards (e.g., for each module, at a higher level, etc.).

Multi-Campus/Multi-Building Energy Management

The smart building manager 106 shown in the Figures may be configured to support multi-campus or multi-building energy management services. Each of a plurality of campuses can include a smart building manager configured to manage the building, IT, and energy resources of each campus. In such an example, the building subsystems shown, e.g, in FIGS. 1A and 1B may be a collection of building subsystems for multiple buildings in a campus. The smart building manager may be configured to bi-directionally communicate with on-site power generation systems (e.g., distributed power sources, related services, solar arrays, fuel cell arrays, diesel generators, combined heat and power (CHP) systems, etc.), plug-in hybrid electric vehicle (PHEV) systems, and energy storage systems (e.g., stationary energy storage, thermal energy storage, etc.). Data inputs from such sources may be used by the demand and response layer of the smart building manager to make demand or response decisions and to provide other ancillary services to a connected smart grid (e.g., utility, smart meter connected to a utility, etc.) in real time or near real time. For example, the smart building manager may communicate with smart meters associated with an energy utility and directly or indirectly with independent systems operators (ISOs) which may be regional power providers. Using these communications, and its inputs from devices of the campus, the smart building manager (e.g., the demand response layer) is configured to engage in "peak shaving," "load shedding," or "load balancing" programs which provide financial incentives for reducing power draw during certain days or times of day. The demand response layer or other control algorithms of the smart building manager (e.g., control algorithms of the integrated control layer) may be configured to use weather forecast information to make setpoint or load shedding decisions (e.g., so that comfort of buildings in the campus is not compromised). The smart building manager may be configured to use energy pricing information, campus energy use information, or other information to optimize business transactions (e.g., the purchase of energy from the smart grid, the sale of energy to the smart grid, the purchase or sale of carbon credits with energy providers and purchasers, etc.). The smart building manager is configured to use the decisions and processing of the demand response layer to affect control algorithms of the integrated control layer.

While FIG. 1B is shown as a tightly-coupled smart building manager 106, in some embodiments the processing circuit of FIG. 1B (including the layers/modules thereof) may be distributed to different servers that together form the smart building manager having the control features described herein. In embodiments where the smart building manager 106 is controlling an entire campus or set of campuses, one or more smart building managers may be layered to effect hierarchical control activities. For example, an enterprise level smart building manager may provide overall DR strategy decisions to a plurality of lower level smart building managers that process the strategy decisions (e.g., using the framework shown in FIG. 3) to effect change at an individual campus or building. By way of further example, the "integrated control layer" 116 and the "building system integration layer" 118 may be replicated for each building and stored within lower level smart building servers while a single enterprise level smart building manager may provide a single higher level layer such the DR layer. Such a DR layer can execute a campus-wide DR strategy by passing appropriate DR events to the separate lower level smart building mangers having integrated control layers and building system integration layers. Higher level servers may provide software interfaces (APIs) to the one or more lower level servers so that the one or more lower level servers can request information from the higher level server, provide commands to the higher level server, or otherwise communicate with the layers or data of the higher level server. The reverse is also true, APIs or other software interfaces of the lower level servers may be exposed for consumption by the higher level server. The software interfaces may be web services interfaces, relational database connections, or otherwise.

Statistical Process Control and Fault Detection Using Moving Averages

A moving average can be used as an input to a statistical process control strategy for detecting a variation in the behavior of the building management system. In general, moving averages are a class of statistical metrics that utilize previously calculated averages in their computation. Moving averages may advantageously reduce processing times and memory requirements relative to other statistical processing strategies, since only a subset of the data values needs to be retained. For example, a standard average may be calculated using the formula:

$$avg_i = \frac{\sum_{i=1}^{n} x_i}{i}$$

where i is the number of data points and $x_i$ is the $i^{th}$ data point. A standard average requires summing the data points each time a new data point is collected and requires retaining each data point in memory. A moving average, by contrast, can use the previously calculated average to generate a new average when $x_{i+1}$ becomes available. For example, a moving average may be calculated using:

$$mov\_avg_{i+1} = \frac{x_{i+1} + i * avg_i}{i+1}$$

where $x_{i+1}$ is the most recent data point and $avg_i$ is the previously computed average.

Weighted moving averages are a subclass of moving averages that apply weightings to the various subsets of data. For example, a weighted moving average may weight more recent data values higher than older values. In this way, the weighted moving average provides a current metric on the underlying data. Exponentially weighted averages (EWMAs) have been used to diagnose faults in building management controllers. See, U.S. Pat. No. 5,682,329 to Seem et al. EWMAs utilize exponential weightings that can be used to give greater emphasis to more recent values. A variety of equations exist for calculating an EWMA. For example, an EWMA may be calculated according to the following function:

$$\overline{x}_t = \sum_{j=0}^{\infty} \lambda(1-\lambda)^j x_{t-j}$$

where $\overline{x}_t$ is the EWMA at time t; $\lambda$ is an exponential smoothing constant or filter value; and $x_{t-j}$ is the value of the signal at time t−j.

Embodiments of the present application can include using EWMA-based control strategies to detect errors. In one example relating to an HVAC system, a building management system controller may sample the position of a damper that it controls. The controller can then calculate the EWMA of the position value. If the EWMA exceeds a threshold, the controller may determine that the damper is in a saturation condition. The controller can then notify a user of the potential fault.

In another example, a network of controllers may collect EWMA values for a temperature error. A design criterion for the network may be set such that ninety five percent of all controllers should have a temperature error EWMA of below 2° F. An EWMA of the temperature error greater than 2° F. could be used to estimate or predict system faults while an EWMA of less than 2° F. could indicate that the network is working properly.

A statistical process control strategy of varying exemplary embodiments may detect variations in measured data by evaluating the measured data relative to a trained statistical model (e.g., a statistical process control chart). The trained statistical model may be based on measurements taken during a training period (e.g., while the building management system is operating normally, during a steady state operating period, etc.). The trained statistical model is used to predict behavior for the building management system under normal operating conditions. Measured data that falls outside of the parameters of the statistical model may be considered to be statistically significant and indicate that the predicted behavior is no longer valid and/or that faults exist in the building management system.

Figure 5A:
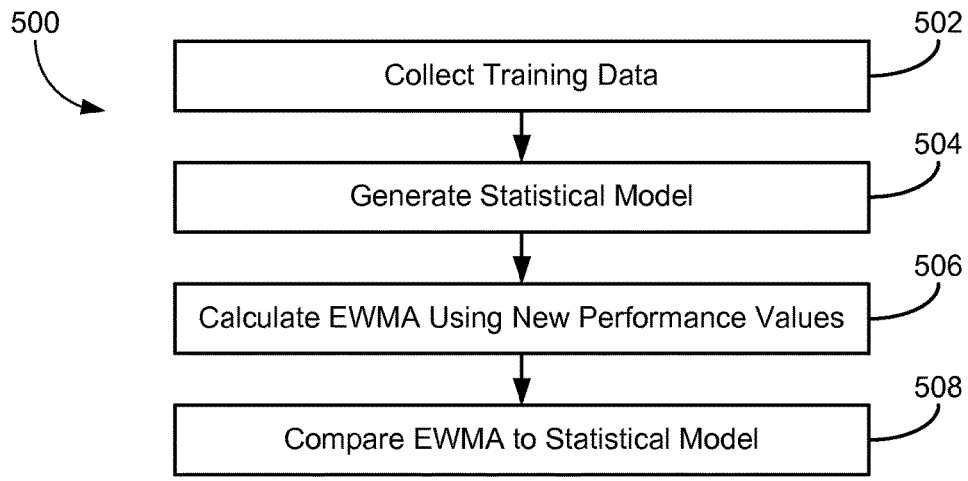
FIG. 5A is a flow diagram of a process for using statistical process control with moving averages, according to an exemplary embodiment.

Referring now to FIG. 5A, a flow diagram of a process 500 for using statistical process control to detect faults in a building management system is shown, according to an exemplary embodiment. Process 500 includes collecting training data from the building management system (step 502). During the training period, training data (i.e. performance values) are collected to build a history of performance values. For example, the performance values may be measured temperature values, calculated error rates, moving averages, measured power consumptions, or any other historical performance data. The history of performance values is used to determine if the BMS is operating normally.

Once a sufficient history of performance values has been built, the history can be used to generate a statistical model (step 504). Generally speaking, the statistical model is a set of metrics based on, calculated using, or describing the history of performance values. The statistical model is used to predict a behavior of the BMS.

Process 500 is further shown to include calculating an EWMA using new performance values (step 506). The new performance values are collected after the training period. In some embodiments, the new performance values are collected by building management controllers and sent via a network to a remote location for calculation of the EWMA. In other embodiments, the EWMA is calculated directly on a local BMS controller that collects the performance values.

Process 500 is yet further shown to include comparing the EWMA calculated in step 506 to the statistical model generated in step 504 (step 508). For example, the EWMA calculated in step 506 can be compared to the statistical model generated in step 504 to test for statistical significance, i.e. if the EWMA is an outlier in relation to the statistical model. If a specified number of outliers are detected, the system can determine that the newly observed behavior of the system no longer matches the predicted behavior (i.e., described by the statistical model of step 504) and that appropriate action is necessary. If the new performance value is determined to be statistically significant in step 508, i.e. it is an outlier in relation to the statistical model of behavior for that performance value, any number of actions may be taken by the BMS and/or a user. For example, if process 500 is used within fault detection and diagnostics (FDD) layer 114, statistical significance of new performance values may indicate that a fault condition exists. FDD layer 114 may then notify a user, a maintenance scheduling system, or a control algorithm configured to attempt to further diagnose the fault, to repair the fault, or to work-around the fault. If process 500 is used in automated measurement and validation (AM&V) layer 110, a statistical significance of new performance values may indicate that a predicted model of a power consumption is no longer valid. AM&V layer 110 may then attempt to update the statistical model to better predict future power consumptions and/or notify FDD layer 114 that a fault condition may exist.

Figure 5B:
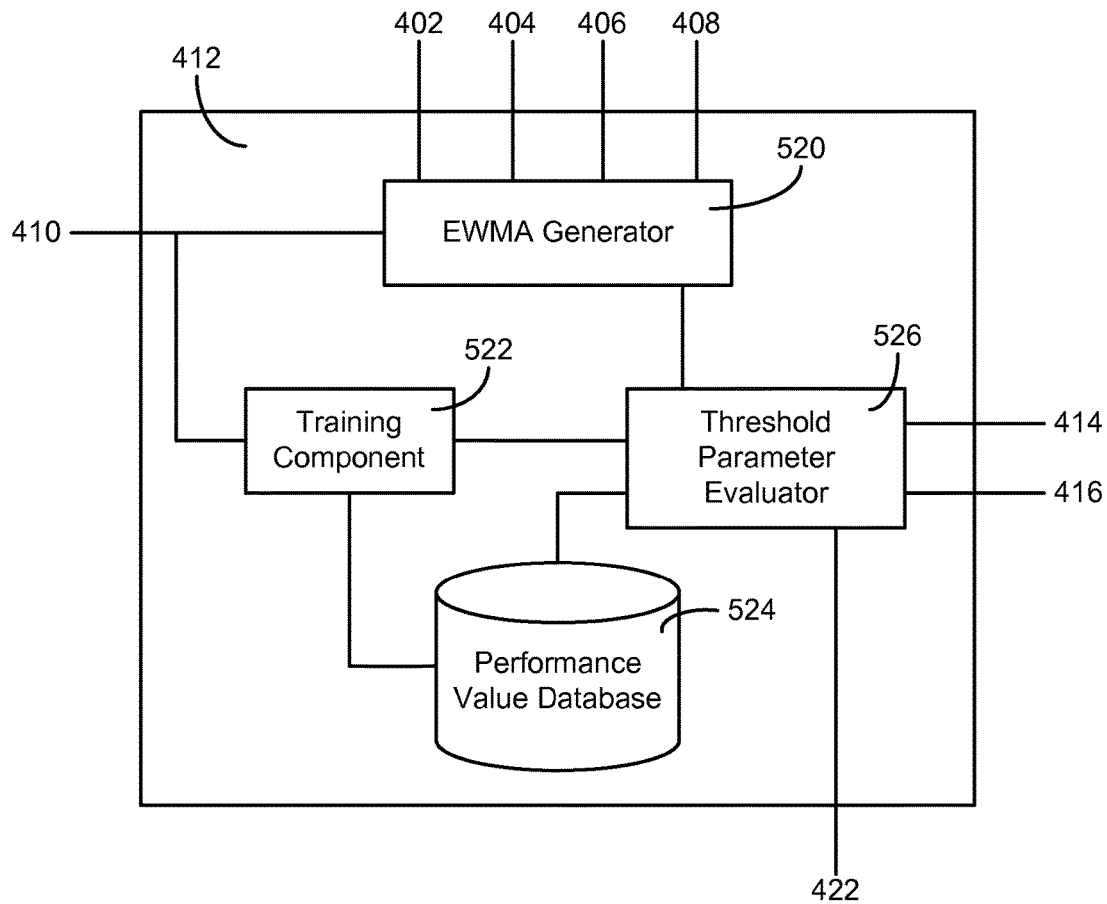
FIG. 5B is a detailed diagram of a fault detection module, according to an exemplary embodiment.

Referring now to FIG. 5B, a detailed diagram of a fault detection module is shown, according to an exemplary embodiment. Automated fault detection module 412 includes EWMA generator 520, which receives building management system data such as meter data 402, weather data 404 and building subsystem data 408. EWMA generator 520 calculates exponentially weighted moving averages of the data or a value calculated using the data, and outputs them as performance indices 410. Performance indices 410 may be stored in performance value database 524.

The EWMAs may be calculated directly on building equipment controllers not shown in FIG. 5B and transmitted to automated fault detection module 412 (e.g., via a network, via communications electronics, etc.). In other embodiments, some EWMAs are calculated directly on the building equipment controllers, while others are calculated remotely by EWMA generator 520.

EWMA generator 520 may calculate the moving averages by first removing sudden spikes in the data by applying an anti-spike filter or an outlier filter. For example, EWMA generator 520 may use a generalized extreme studentized distribution method to remove outliers in the building management system data. EWMA generator 520 may also subsample the building management system data to reduce the effects of autocorrelation in the data. For example, a sampling interval greater than or equal to the time constant of the process being controlled by the building equipment controller may be used.

Automated fault detection module 412 includes performance value database 524. Performance value database 524 can store a history of performance values used by training component 522 to generate statistical models, such as model data 406. In one embodiment, the history of performance values stored in performance value database 524 contains a record of EWMAs previously calculated by EWMA generator 520. In another embodiment, performance value database 524 contains a history of raw data values from the building management system.

Automated fault detection module 412 is further shown to include training component 522 which performs statistical operations on the history of performance values to produce one or more threshold parameters as inputs to threshold evaluator 526. The threshold parameters are statistical predictors of the behavior of the building management system, i.e. markers that define a range of normal behavior within a specific statistical confidence. For example, training component 522 may generate threshold parameters that define a model wherein 99.7% of values observed during the training period fall within upper and lower temperature threshold parameters.

Automated fault detection module 412 is yet further shown to include threshold parameter evaluator 526. Threshold parameter evaluator 526 can use the one or more threshold parameters from training component 522 to determine if new performance values are statistically significant. For example, threshold parameter evaluator 526 may compare a new EWMA from EWMA generator 520 to a trained threshold parameter to determine if the new EWMA is statistically significant, i.e. the new EWMA falls outside of the predicted behavior. If a new performance value is statistically significant, threshold parameter evaluator 526 may notify automated diagnostics module 414, manual diagnostics module 416, and/or GUI services that a possible fault condition exists. Additionally, a user may be notified that a fault may exist by GUI services causing a graphical user interface to be displayed on an electronic display device. The generated graphical user interface can include an indicator that a fault has occurred and information regarding the estimated fault. Threshold parameter evaluator 526 may notify automated diagnostics module 414, manual diagnostics module 416, or GUI services only if a plurality of statistically significant performance values are detected.

Statistical Process Control Chart Generation

In many of the varying exemplary embodiments, the statistical model used in the statistical process control strategy may be a statistical process control chart (e.g., an EWMA control chart, etc.). Such charts typically utilize upper and lower control limits relative to a center line to define the statistical boundaries for the process. New data values that are outside of these boundaries indicate a deviation in the behavior of the process. In some cases, the charts may also contain one or more alarm thresholds that define separate alarm regions below the upper control limit and above the lower control limits. A processor utilizing such a chart may determine that a new data value is within or approaching an alarm region and generate an alert, initiate a diagnostic routine, or perform another action to move the new data values away from the alarm regions and back towards the center line. Although this disclosure variously mentions the term "chart," many of the exemplary embodiments of the disclosure will operate without storing or displaying a graphical representation of a chart. In such embodiments, an information structure suitable for representing the data of a statistical process control chart may be created, maintained, updated, processed, and/or stored in memory. Description in this disclosure that relates to systems having statistical process control charts or processes acting on or with statistical process control charts is intended to encompass systems and methods that include or act on such suitable information structures.

Figure 6A:
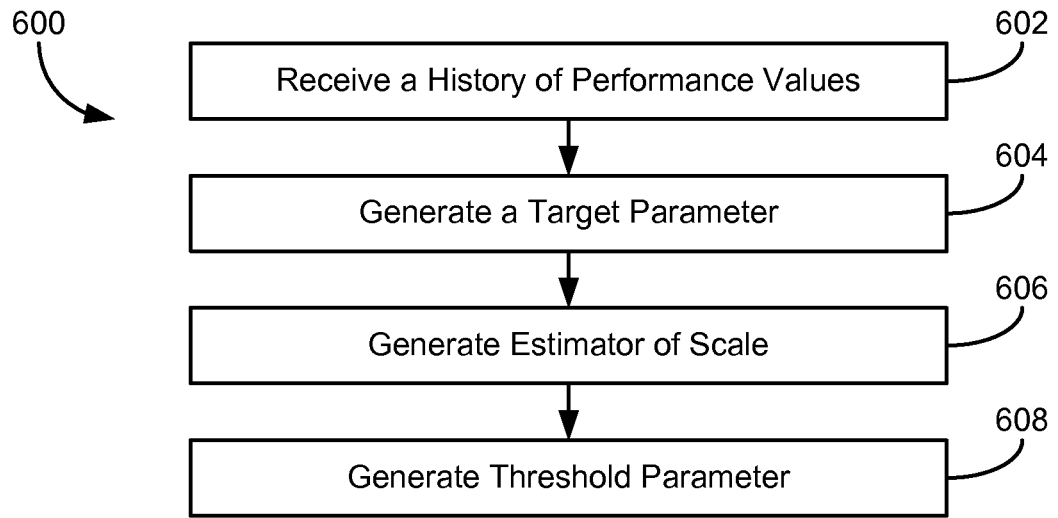
FIG. 6A is a flow diagram of a process for generating a statistical process control chart, according to an exemplary embodiment.

Referring now to FIG. 6A, a flow diagram of a process for generating a statistical process control chart is shown, according to an exemplary embodiment. Process 600 includes receiving a history of performance values (step 602). The performance values may be data collected by the BMS during normal operations. For example, the performance values may be measured temperature values, calculated error rates, measured power consumptions, or any other data that can be used to determine whether the BMS is operating normally. In another embodiment, the performance values are exponentially weighted moving averages of data from the BMS. A history of 150-500 performance values may be sufficient to create the statistical model, although more or less may be used in varying exemplary embodiments.

Process 600 is also shown to include generating a target parameter (step 604). The target parameter provides a target metric for the system under normal operating conditions. In one embodiment, the target parameter is the statistical mean of the history of performance values from step 602, i.e. the simple average of the performance values. In another embodiment, the median of the history is used. In yet another embodiment, a moving average of the performance values can be used. For example, the history of performance values may be measured temperature values that range from 95° F. to 105° F., with a simple average of 100° F. Therefore, a target parameter of 100° F. may be used to predict future temperatures for a normally operating BMS. Future performance values that vary greatly from the target parameter may indicate a fault in the BMS, a change in behavior of the BMS, or that the statistical model needs to be updated.

Process 600 is further shown to include generating an estimator of scale (step 606). Estimators of scale generally provide a metric that describes how spread out a set of performance values is relative to the target parameter. In one embodiment, the standard deviation of the history of performance values is calculated using the target parameter from step 604 and the performance values from step 602. For example, the history of performance values may contain measured temperatures that range from 95° F. to 105° F., with a simple average of 100° F. Assuming that the performance values are distributed normally, i.e. they conform to a Gaussian distribution, a calculated standard deviation of 1.5° F. indicates that approximately 99.7% of the measured temperatures fall within the range of 95.5° F. to 104.5° F. However, a non-normal distribution of the performance values or the presence of outlier performance values can affect the ability of a standard deviation to gauge the spread of the data.

In a preferred embodiment, a robust estimator of scale is calculated in step 606. Robust estimators of scale differ from standard estimators of scale, such as a standard deviation, by reducing the effects of outlying performance values. A variety of different types of robust estimators of scale may be used in conjunction with the present invention. For example, a robust estimator of scale that uses a pairwise difference approach may be used. Such approaches typically have a higher Gaussian efficiency than other robust approaches. These approaches provide a useful metric on the interpoint distances between elements of two arrays and can be used to compare a predicted behavior and an observed behavior in the building management system. For example, one robust estimator of scale may be defined as: $S_n = c_n * 1.1926 * \text{med}_i \{\text{med}_j(|x_i - x_j|)\}$ where the set of medians for $j=1, \ldots, n$ is first calculated as an inner operation. Next, the median of these results is calculated with respect to the i values. The median result is then multiplied by 1.1926, to provide consistency at normal distributions. A correction factor $c_n$ may also be applied and is typically defined as 1 if n is even. If n is odd, $c_n$ can be calculated as:

$$c_n = \frac{n}{n - 0.9}.$$

The described $S_n$ estimator of scale has a Gaussian efficiency of approximately 58%. Computational techniques are also known that compute $S_n$ in O(n log n) time.

In another exemplary embodiment, $Q_n$ may be used as a robust estimator of scale, where $Q_n$ is defined as $Q_n = d_n * 2.2219 * 1^{st}$ quartile($|x_i - x_j|$:i<j). As with $S_n$, a pairwise difference approach is taken to compute $Q_n$. If n is even, correction factor $d_n$ can be defined as:

$$d_n = \frac{n}{n + 1.4}$$

and if n is odd, correction factor $d_n$ can be defined as:

$$d_n = \frac{n}{n + 3.8}.$$

The $Q_n$ estimator of scale provides approximately an 82% Gaussian efficiency and can also be computed in O(n log n) time.

Process 600 is yet further shown to include generating a threshold parameter (step 608). In some embodiments, the threshold may be based on the estimator of scale from step 606. For example, the threshold parameters may be calculated using: threshold=$\mu \pm K * \sigma$ where K is a constant, $\mu$ is the target parameter and $\sigma$ is the estimator of scale.

A threshold parameter can be compared against a new performance value from the BMS to determine whether the new performance value is statistical significant. For example, if the history of performance values are measured temperatures that range from 95° F. to 105° F. with a simple average of 100° F. and a standard deviation of 1.5° F., K may be set to 3 to provide an upper threshold parameter of 104.5° F. Assuming that the data values are normally distributed, this means that approximately 99.85% of the historical temperatures fall below this threshold parameter. New temperature measurements that are equal to or greater than the threshold parameter may be statistically significant and indicate that a fault condition exists.

Figure 6B:
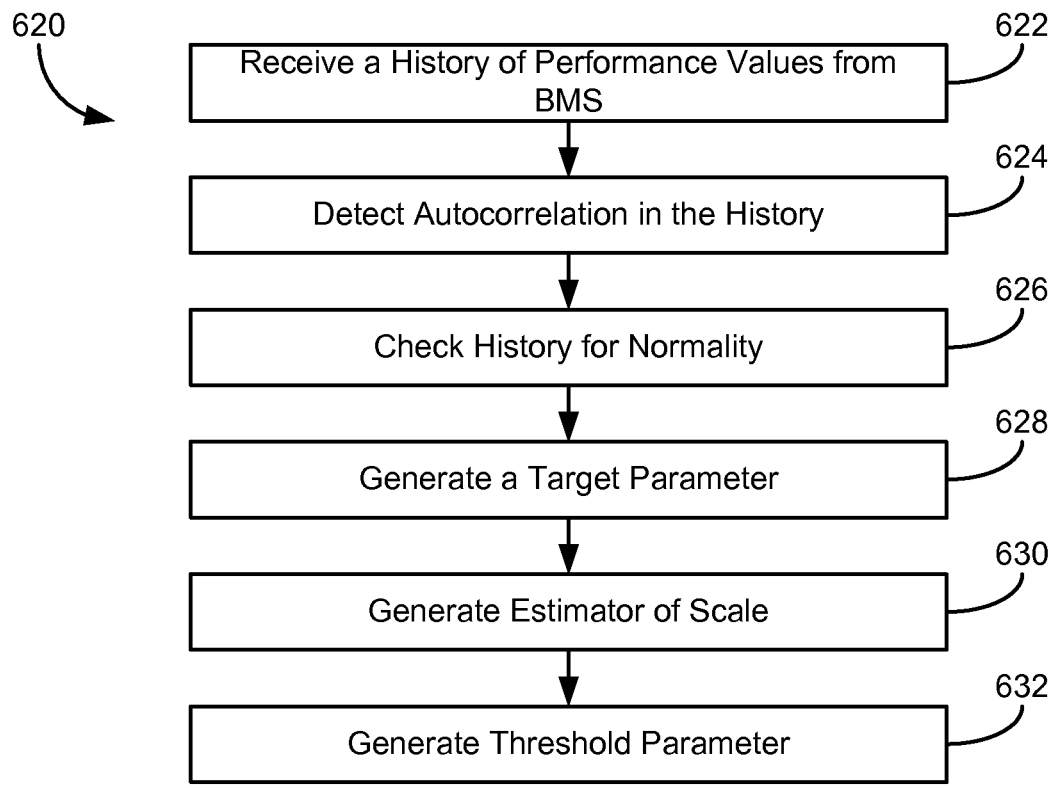
FIG. 6B is a more detailed flow diagram of a process for generating a statistical process control chart, according to an exemplary embodiment.

Referring now to FIG. 6B, a more detailed flow diagram of a process for generating a statistical process control chart is shown, according to an exemplary embodiment. Process 620 includes receiving a history of performance values from the BMS (step 622). In one embodiment, the history of performance values is built during a training period where the BMS is operating normally.

Process 620 is also shown to include checking the history of performance values for autocorrelation (step 624). In general, autocorrelation measures how closely a newer set of performance values follows the pattern of previous performance values. Any known method of testing autocorrelation may be used in step 624. For example, a lag-one correlation coefficient may be calculated to test for autocorrelation. If the coefficient is high, the data is assumed to be autocorrelated. If the coefficient is low, the data is assumed not to be autocorrelated.

Process 620 optionally includes checking the history of performance values for normality, i.e how closely the history conforms to a Gaussian distribution (step 626). Any suitable method of testing for normality may be used in step 626. For example, a Lillifors test may be used to test the null hypothesis that the data is normal against the alternative hypothesis that the data is not normal.

Process 620 is further shown to include generating a target parameter using the history of performance values (step 628). The characteristics of the history tested in steps 624 and 626 can be used to determine how the target parameter is generated. Any suitable metrics that reduce the effects of autocorrelation and non-normal data may be used. For example, if the history is determined not to be autocorrelated in step 624, the median of the history may be used as the target parameter. In other examples, the EWMA or the simple mean of the history is used.

If the data is determined to be autocorrelated in step 624, an autoregressive model may be used to fit the data and the residuals used to calculate the target parameter. For example, an AR(1) model may be fit to the history using the equation: $x_t = \phi_0 + \phi_1 * x_{t-1} + e_t$ where x is a predicted value, $x_{t-1}$ is a previous value, $\phi_0$ and $\phi_1$ are constants and $e_t$ is a residual. The target parameter can then be calculated using the residual values. For example, the target parameter can be the simple mean of the residual values. In other embodiments, the target parameter can be the median of the residual values, a moving average of the residual values, or any other statistical metric that generally corresponds to the center of the distribution of residual values.

Process 620 is yet further shown to include generating an estimator of scale (step 630). The estimator of scale may be generated using the target parameter and/or the history of performance values. The type of estimator of scale that is used may be determined based on the results of steps 624, 626 and/or the type of target parameter used in step 528. If the target parameter of step 628 is the median of the history and the history is not autocorrelated, a robust estimator of scale may be found for the history itself. However, if the data is autocorrelated and the target parameter is determined using an autoregressive model, a robust estimator of scale may calculated using the residuals of the autoregressive model. In other embodiments, other types of estimators of scale are used, such as a standard deviation.

Process 620 is also shown to include generating a threshold parameter (step 632). The threshold parameter may be calculated using the estimator of scale of step 626 and the target parameter of step 628. In some embodiments, the threshold parameter is calculated by multiplying the estimator of scale by a constant and adding or subtracting that value from the target parameter, as in step 606 of method 600. For example, if the estimator of scale is a simple standard deviation, the constant may be set to 3 to generate upper and lower thresholds that encompass approximately 99.7% of the history. In this way, the choice of a constant value may be used to define any number of threshold parameters. In one embodiment, the threshold parameter is calculated automatically by the BMS. In another embodiment, a user may input a desired threshold parameter using a display device configured to receive user input. In yet another embodiment, a hybrid approach may be taken where the BMS automatically calculates the threshold parameter and provided it to a display device for user confirmation of the threshold parameter or input of a different threshold parameter.

The target parameter and one or more threshold parameters generated in process 600 or process 620 may also be used to generate a SPC control chart. In such a case, the target parameter may be used as the center line of the chart. The threshold parameters may also be used as upper and lower control limits for the SPC control chart. New data that falls outside of the control limits of the chart may indicate a deviation in the behavior of the associated process.

Figure 7:
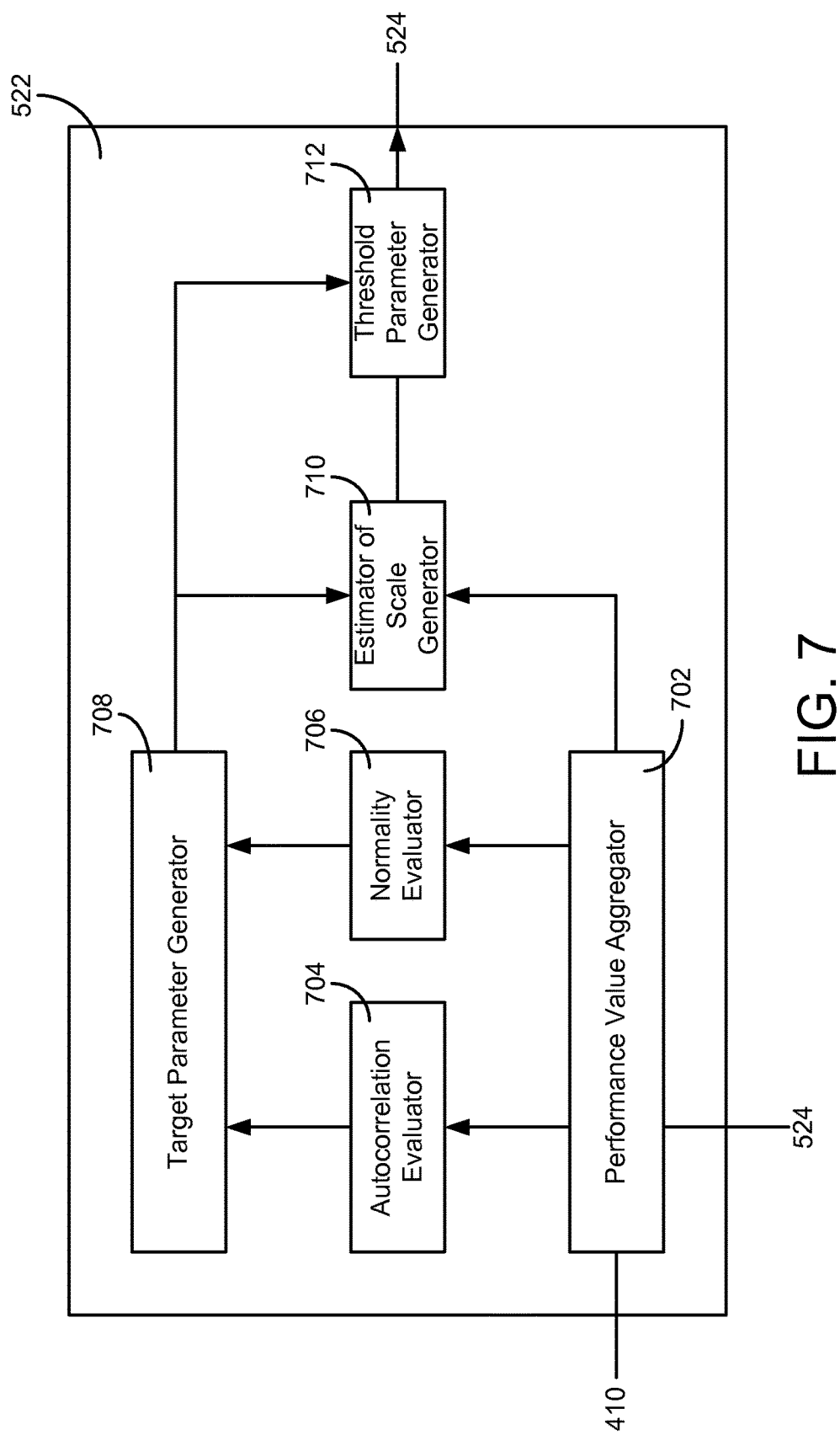
FIG. 7 is a detailed diagram of a training module for generating a statistical model, according to an exemplary embodiment.

Referring now to FIG. 7, a detailed diagram of training module 522 is shown, according to an exemplary embodiment. Training module 522 is shown to include performance value aggregator 702 which generates and maintains a history of performance values. During training, performance value aggregator 702 stores performance values from the BMS as performance indices 410 or in performance value database 524. Performance value aggregator 702 may also be configured to receive an input from automated diagnostics module 414, manual diagnostics module 416 or GUI services 422 that indicates that the system needs to be retrained. If retraining is needed, performance value aggregator 702 can update and store new performance values during the new training period. During a training period, performance value aggregator 702 can overwrite some data or delete some data (e.g., old data, faulty data, etc.) from the its performance value calculation. Once a sufficient number of performance values are collected, the training period ends and performance value aggregator retrieves a history of performance values from performance indices 410 or performance value database 524.

Training module 522 includes autocorrelation evaluator 704. Autocorrelation evaluator 704 detects autocorrelation in the history of performance values retrieved by performance value aggregator 702. For example, autocorrelation evaluator 704 may use a lag-one correlation coefficient method to test for autocorrelation in the history. The results of this determination are then provided to target parameter generator 708, and may be used to determine the method to be used in generating the target parameter.

Training module 522 includes normality evaluator 706. Normality evaluator determines how closely the history of performance values conforms to a Gaussian distribution, i.e. a bell-curve. Normal data provides a greater statistical confidence in the model's ability to predict behavior, although non-normal data can still be used to detect variations in the system's behavior.

Training module 522 is further shown to include target parameter generator 708 which uses the history of performance values from performance value aggregator 702 and the outputs of autocorrelation evaluator 704 and normality evaluator 706 to generate a target parameter. The target parameter provides a statistical center for the statistical model based on the history of performance values. For example, target parameter generator 708 may calculate the median of the history of performance values as the target parameter. Once target parameter generator 708 generates a target parameter, an estimator of scale is calculated by estimator of scale generator 710. Estimator of scale generator 708 uses the output of target parameter generator 708 and the history of performance values from performance value aggregator 702 to generate an estimator of scale for the history, i.e. a metric on how spread out the distribution of data is. In one embodiment, a robust estimator of scale is calculated by estimator of scale generator 710.

Training module 522 yet further includes threshold parameter generator 712, which uses the outputs of target parameter generator 708 and estimator of scale generator 710 to generate one or more threshold parameters. The one or more threshold parameters are then provided to threshold parameter evaluator 712 for comparison against new performance values.

Statistical Process Control to Measure and Verify Energy Savings

Figure 8:
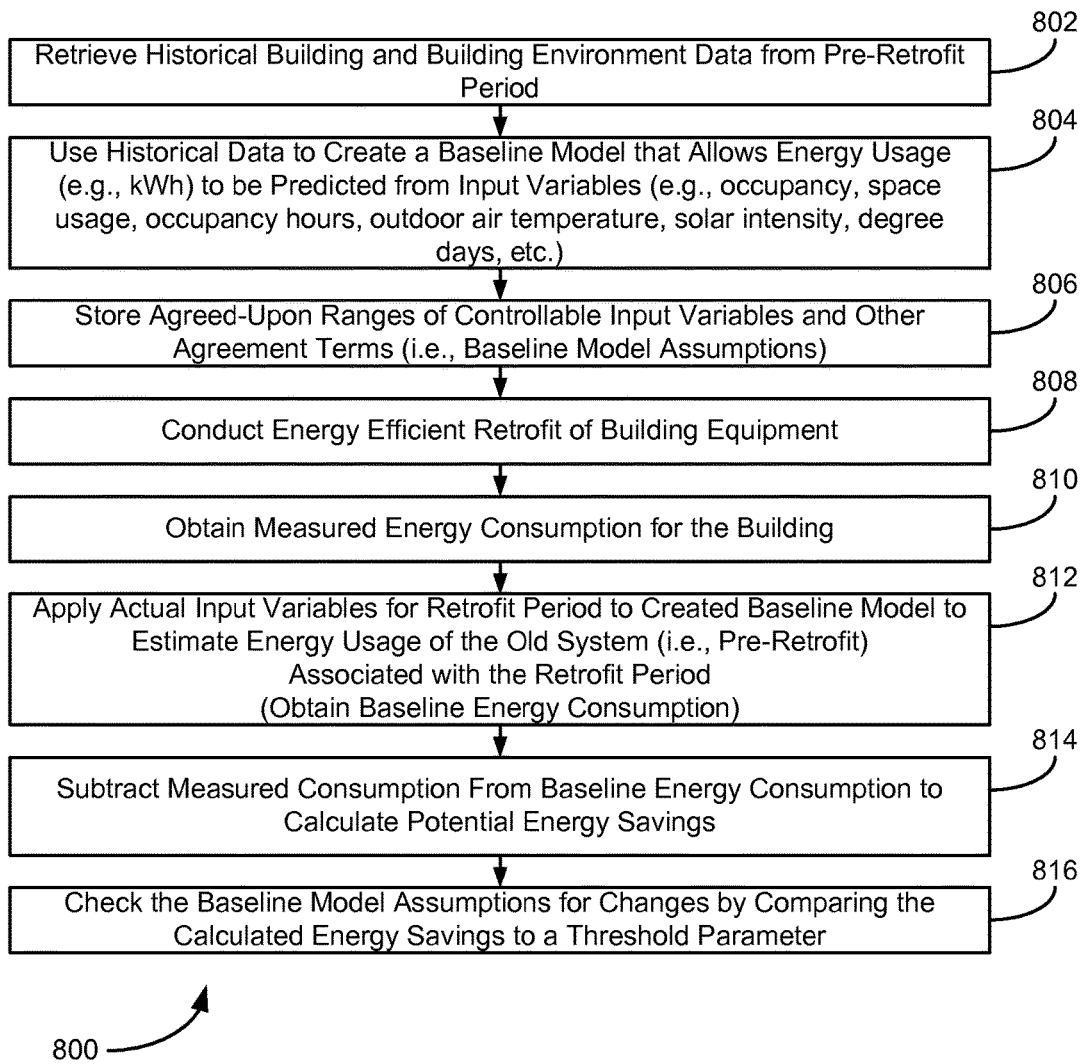
FIG. 8 is a process for measuring and verifying energy savings in a building management system, according to an exemplary embodiment.

Referring now to FIG. 8, a process 800 for measuring and verifying energy savings in a building management system is shown, according to an exemplary embodiment. Process 800 may be used by automated measurement and verification layer 110 to measure and verify energy savings in the building management system. Process 800 is shown to include retrieving historical building and building environment data from a pre-retrofit period (step 802). Input variables retrieved in step 802 and used in subsequent steps may include both controllable variables (e.g., variables that may be controlled by a user such as occupancy of an area, space usage, occupancy hours, etc.) and uncontrollable variables (e.g., outdoor temperature, solar intensity and duration, other weather occurrences, degree days, etc.). Variables which are not needed (i.e., they do not have an impact on the energy savings calculations) may be discarded or ignored by automated measurement and verification layer 110.

Process 800 is also shown to include using historical data to create a baseline model that allows energy usage (e.g., kWh) or power consumption (e.g., kW) to be predicted from varying input or predictor variables (e.g., occupancy, space usage, occupancy hours, outdoor air temperature, solar intensity, degree days, etc.) (step 804). For example, power consumptions measured during previous weekends may be used to predict future weekend power consumptions, since the building is likely at minimum occupancy during these times.

Process 800 is further shown to include storing agreed-upon ranges of controllable input variables and other agreement terms in memory (step 806). These stored and agreed-upon ranges or terms may be used as baseline model assumptions. In other embodiments the baseline model or a resultant contract outcome may be shifted or changed when agreed-upon terms are not met.

Process 800 is yet further shown to include conducting an energy efficient retrofit of a building environment (step 808). The energy efficient retrofit may include any one or more process or equipment changes or upgrades expected to result in reduced energy consumption by a building. For example, an energy efficient air handling unit having a self-optimizing controller may be installed in a building in place of a legacy air handling unit with a conventional controller. Once the energy efficient retrofit is installed, a measured energy consumption for the building is obtained (step 810). The post-retrofit energy consumption may be measured by a utility provider (e.g., power company), a system or device configured to calculate energy expended by the building HVAC system, or otherwise.

Process 800 also includes applying actual input variables of the post-retrofit period to the previously created baseline model to predict energy usage of the old system during the post-retrofit period (step 812). This step results in obtaining a baseline energy consumption (e.g., in kWh) against which actual measured consumption from the retrofit can be compared.

Process 800 is further shown to include subtracting the measured consumption from the baseline energy consumption to determine potential energy savings (step 814). In an exemplary embodiment, a baseline energy consumption is compared to a measured consumption in by subtracting the measured consumption during the post-retrofit period from the baseline energy consumption calculated in step 812. This subtraction will yield the energy savings resulting from the retrofit.

Process 800 is yet further shown to include checking the baseline model assumptions for changes by comparing the calculated energy savings to a threshold parameter (step 816). For example, an EWMA control chart may be applied to the calculated energy savings to check the validity of the model assumptions. Such a chart may utilize control limits (e.g., threshold parameters) generated using a computerized implementation of process 600 or 620. A BMS implementing process 800 may determine if the savings are outside of the control limits of the chart. If the savings are outside of the control limits, the BMS may then generate an alert or may initiate other corrective measures. For example, the BMS may then determine new baseline model assumptions (e.g., by repeating step 806) and repeating steps 808-816 to continuously calculate and verify the potential energy savings for the building.

Figure 9:
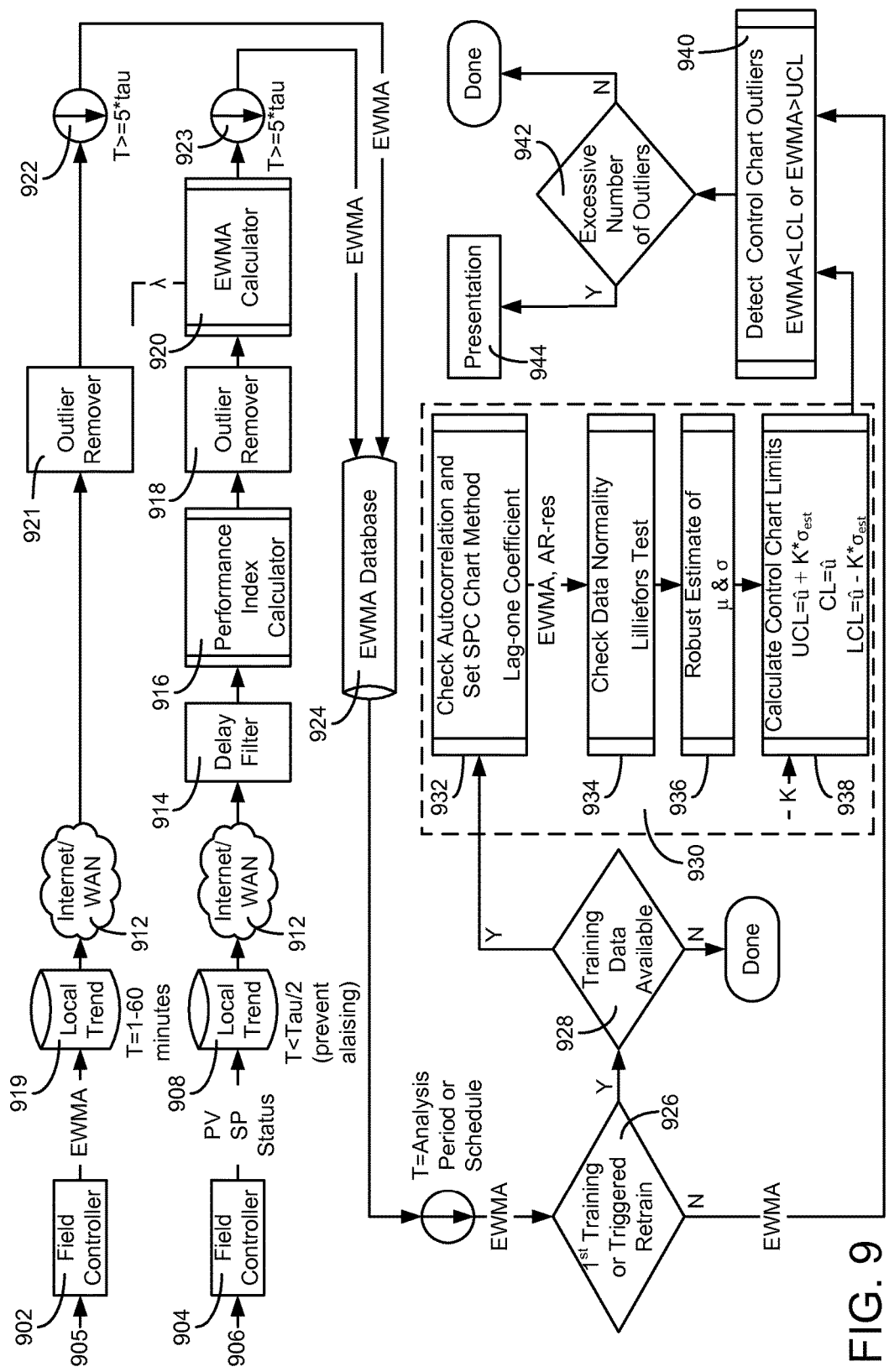
FIG. 9 is a detailed diagram of a building management system using statistical control, according to an exemplary embodiment.

Referring now to FIG. 9, a detailed diagram of a building management system portion is shown, according to an exemplary embodiment. The logic blocks shown in FIG. 9 may represent software modules of fault detection and diagnostics layer 114 shown in FIG. 1. Field controller 904 controls one or more components of the BMS and receives or calculates performance values 906 (e.g., sensor inputs, actuator positions, etc.). Controller 904 can store a trend of performance values 906, setpoints and current status in local trend storage 908. Trend storage 908 may be a memory device that is a component of, coupled to, or located externally to controller 904. In one embodiment, the trend sample intervals used to sample performance values 906 are setup during a system configuration process. For example, the sample intervals may be less than one half of the time constant of the process controlled by controller 904 to prevent aliasing. Other sample intervals may also be used, depending upon the type of data that is sampled.

The trend data in local trend storage 908 may be communicated over network 912 (e.g., the Internet, a WAN, a LAN, etc.) to an EWMA database 924 or to an intermediate server between controller 904 and EWMA database 924. In one embodiment, the trend data from local trend storage 908 may be provided to delay filter 914. Delay filter 914 removes data that is likely to contain excessive field controller dynamics. Typically, the delay period for delay filter 914 is greater than or equal to five times the time constant of the process controlled by controller 904, although other delay periods may also be used. In some embodiments, delay filter 914 is triggered by a change in the current status of controller 904 or by changes in one or more setpoint values for controller 904.

A performance index calculator 916 may use the outputs of delay filter 914 to calculate a performance index. For example, performance index calculator 916 may use the setpoint of controller 904 minus performance values 906 to determine a performance index. Once a performance index has been calculated by performance index calculator 916, outlier remover 918 may be used to remove anomalous values. For example, outlier remover 918 may utilize the generalized extreme studentized deviate (GESD) method or an anti-spike filter to remove extreme data values.

EWMA calculator 920 may calculate a moving average of the data from outlier remover 918, which is sub-sampled by sampler 923. Sampler 923 samples the EWMA data to remove or reduce autocorrelation. For example, sampler 923 may utilize a sample interval greater than or equal to five times the time constant of the process controlled by controller 904 to sample the EWMA data, although other sampler intervals may also be used.

In other embodiments, EWMAs may be calculated directly in a controller, such as field controller 902. Field controller 902 receives performance values 905 from the controlled process (e.g., measured temperature values, measured power consumptions, or any other data that can be used to determine if the BMS is operating normally). The EWMA data is then trended and stored in trend storage 919. Trend storage 919 may be a memory local to controller 902, a memory in a supervisory controller having control over controller 902, or within any other device within the BMS. Typically, the trend sample interval time for trend storage 919 is set up during system configuration and ranges from 1-60 minutes, although other interval times may also be used.

The trended EWMA data in trend storage 919 is transmitted over network 912 to outlier remover 921, which filters outliers from the data. For example, outlier remover 921 may use the GESD method, an anti-spike filter, or another method capable of removing outliers from the data. Outlier remover 921 provides the resultant data to sampler 922, which sub-samples the data to remove or reduce autocorrelation. Sampler 922 may utilize a sample interval greater than or equal to five times the time constant of the process controlled by controller 902 to sample the EWMA data, although other sampler intervals may also be used. Sampled EWMA data from samplers 922, 923 are then stored in EWMA database 924 as a history of EWMA values. In this way, EWMA database 924 may be used to train or test EWMA with a statistical process control chart.

Using EWMA database 924, the BMS may determine an analysis period or schedule and determine if training has not been performed or if retraining has been triggered (step 926). If training or retraining is necessary, the BMS may then determine if a desirable set of training data is available (step 928). For example, training sets of 150-500 data points are typically used. Other amounts of training data may also be used, so long as they provide a sufficient history of behavior of the BMS. If an insufficient amount of data has yet to be collected, the BMS may continue to collect data until reaching a desired amount.

If EWMA database 924 contains a sufficient amount of training data, the BMS may implement process 930 to define a statistical process control chart. Process 930 includes checking the autocorrelation and setting a statistical process control chart method (step 932). For example, autocorrelation may be checked by calculating a lag one correlation coefficient. If the coefficient is low, the data is not autocorrelated and an EWMA method may be used. If the coefficient is high, the data is considered to be autocorrelated and an AR method may be used. Under the AR method, an AR-one model may first be fit to the training data. The AR-res (residuals) of the AR-one model may then be used in other steps of process 930.

Process 930 is shown to include checking the data for normality (step 934). In general, normal data provides better performance than non-normal data. However, non-normal data may also be used to detect changes in the behavior of the BMS. Normality may be tested using a Lillifors test or any other normality test capable of distinguishing normal data sets from non-normal data sets.

Process 930 further includes calculating robust estimates of the target parameter ($\mu$) and the estimator of scale ($\sigma$) (step 936). In one embodiment, the target parameter is the statistical mean of the history of the EWMA. For example, the simple mean of the data may be calculated if the data is determined to be normal in step 934. In another embodiment, the median of the data is used. In a preferred embodiment, the estimator of scale calculated in step 936 is a robust estimator of scale, although other estimators may also be used. For example, robust estimators of scale having Gaussian efficiencies of about 58% or about 82% may be used.

Process 930 yet further includes calculating the control chart limits (i.e., the one or more threshold parameters) (step 938). For example, an upper control limit (UCL) may be calculated by multiplying the estimator of scale by a constant value K and adding the result to the target parameter. In another example, the product of the constant and the estimator of scale may be subtracted by the target parameter to generate a lower control limit (LCL).

Once target parameters have been established using process 930, the BMS can begin to use the generated statistical process control chart to detect changes in the behavior of the BMS. If new EWMA or AR-res values are less than the LCL or greater than the UCL, the new values are considered to be outliers (e.g., one or more statistically significant outliers) (step 940). Optionally, the BMS also determines if an excessive number of outliers have been detected (step 942). For example, the BMS may disregard one or more outliers detected in step 942 before taking further action. The number of outliers necessary before taking further action may be set manually by a user or automatically by the BMS itself. For example, the BMS may utilize data concerning the operational state of controller 902 to determine a threshold number of outliers.

If the BMS determines in step 942 that an excessive number of outliers have been detected, the BMS may present an indication to a user via a display device (step 944). Alternatively, or in addition to step 944, the BMS may take any number of other measures if a change in behavior has been detected. For example, the BMS may initiate a diagnostics routine, send a communication to a technician (e.g., email, text message, pager message, etc.), retrain the statistical model, or any other appropriate action that corresponds to the change in behavior.

Automated Fault Detection and Diagnostics Using Abnormal Energy Detection

Text above relating to FIG. 4 describes a process for using abnormal energy detection to conduct automated fault detection and diagnostics. Such systems and methods can use energy meter data (e.g., electric, gas, steam, etc.) to help detect building system or building device faults. The energy usage measurements used in automated fault detection and diagnostics can be measurements of either the total building energy usage (e.g., using whole-building meters) or energy usage for a portion of the building management system (e.g., using sub-meters). Various methods for detecting abnormal energy usage in buildings are also described by John E. Seem. See, for example, U.S. Pat. No. 6,816,811 (inventor John E. Seem) "Method of Intelligent Data Analysis to Detect Abnormal Use of Utilities in Buildings"; John E. Seem, *Pattern Recognition Algorithm for Determining Days of the Week with Similar Energy Consumption Profiles*, Energy and Buildings, vol. 37, 127-139 (2005); John E. Seem, *Using Intelligent Data Analysis to Detect Abnormal Energy Consumption in Buildings*, Energy and Buildings, vol. 39, 52-58 (2007); Seem et al., *Adaptive Methods for Real-Time Forecasting of Building Electrical Demand*, ASHRAE Transactions, pt. 1., 710-721 (1991). FIGS. 10-14 and 16 describe exemplary processes that may be conducted by an FDD layer (e.g., the FDD layer described with reference to FIG. 4) or an FDD module or modules of another building automation system controller.

Figure 10:
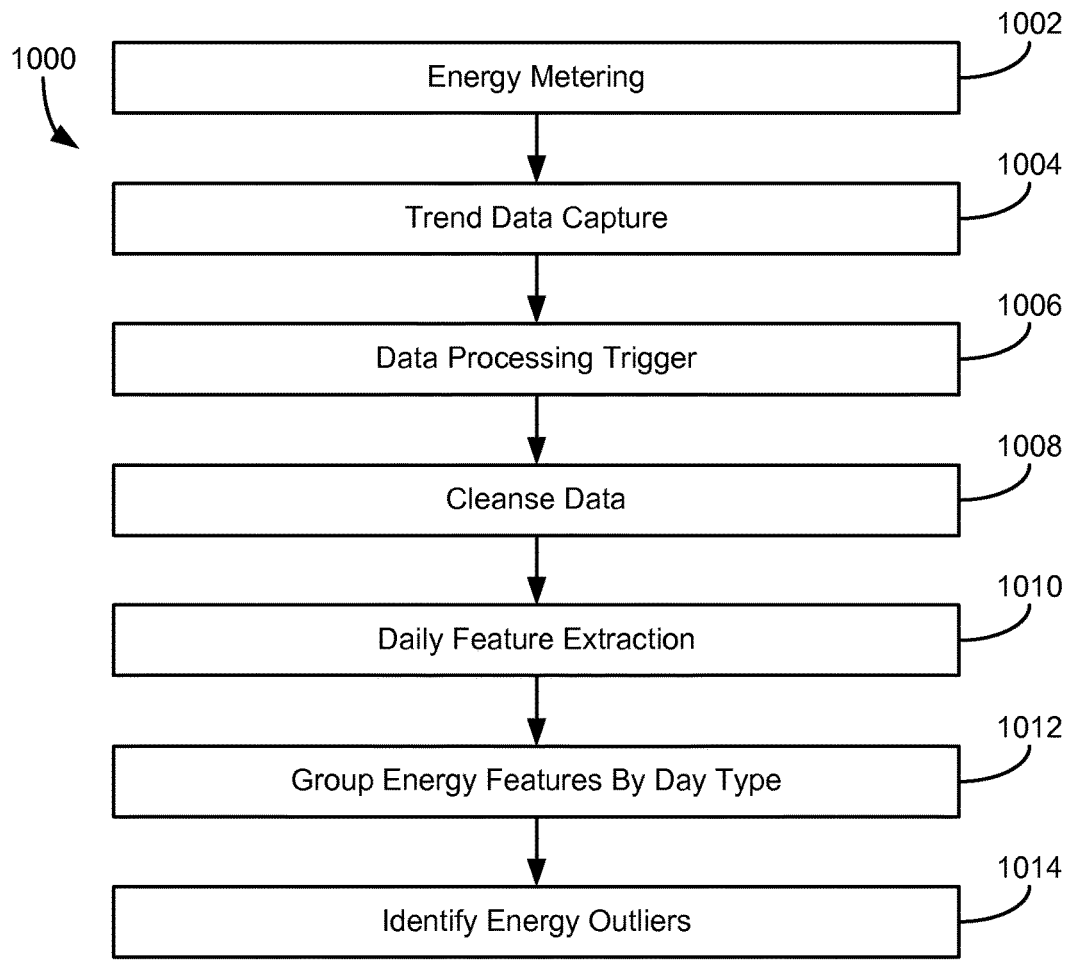
FIG. 10 is a flow diagram of a process for the identification of energy outliers, according to an exemplary embodiment.

Referring now to FIG. 10, a flow diagram of a process 1000 for the identification of energy outlier days is shown, according to an exemplary embodiment. Process 1000 includes an energy metering step (step 1002) where energy usage is measured by a meter or multiple meters. The meters measure the consumption and/or demand of an energy utility, such as electricity, gas, steam, hot water, chilled water, etc. The meters may be owned by a building owner, the utility that provides the energy utility, and/or any other entity or combination of entities. The energy measurements may be for a campus of buildings (e.g., a group of related building), an individual building, a sub-set or portion of a building, or any other aggregation or disaggregation of energy usage.

Process 1000 further includes a trend data capture step (step 1004). In step 1004, a multitude of measurements collected over time (e.g., from step 1002) are stored. The measurements are stored in an electronic storage device local to the site, remote from the site, or any combination of devices both local and remote from the site.

Process 1000 further includes a data processing trigger step (step 1006). In step 1006, a triggering action that initiates the remaining data processing steps in process 1000 is activated. The trigger may be time-based (e.g., every day at midnight or another set time, every week, every hour, etc.), user-based (e.g., by receiving an input from a user at a graphical user interface), event-based (e.g., when commanded by a utility, when an energy usage threshold is triggered, when the local storage buffer is full), or may use any other basis to initiate processing.

Process 1000 further includes a data cleansing step (step 1008). In step 1008, one or more sub-steps are taken to ensure that the data is in an appropriate form for further processing. Data cleansing may include, but is not limited to, checking for data gaps, checking for improper timestamps, checking for unreasonable values and improperly formatted values, and flagging or correcting data with these or any other problems. For example, bad data may be replaced via linear interpolation or by replacing the data with a "not a number" (NaN) value.

Process 1000 further includes calculating key values or features from the data (step 1010). Step 1010 may include, for example, a daily feature extraction (e.g., calculations for daily energy usage). In one embodiment, step 1010 includes calculating the daily energy consumption and the daily peak energy demand. In other embodiments, step 1010 can include calculating other statistics to describe daily energy use data, calculating to determine moving averages, or other calculations.

Process 1000 further includes identifying and grouping energy features by day type (step 1012). Step 1012 may include, for example, using a pattern recognition approach to identify and group days of the week with similar energy features. Step 1012 may be used to identify patterns in energy usage for analysis, as day-to-day energy usage patterns may differ significantly. For example, for many commercial buildings, the difference in energy usage between weekdays and weekends may be significant. Therefore, all weekdays may be grouped together and all weekend days may be grouped together.

Process 1000 further includes identifying energy outliers (step 1014). Step 1014 may include identifying the outliers in the daily features using the day-type groups identified in step 1012. In one embodiment, a Generalized Extreme Studentized Distribution (GESD) approach may be used for identifying energy outliers, as described in FIG. 9.

Figure 11:
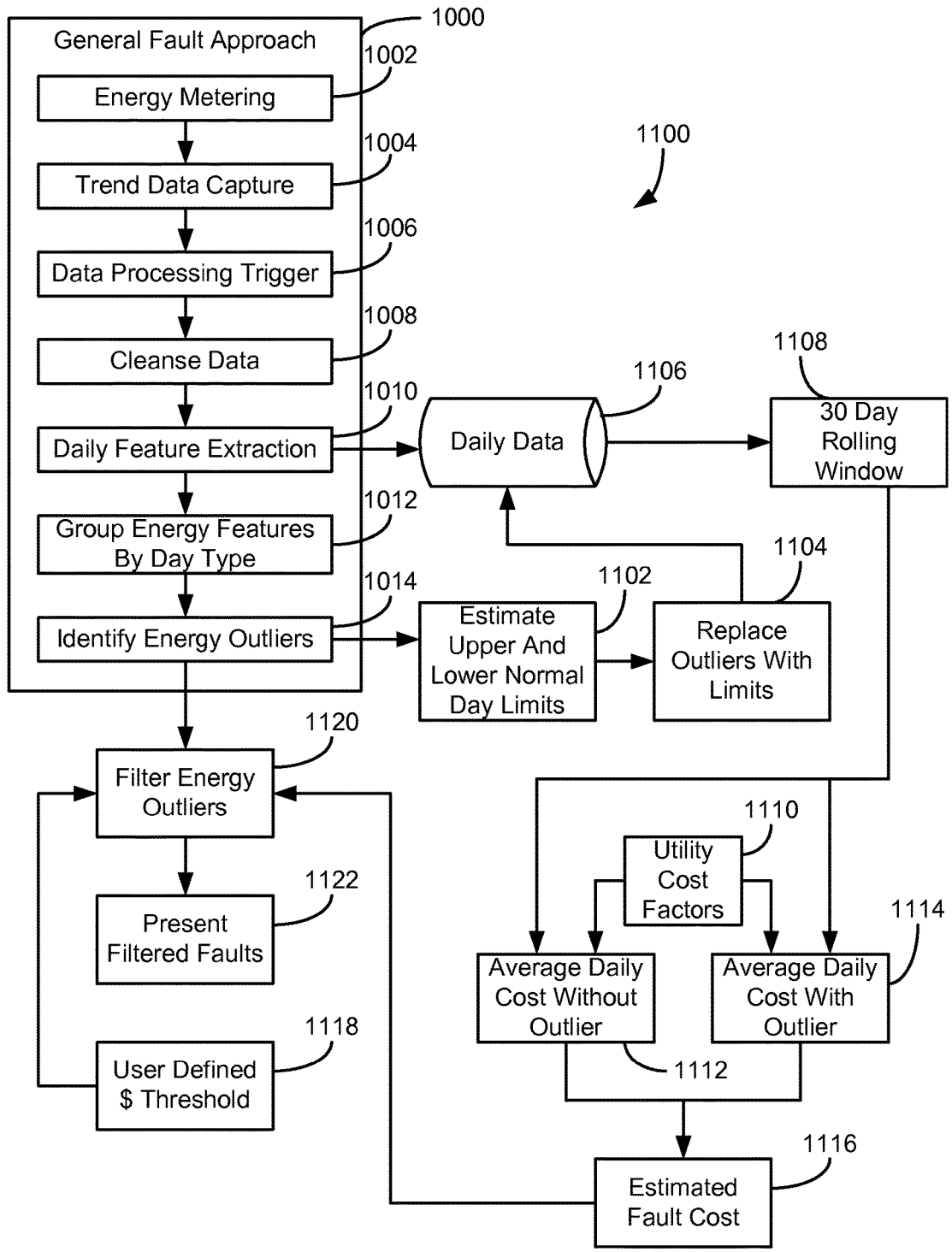
FIG. 11 is a flow diagram of a process for monetizing the potential financial impact of energy outliers and filtering the outliers, according to an exemplary embodiment.

FIGS. 11-14 represent unique extensions to process 1000. Referring specifically to FIG. 11, a flow diagram of a process 1100 for monetizing potential financial impact of energy outliers and filtering the outliers is shown, according to an exemplary embodiment. Monetization involves the calculation of the potential financial impact of each energy outlier. A filter may be applied to the energy outliers based on monetization. For example, using a default or user-defined threshold, energy outliers that do not have a significant financial impact may be filtered out before such energy outliers are presented as faults. Such a filter may advantageously minimize the total number of faults that are presented to a building manager on a graphical user interface (e.g., as shown above). Monetization may also allow a building manager to prioritize faults and corrective actions for the faults based on the estimated financial impact of the faults.

Process 1100 includes determining upper and lower limits for daily energy consumption and daily peak energy demand for an average or "normal" day (step 1102). In one embodiment, the limits are calculated using the robust mean and robust standard deviation determined in process 1000. The limits are calculated as the robust mean plus or minus a set value (e.g., two or three standard deviations). In one embodiment, a normal day is based on the average energy use or demand of a plurality of recent days of the same day-type (e.g., weekend, weekday) after removing any outlier days.

Process 1100 further includes replacing outlier values of the daily energy consumption and/or daily peak energy demand with a more reasonable or normal value from step 1102 (step 1104). For example, if an outlier value is greater than the upper normal limit determined in step 1102, the outlier value is replaced by the upper normal limit, and if the outlier value is less than the lower normal limit determined in step 1102, the outlier value is replaced by the lower normal limit.

Process 1100 further includes storing the daily features calculated in process 1200 and the replacement values calculated in step 1104 (step 1106). Storage is provided by an electronic storage device local to the site, remote from the site, or a combination of both.

Process 1100 further includes retrieving the daily data from storage and creating a set of data for each day to be analyzed (step 1108). In one embodiment, the set of data for each day to be analyzed includes the day and the 29 previous days. In other words, a 30 day sliding window of energy usage is generated. Two 30 day data sets may be created for each day, one with outliers and one without outliers included.

Process 1100 further includes defining cost factors to be used to monetize the outliers (step 1110). The cost factors may be user-defined when the software is being configured. Cost factors are required for energy consumption and/or energy demand Blended or marginal cost factors may be provided. Furthermore, in varying embodiments of the disclosure, the values used throughout the processes described herein may relate to or use a blended energy value (blend of consumption/demand) rather than one or the other.

Process 1100 further includes calculating the average daily cost using the data without the outliers (step 1112). The energy cost factors (e.g., consumption and/or demand utility rate information) are multiplied by the energy consumption and energy demand for each 30 day set of data. The resulting consumption and demand cost estimations are summed to obtain the total costs. The total costs are then divided by the 30 days to obtain the average daily cost. Each 30 day set of data is used to calculate an average daily cost, which is uniquely associated to the analyzed day (e.g., the last day of the 30 day window). In other words, every day is treated as if it were the last day of a billing period that is exactly 30 days long; an estimated utility bill is calculated for each of these billing periods and divided by 30 days to determine the average daily cost, which is associated with the last day of the 30 day billing period.

Process 1100 further includes calculating the average daily cost using the data with the outliers (step 1114). The calculation of step 1114 may be the same as the calculation in step 1112, but with the data outliers being included in the calculation.

Process 1100 further includes subtracting the average daily cost calculated in step 1112 from the average daily cost calculated in step 1114 (step 1116). The result is an estimate of the daily financial impact of the outlier.

Process 1100 further includes obtaining a user defined-threshold for a cost filter (step 1118) to which the estimate of the daily financial impact of the outlier will be subjected. The threshold may be defined during configuration or changed at anytime by a user. In other embodiments, the threshold may be adjusted automatically based on statistical confidence levels or other calculated values. The threshold for the cost filter allows a user to define the financial impact that they consider to be significant for an outlier.

Process 1100 further includes filtering the energy outliers determined in process 1000 using the user defined threshold from step 1118 (step 1120). In other words, step 1120 includes determining that an energy outlier is a fault when it exceeds a certain financial impact threshold.

Process 1100 further includes a presentation of the fault and its costs (step 1122). The presentation may be made through various graphical user interfaces, user interface "dashboards", via on-line and off-line reports, via email, text message, or via any other medium. In an exemplary embodiment, the graphical user interface formats shown above with respect to chiller energy and cost outliers may be utilized to report energy and/or cost outliers for other pieces of equipment (e.g., cooling towers, air handling units, boilers, lighting systems, etc.).

In an exemplary embodiment, the calculations of process 1100 are performed primarily by an FDD layer such as FDD layer 114 of FIG. 1A. Outputs of the fault determination, associated energy use, associated energy costs, and the like may be reported to an enterprise integration layer (e.g., layer 108 shown in FIG. 1A) for transforming such outputs into information (e.g., graphical user interfaces) for providing to a local electronic display or to a remote source such as a client running an enterprise control application 124 or a monitoring and reporting application 120.

Figure 12:
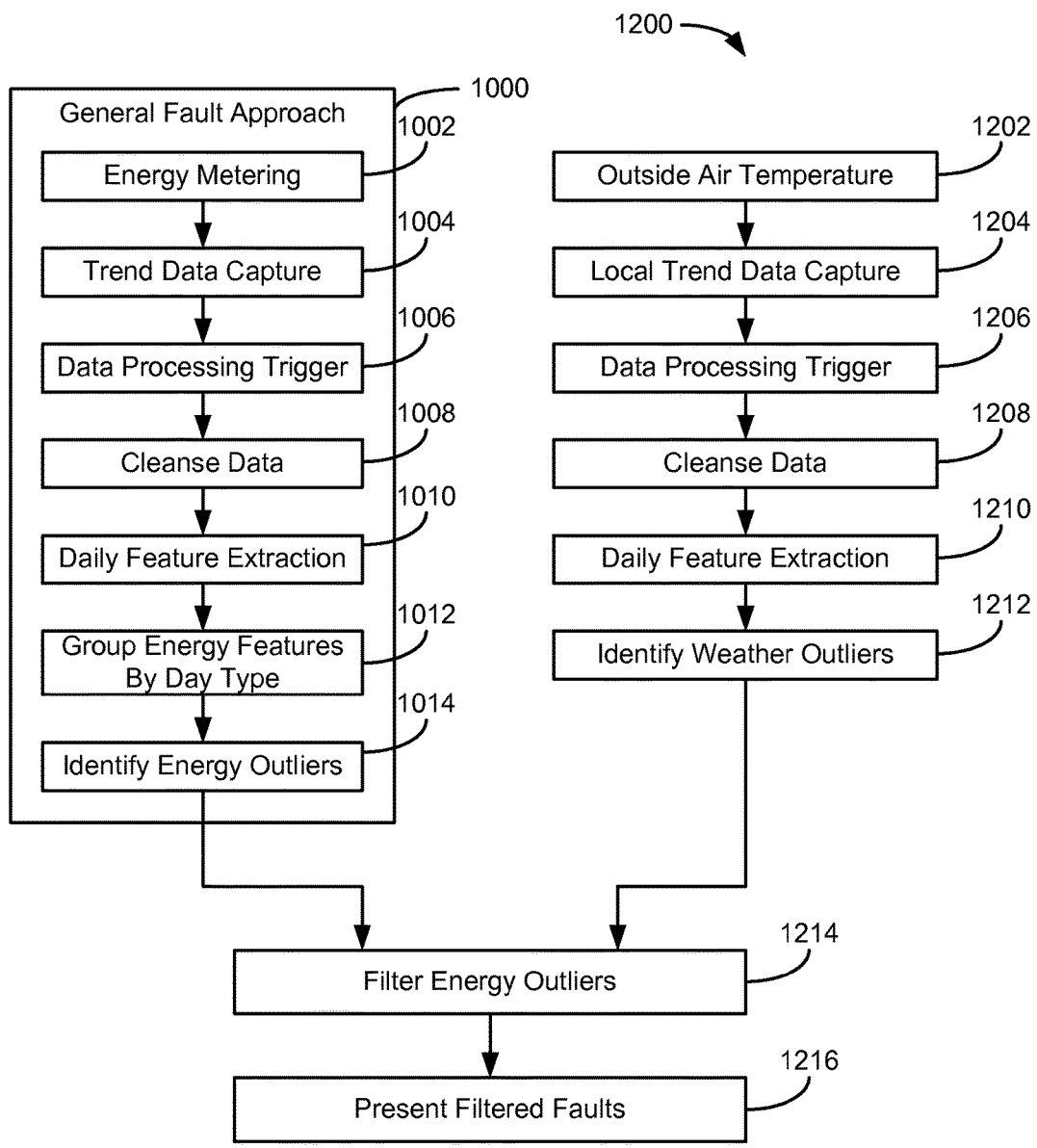
FIG. 12 is a flow diagram of a process for applying weather data in parallel to energy meter data for identifying energy outliers, according to an exemplary embodiment.

Referring now to FIG. 12, a process 1200 for identifying weather outliers and using the weather outliers to further filter energy outliers is shown, according to an exemplary embodiment. Energy usage in most buildings is correlated to weather conditions. The presence of weather outliers may result in energy outliers, which may not need to be identified as faults if the building is responding as expected to the weather. Process 1200 is shown as an extension of process 1000. Although shown separately, in some exemplary embodiments, one or more of the extensions to process 1000 may be applied together (e.g., in series or in parallel).

Process 1200 includes measuring the outside air temperature (step 1202). The measurement may be made by a local air sensor used by the building automation system or on-site weather station. In some embodiments, the outside air temperature used in process 1200 could be obtained from an external source (e.g., a weather station database maintained and operated by the U.S. National Oceanic and Atmospheric Administration (NOAA)) via communications electronics or storage media of a smart building manager. While temperature is particularly shown in FIG. 12, in other embodiments, other weather parameters may be tracked and utilized for energy outlier filtering. For example, humidity, average daily temperature, peak temperature, a blend of temperature and humidity, or any other weather describing information may be used and processed.

Process 1200 further includes storing a multitude of weather measurements over time via a local trend capture (step 1204). In an exemplary embodiment, step 1204 may be similar to step 1004 of process 1000.

Process 1200 further includes receiving a triggering action and conducting related triggering activities (step 1206) that initiate the remaining weather data processing steps in process 1200. Step 1206 may be similar to the triggering step 1006 of process 1000 (e.g., the triggering may be time-based or event-based).

Process 1200 further includes a data cleansing step to ensure that the data is in an appropriate form for further processing (step 1208). Step 1208 may be similar to the data cleansing step 1008 of process 1000.

Process 1200 further includes calculating key values or features from the weather data (step 1210). In one embodiment, the key weather features calculated may be the daily maximum temperature, the average temperature, and the minimum outside air temperature. Process 1200 further includes identifying outliers in the daily weather features calculated in step 1210 (step 1212). In one embodiment, a GESD approach may be used to identify weather outliers.

Process 1200 further includes filtering the energy outliers (step 1214) identified in process 1000 using the outliers found in step 1212. In other words, if an energy outlier occurs on the same day that a weather outlier occurs, then the energy outlier may be excluded from consideration as a fault. The use of the weather filter reduces the number of false or insignificant faults based on the assumption that the building responds to extreme weather conditions as expected and the resulting energy usage increase is unavoidable. Process 1200 further includes presenting the filtered energy outliers as faults (step 1216).

Figure 13:
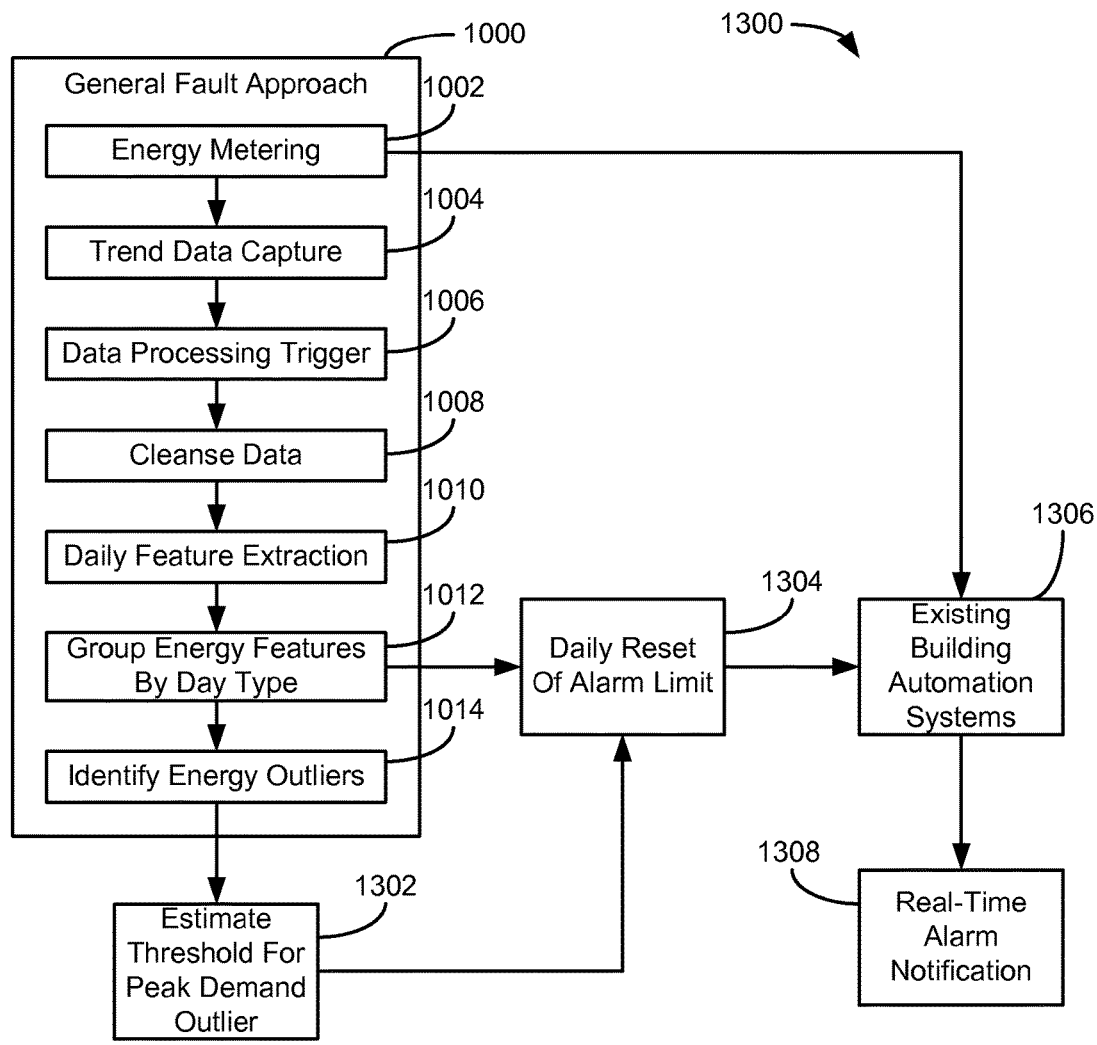
FIG. 13 is a flow diagram of a process for applying the an outlier analysis to a building automation system for real-time monitoring of energy usage, according to an exemplary embodiment.

Referring now to FIG. 13, a flow diagram of a process 1300 for applying the general outlier analysis approach of process 1000 to real-time monitoring of energy usage is shown, according to an exemplary embodiment. Process 1300 is shown as an extension of process 1000. Process 1300 is intended to provide a user or building operator an immediate notice (e.g., nearly immediate, near real-time) when a building's energy usage or demand is abnormal.

Process 1300 includes using data from the GESD outlier analysis of step 1014 of process 1000 to estimate the threshold on the daily peak energy demand that results in a day being flagged as an outlier (step 1302).

Process 1300 further includes using the threshold from step 1302 and the day-type grouping from step 1012 of process 1000 to reset or adjust the alarm limit on the energy meter point in the building automation system (step 1304). In an exemplary embodiment, the thresholds determined for the last day processed in step 1302 for each day-type group are used as the alarm limit for all future days that have the same day-type. Thresholds may be passed from step 1302 to step 1304 on a daily basis. In other embodiments, less frequent threshold estimations may be provided to step 1304.

Process 1300 further includes monitoring energy demand (step 1306). Process 1300 further includes activating a real-time alarm notification when the energy demand monitored in step 1306 exceeds the alarm limit determined in steps 1302-1304 (step 1308). Alarm notification, presentation, acknowledgement, and tracking may all be handled with the standard protocols implemented in the building automation system.

Figure 14:
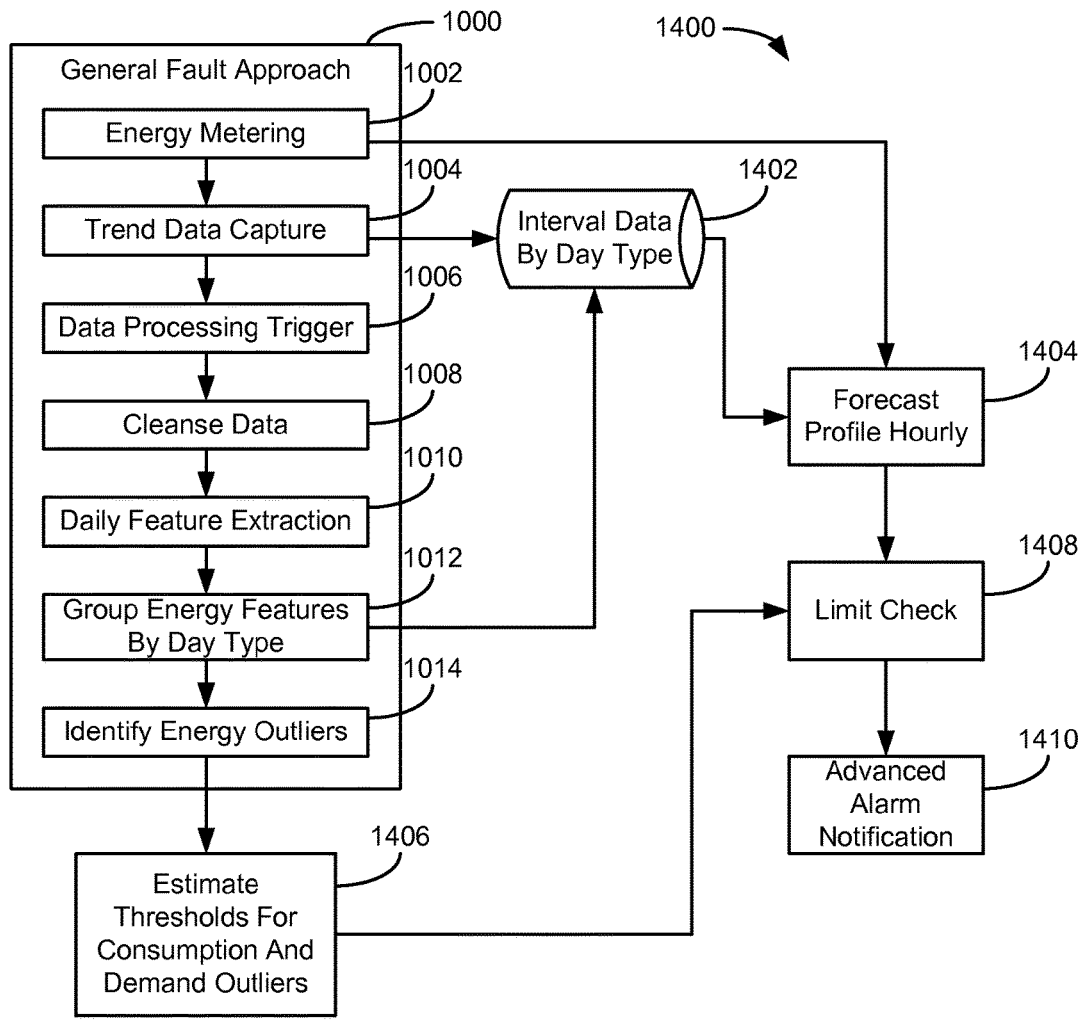
FIG. 14 is a flow chart of a process for extending the process of FIG. 13 to include proactive monitoring, according to an exemplary embodiment.

Referring now to FIG. 14, a process 1400 for pro-active monitoring of energy usage is shown, according to an exemplary embodiment. Process 1400 is shown as an extension of process 1000 of FIG. 10. Process 1400 is used to generate advanced notice of faults by predicting when a building's energy usage is likely to become abnormal. Forecasts of the hourly energy usage for the day are used with estimated outlier thresholds to predict abnormal energy usage. The pro-active notification gives operators more time to take corrective actions to reduce or eliminate additional energy usage and costs.

Process 1400 includes storing trend data and day-type information from process 1000 (step 1402). Storage is provided by an electronic storage device local to the site, remote to the site, or a combination of the two. Process 1400 further includes forecasting energy usage (step 1404). Step 1404 may be executed, for example, every hour, and may forecast the energy usage profile for the remainder of the day. In one embodiment, the forecasts are made using an approach defined by Seem and Braun in *Adaptive Methods for Real-Time Forecasting of Building Electrical Demand* (1991), ASHRAE Transactions, p. 710-721.

Process 1400 further includes using data from the GESD outlier analysis of step 1014 of process 1000 to estimate thresholds for both daily energy consumption and daily peak energy demand that results in a day being flagged as an outlier (step 1406). Process 1400 further includes using the forecasted energy profile from step 1404 and the thresholds from step 1406 to predict if and/or when energy usage is likely to be considered abnormal (step 1408). Process 1400 further includes an alarm notification (step 1410). For example, a building operation may be notified when energy usage is predicted to be abnormal (e.g., via dashboards, email, text messages, etc.).

Automated Chiller Fault Detection and Diagnostics Using Model-Based Chiller Performance Analysis Water cooled chillers represent the single largest energy consumer in many larger commercial buildings and campuses. The performance of a chiller is most commonly checked periodically (e.g., 3-4 times a year) by a mechanic as a part of routine service using manual calculations with very limited operating data.

Embodiments disclosed herein provide systems and methods for continuously and automatically evaluating chiller performance. A chiller performance model is used to detect potential faults of a chiller (e.g., a water-cooled centrifugal chiller). Significant deviation of the actual chiller performance from the modeled performance is used as a general indicator of a fault. A building operator or chiller mechanic may then perform a follow-up investigation to validate the fault, identify root causes for the fault, and to initiate repairs. The model-based approach described herein may be implemented in a chiller controller, in an FDD layer as described above, or in another system or device that is configured to retrieve data from the building automation system or chiller.

In an exemplary embodiment, a modified Gordon-Ng "grey-box" model, with parameters derived from conservation of mass and energy principles, is used to identify faults. The traditional Gordon-Ng chiller performance model (e.g., as described in J. M. Gordon and K. C. Ng, *Cool Thermodynamics* (2000)) for mechanical chillers includes several variations of the model for use with linear regression. One such form of the Gordon-Ng model was proposed for chillers in systems with variable condenser water flow rates. However, the traditional Gordon-Ng model forms did not include a version suitable for use with variable evaporator water flow rates. Applicants hereby present a modified form of the Gordon-Ng model for better predicting the performance of chillers operating with variable evaporator and/or variable condenser flow rates. This modified Gordon-Ng model may also offer improved performance for constant flow systems where the actual evaporator and/or condenser flow rates vary in practice.

In an exemplary embodiment, the modified form Gordon-Ng model is as follows: $y = a_1 x_1 + a_2 x_2 + a_3 x_3 + a_4 y_4$
where:

$$y = \frac{T_e}{T_c}\left[1 + \frac{1}{COP}\right] - 1$$

and:

$$x_1 = \frac{T_e}{Q_e}$$

$$x_2 = \frac{T_c - T_e}{T_c Q_e}$$

$$x_3 = \frac{Q_e}{T_c \dot{m}_c Cp_c}\left[1 + \frac{1}{COP}\right]$$

$$x_4 = \frac{Q_e}{T_c \dot{m}_e Cp_e}\left[1 + \frac{1}{COP}\right]$$

and:

$$a_1 = \Delta S_{int}$$

$$a_2 = Q_{leak}^{eqv}$$

$$a_3 = \frac{1}{\varepsilon_c}$$

$$a_4 = \frac{1}{\varepsilon_e}$$

and:

$$COP = \frac{Q_e}{\dot{W}_{ch}}$$

and:

$T_e$=Evaporator water inlet temperature
$T_c$=Condenser water inlet temperature
$Q_e$=Rate of energy transfer across the evaporator heat exchanger
COP=Coefficient of performance
$\dot{W}_{ch}$=Chiller power
$\dot{m}_c$=Mass flow rate of condenser water
$\dot{m}_e$=Mass flow rate of evaporator water
$Cp_c$=Specific heat of water at the condenser temperature
$Cp_e$=Specific heat of water at the evaporator temperature
$\epsilon_c$=Condenser heat exchanger effectiveness
$\epsilon_e$=Evaporator heat exchanger effectiveness
$\Delta S_{int}$=Total internal entropy production rate in the chiller due to internal irreversibilities
$Q_{leak}^{eqv}$=Rate of heat losses or gains to the chiller The above chiller model may be populated off-line with data from the manufacturer of the chiller to create a "manufacturer's baseline" model. This data can come from a manufacturer's acceptance tests, previous laboratory tests, well-controlled field tests, or from manufacturer's software. The chiller model is used to predict the performance of the chiller operating as designed.

If there is no data available from the manufacturer, then data from the actual chiller can be used to create and maintain a "best baseline" model of performance. While a "best baseline" model may be calculated in a variety of ways, in one embodiment, the "best baseline" model is identified by repeatedly comparing current chiller performance against historical performance values. Model coefficients are calculated using chiller performance parameters associated with the 'best baseline' instance of the chiller.

Figure 15:
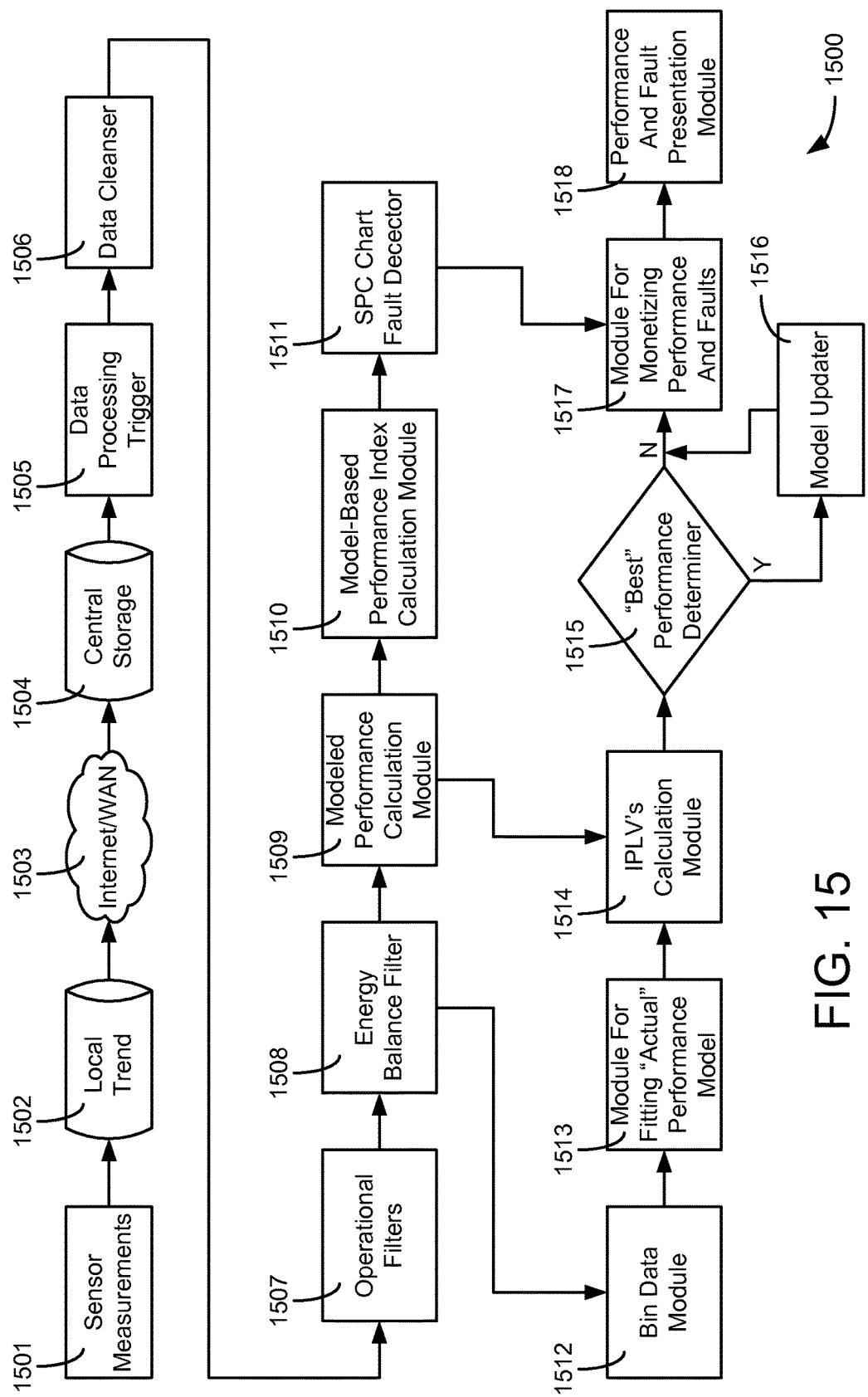
FIG. 15 is a diagram of a system for monitoring the performance of a water-cooled chiller, according to an exemplary embodiment.

As illustrated in greater detail in the diagram of FIG. 15, a system for detecting faults in a chiller may make a fault determination when the chiller's actual performance deviates significantly from the performance predicted using the "manufacturer's baseline" or "best baseline" models. FIG. 15 shows an exemplary system 1500 for monitoring the performance of a water-cooled chiller. System 1500 includes sensors 1501 configured to provide a variety of measurements. The measurements provided by sensors 1501 may include:

$T_{e,w,i}$—temperature of the water entering the evaporator of the chiller
$T_{e,w,o}$—temperature of the water leaving the evaporator of the chiller
$dP_e$—the water pressure drop across the evaporator
$T_{c,w,i}$—temperature of the water entering the condenser of the chiller
$T_{c,w,o}$—temperature of the water leaving the condenser of the chiller
$dP_c$—the water pressure drop across the condenser
$\dot{W}_{ch}$—total electric power used by the chiller The above measurements may be provided to the above-presented modified Gordon-Ng model for calculating one or more performance parameters for the chiller. As can be seen above, some chiller models (e.g., such as the above-presented modified Gordon-Ng model) calculate chiller performance using a linear regression model having coefficients calculated based on the variables of evaporator and condenser water flow rates. In exemplary embodiments of the present disclosure, pressure differential sensors are installed within the chiller to measure the water pressure drops across the evaporator $dP_e$ and across the condenser $dP_c$. The sensor readings $dP_e$, $dP_c$ are provided to a computer system (e.g., an FDD-layer of a chiller controller or a smart building manager serving the chiller controller). The water pressure readings $dP_e$, $dP_c$ are then used in estimation of the water flow rates. For example, the mass flow rate of the condenser water ($\dot{m}_c$ of the above model) may be estimated using a proportional relationship between the condenser pressure drop and the condenser flow rate raised to a power determined by testing (e.g., manufacturer tests, on-side tests, exponents estimated to be a reasonable default, etc.). Likewise, the mass flow rate of the evaporator water ($\dot{m}_e$ of the above model) may be estimated using a proportional relationship between the evaporator pressure drop and the evaporator flow rate raised to a power determined by testing.

In other embodiments, the evaporator and condenser flow rates $\dot{m}_e$, $\dot{m}_c$ are measured directly with flow meters.

The sensors 1501 used for the measurements can be factory mounted, field installed, or some combination thereof. The sensors can provide data to the chiller's control panel directly, to a building automation system (e.g., smart building manager), or to any electronic hardware or systems for measuring the points.

The measurements provided from sensors 1501 are shown as stored in local trend data 1502 (e.g., within a data server local to the chiller, within a chiller controller's storage). The data can be stored in memory or a database that is part of the building automation system or within any other system configured to store sensor data. The trend sampling interval times may be set during the system configuration. The trend sampling times, for example, may range from one to fifteen minutes. Shorter or longer sampling times may be set depending on the dynamics of the system. The trend sampling times may be changed post system configuration.

A network 1503 (e.g., Internet, WAN) may communicably couple the local trend data 1502 and central storage 1504. Central storage 1504 and the downstream modules shown in FIG. 15 may form a part of an FDD layer as described in previous Figures. In other embodiments, central storage 1504, data processing trigger 1505, and/or data cleanser 1506 are external of the FDD layer and are otherwise located. Data processing trigger 1505 initiates the downstream components (e.g., data cleanser 1506, operational filters 1507, etc.) to proceed with processing data in the central storage 1504. Data processing trigger 1505 can be time-based (e.g., run every day, run every week, etc.) be condition-based (e.g., run based on an out-of-bounds temperature, run based on an out-of-bounds energy use detection), or can be user triggered (e.g., require that the user press a button to initiate further processing). Data processing trigger 1505 can also receive and respond to 'push' analysis commands from the chiller itself in response to simple thresholds or other activities of the chiller controller.

Data cleanser 1506 is configured to conduct processing to place data in a better form for further processing. Such processing may include, for example, checking for data gaps, checking for improper timestamps, checking for unreasonable values, and flagging for correcting data with these or any other data problems.

Operational filters 1507 can use the information output by data cleanser 1506 (e.g., use the flagging created by data cleanser 1506) to remove or replace sets of data. Operational filters 1507 can also use feedback from the chiller itself (e.g., data regarding when the chiller was shut down, operating with power below normal operating levels, operating with an evaporator cooling load below minimum load conditions, etc.) to remove sets of data. Operational filters 1507 may include additional filters for removing sets of data that include bad readings or that represent unrealistic or questionable operating conditions.

Energy balance filter 1508 removes sets of data that do not reasonably satisfy an overall energy balance of the chiller. Accordingly, the overall energy balance of the chiller is used to filter the data output from filters 1507. The energy balance may be used as an indicator of data quality, an indicator of sensor faults, or a pseudo steady-state detector. Steady-state detection may be important as many chiller models will not be accurate in less than a steady-state (or near steady-state). Therefore, energy balance filter 1508 helps remove data sets with bad data or data sets associated with the chiller not operating in steady-state (or near steady-state) conditions. In alternative embodiments, approaches other than evaluating energy balance may be used for steady-state detection.

Modeled performance calculation module 1509 calculates performance using one or more of the stored models (e.g., a Gordon-Ng linear regression model), and the current data cleaned by data cleanser 1506, operational filters 1507, and/or energy balance filter 1508.

If a manufacturer's baseline model is available, then modeled performance calculation model 1509 uses the manufacturer's baseline model to predict the performance of the chiller operating under an assumption that it was new and under the current operating conditions (e.g. $T_{c,w,i}$, $T_{e,w,o}$, $Q_e$). As explained above, a "base baseline" model may also or alternatively be used to predict the performance of the chiller operating under the current operating conditions but at peak historical performance.

Model-based performance index calculation module 1510 calculates a performance index for the chiller. In an exemplary embodiment, the performance index may be calculated by finding the difference between the actual chiller performance and the model-predicted performance. In an exemplary embodiment, power is used to gauge chiller performance and the performance index is calculated as the actual chiller power minus the model-predicted power.

The statistical process control (SPC) chart fault detector 1511 uses a history of the performance index and the newly calculated performance index to identify chiller faults. Faults are detected by detector 1511 when the chiller's actual performance deviates significantly from the predicted performance (e.g., predicted using the "manufacturer baseline" or "best baseline"). The SPC chart fault detector 1511 uses a statistical process control chart method to identify chiller faults. In an exemplary embodiment, an EWMA control chart method is conducted on an EWMA of the error between the actual and predicted performance. In other words, detector 1511 compares the exponentially weighted moving average of the error between actual and expected chiller performance to a threshold (e.g., calculated as described above). The detector 1511 determines whether to identify the error as associated with a chiller fault based on whether the exponentially weighted moving average exceeds the threshold. In other embodiments, statistical process control chart methods other than an EWMA method may be used to identify performance outliers inferred to represent chiller faults.

Bin data module 1512 reduces the input data using a binning approach to provide more uniform sets of data for comparison. The data binning approach is intended to improve the predictive capabilities of chiller models created using chiller data. Particularly, the approach is intended to reduce the effect of non-linearities in chiller performance that could lead to model biases. In an exemplary embodiment, bin data module 1512 completes the following steps for any given set of chiller data:

(a) finds a minimum and maximum value for each key sensor point used by the model;

(b) divides the range of values between the minimum and maximum value into a number of discrete segments (i.e., bins);

(c) sorts every data set from the analysis period into a single bin of the created plurality of discrete bins;

(d) for each bin, finds a single point (e.g., median point, mean value, etc.) to represent all of the points in the bin;

(e) the selected single point is used as the chiller data for the period of time associated with the bin.

Using such a process, bin data module 1512 can have the effect of making the chiller data selected for further analysis become more uniform and representative of the chiller data without non-linearitities.

The module for fitting actual performance data 1513 fits a model to the chiller data output by bin data module 1512. In an exemplary embodiment, the Gordon-Ng model modified for variable evaporator and condenser flow rates (presented above) is fit to the data using linear regression. In an alternative embodiment, a step-wise regression is used to find the best form of the model. In yet other embodiments, non-linear regression is used to fit more complex models. The model fit to the actual data may be called the "actual" model. The "actual" model may be used to calculate various normalized metrics and compared to other models or metrics.

IPLV calculation module 1514 calculates the integrated part-load value (IPLV) as defined by ASHRAE Standard 550/590 using each of the chiller models. The IPLV is a normalized metric that is used in the chiller industry for making comparisons between chillers. The IPLV provides a single value descriptive of performance versus a curve or family of curves. Because of the single value property of the IPLV, the IPLV can be used for a quick comparison of chiller performance. For example, the IPLV may be used to compare the actual chiller's performance against new chillers to justify a chiller retrofit. Over time a chiller's overall condition varies significantly as faults arise and faults are corrected. The IPLV computed from the actual model may be used to identify the "best baseline" performance achieved by the chiller. The "best baseline" model is stored and used for future fault detection and performance reporting. The "best baseline" model may be used as an alternative to the "manufacturer's baseline" model. For older chillers, data may not be available for creating a "manufacturer's baseline" model. Although the "best baseline" model may initially be based on a chiller with faults, as faults are corrected over time, the "best baseline" model may provide a reasonable performance target. In an exemplary embodiment, IPLV calculation module 1514 calculates an IPLV for the actual performance model and stores an IPLV previously calculated for a "best" performance model currently in use by modeled performance calculation module 1509.

Best performance determiner 1515 uses the IPLV(s) determined by IPLV calculation module 1514 to check the performance of the current chiller against the performance of the chiller during all previous analysis periods (or relative to the previously determined 'best' as in-use by modeled performance calculation module 1509). If the current performance is deemed to be the best, the current 'best baseline' model is replaced by the actual model, using model updater 1516. The new 'best baseline' model may thereafter be used by modeled performance calculation model 1509. In an exemplary embodiment, best performance determiner 1515 selects the model having the highest IPLV of the coefficient of performance (COP) as having the best performance. In another embodiment, best performance determiner 1515 integrates the COP vs. evaporator load curve to find a performance metric for comparison. In another embodiment, a load weighted-average COP is calculated using actual operating conditions.

The module for monetizing performance and faults 1517 is configured to monetize the actual chiller's performance and potential faults. An electric rate schedule is applied to the actual chiller power data to monetize actual performance of the chiller. The electric rate is also applied to the predicted power using the "manufacturer's baseline" or "best baseline." If a fault is identified by SPC chart fault detector 1511, then the difference between costs using the actual power and the costs using the predicted power provides an estimate of the fault costs.

In an exemplary embodiment, chiller faults are monetized using blended consumption ($/kWh) and demand (e.g., $kW) cost factors. These factors may be computed from the most recent year of utility bills. These cost factors may be applied to the energy consumption and demand calculated over a defined period (e.g., a calendar month) using the actual performance data and the predicted performance using the manufacturer's baseline or best baseline models.

Performance and fault presentation module 1518 may present the information calculated or obtained by the various prior modules of FIG. 15. The presentation module 1518 may cause graphs, summaries, reports, graphical user interfaces, interactive interfaces, or other presentations of information to be displayed to building operators or owners (e.g., via one or more client devices). Such presentations may include dashboard views, e-mail summaries, text message alerts, or other reports.

Fault Management Systems and Methods

Figure 16:
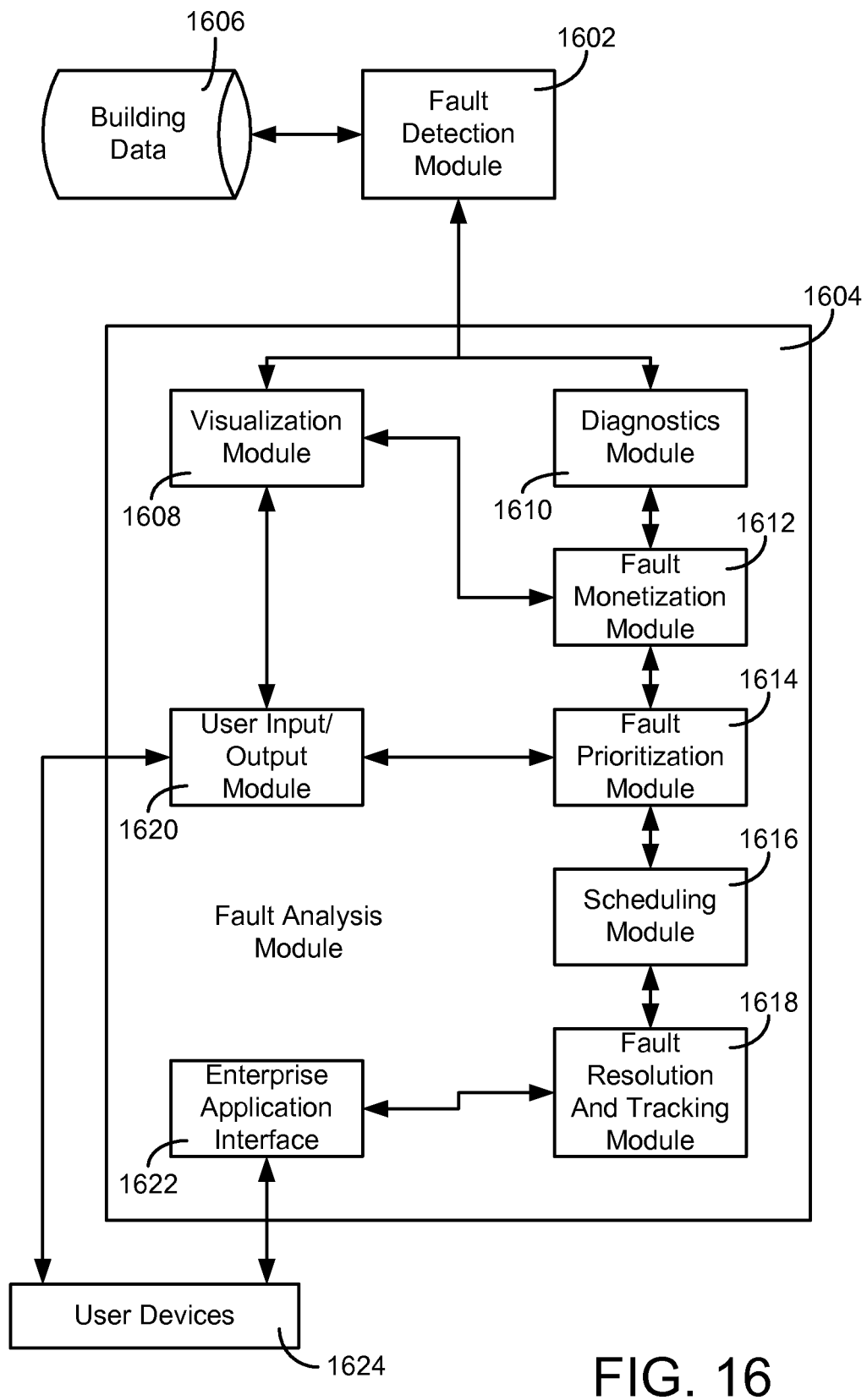
FIG. 16 is a block diagram of a fault detection module and fault analysis module, according to an exemplary embodiment.

Referring now to FIG. 16, a block diagram of a fault detection module 1602 and fault analysis module 1604 is shown, according to an exemplary embodiment. Fault detection module 1602 receives data from building data 1606 and conducts fault detection methods as generally described in the present disclosure. In an exemplary embodiment, the components of FIG. 16 may be implemented within an FDD layer (e.g., an FDD layer as described with reference to FIG. 1) of a smart building manager.

Fault detection module 1602 provides fault information to fault analysis module 1604. Fault information may include statistical outliers indicating the presence of a fault, a magnitude of the fault (e.g., how severe the fault is) and other fault properties. Fault analysis module includes a diagnostics module 1610 configured to receive fault information. Diagnostics module 1610 is configured to identify a root cause for the fault based on fault information. Diagnostics module 1610 may further determine critical or enhanced data or information related to the fault.

Diagnostics module 1610 provides the root cause information to a fault monetization module 1612. Fault monetization module 1612 is configured to determine a cost associated with the fault (e.g., how much the fault is costing the owner of the building). The cost may be in terms of dollars, energy use, or any other type of metric. Fault monetization module 1612 may provide the cost information to visualization module 1608 for display to a user.

Fault cost information from fault monetization module 1612 is provided to a fault prioritization module 1614. Fault prioritization module 1614 is configured to use the fault cost information to prioritize between two or more faults. For example, the fault with the higher cost may be given a higher priority (e.g., the fault may be listed first in a report or display, the fault may be presented to the user before the other fault, etc.). After determining fault priority, scheduling module 1616 is configured to generate a schedule for addressing the prioritized faults. Scheduling module 1616 may, for example, create a maintenance schedule for inspecting and fixing faults in the building. The schedule may be based on faults that have a higher priority or cost.

The schedule for resolving faults is provided to a fault resolution and tracking module 1618. Fault resolution and tracking module 1618 is configured to verify if a fault was fixed and if the fix was effective. Fault resolution and tracking module 1618 may conduct the check when the schedule indicates that the fault resolution should have occurred. Fault resolution and tracking module 1618 may further include and maintain information about a fault life timeline. For example, if a fault resolution is only expected to last for a period of time, or if a maintenance schedule should be associated with a fault resolution, module 1618 may keep track of such information and conduct checks when necessary. Fault resolution and tracking module 1618 may further generate reports related to the tracking of fault resolutions. The reports may include cost information (e.g., money saved by conducting the fault resolutions). These reports may be provided to user devices 1624 via an enterprise application interface 1622.

Visualization module 1608 is configured to receive fault information (e.g., the magnitude of the fault, a cost associated with the fault) from various modules and may generate a user interface for providing to an electronic display or remote device. The graphical user interface may include the number of faults, the number of faults relative to the total data (e.g., a percentage or ratio of faults compared to non-faulty equipment), and other fault information. For example, the severity of a fault may be detailed, the cost of the fault may be detailed, etc. The faults may be grouped by type of fault, equipment involved in the fault, cost or severity of the fault, etc. As shown in FIG. 16, the graphical user interface may be provided from visualization module 1608 to user devices 1624 via user input/output module 1620. Illustrations of possible exemplary user interfaces are contained in FIGS. 17A-17e.

Graphical User Interfaces for Automated Fault Detection and Diagnostics

Referring to FIGS. 17A-E generally, various exemplary graphical user interfaces that may be generated via step visualization or user input/output steps of the various processes described herein are shown. For example, the graphical user interfaces of FIGS. 17A-E may relate to output from block 1608 of FIG. 16, step 1018 of process 1000, block 944 of FIG. 9, step 1122 of FIG. 11, step 1216 of FIG. 12, step 1308 of FIG. 13, step 1410 of FIG. 14, block 1518 of FIG. 15, or other user interface or presentation blocks/steps of the present application. It should be appreciated that the exemplary user interfaces of FIGS. 17A-E are not intended to limit the output that can be provided by the processes/blocks of FIGS. 1A-16, but rather are intended to describe varying graphical user interface embodiments or inventions that may be claimed in this or another matter.

Figure 17A:
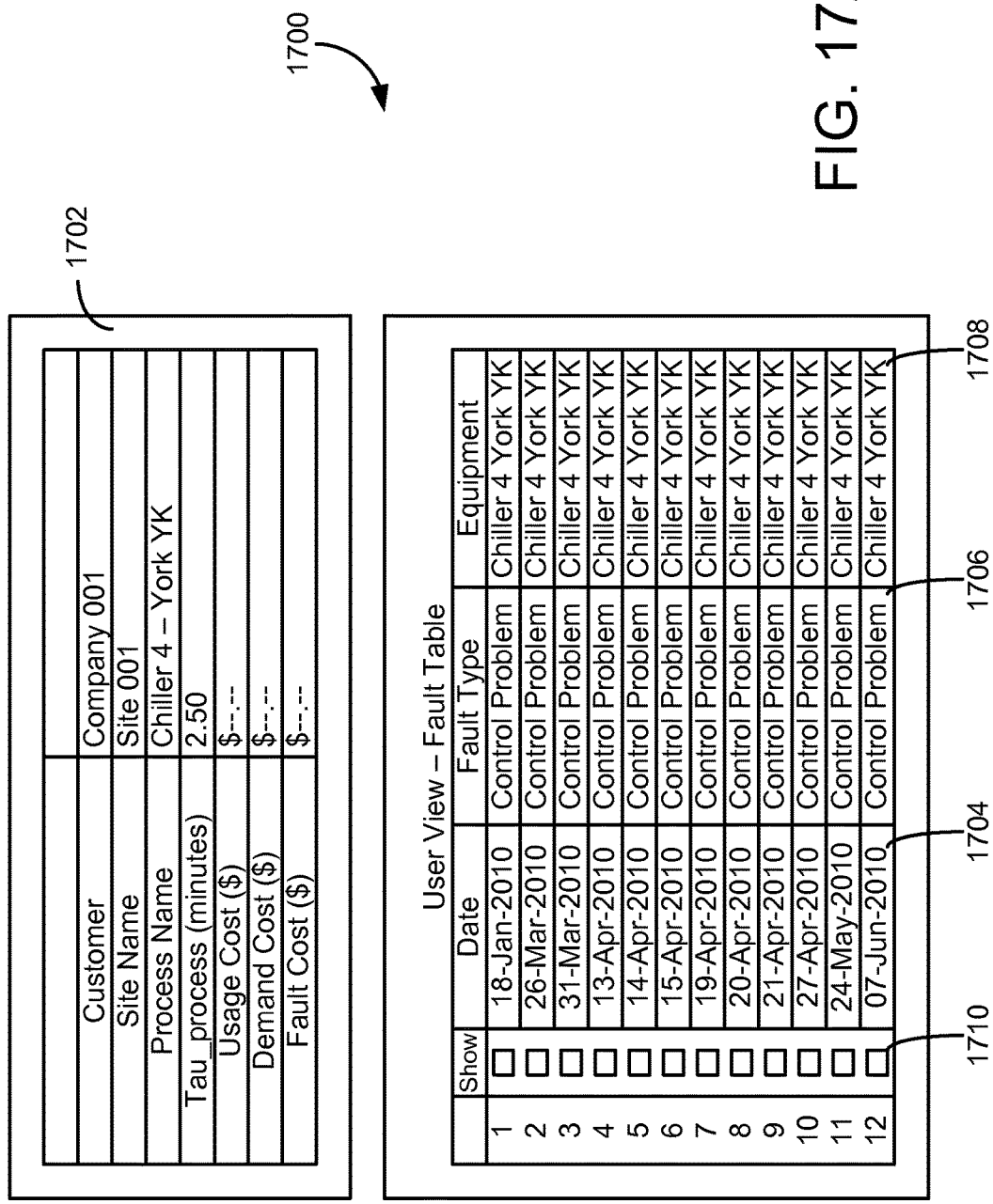
FIG. 17A is a graphical user interface for displaying detected chiller faults, according to an exemplary embodiment.

Referring now to FIG. 17A, a report such as table 1700 may be generated for display to a user of a building, according to an exemplary embodiment. Table 1700 may be a report generated upon user input or request or may be automatically transmitted to a remote user device when generated when faults are detected. Table 1700 may display faults for a building, faults related to a specific area, faults related to a particular piece of equipment (e.g., chiller) or building subsystem, faults related to a particular tenant, fault type, or otherwise.

In the embodiment of FIG. 17A, table 1700, and particularly form 1702, identifies that faults for a specific customer's process at a site. For a customer "Company 001" and site "Site 001", all faults related to a process "Chiller 4—York YK" are shown in table 1700. Table 1700 is further shown to display usage cost, demand cost, and fault cost calculated to be associated with the chiller (e.g., using the processes described above).

Table 1700 is shown to include rows of fault information (e.g., as detected using the processes described above). Table 1700 includes column 1704 for the date of the fault, a column 1706 for the fault type, and a column 1708 for the equipment associated by the fault (e.g., affected by the fault or causing the fault). The user may click a checkbox 1710 to hide a fault or to select a fault for analysis.

Figure 17B:
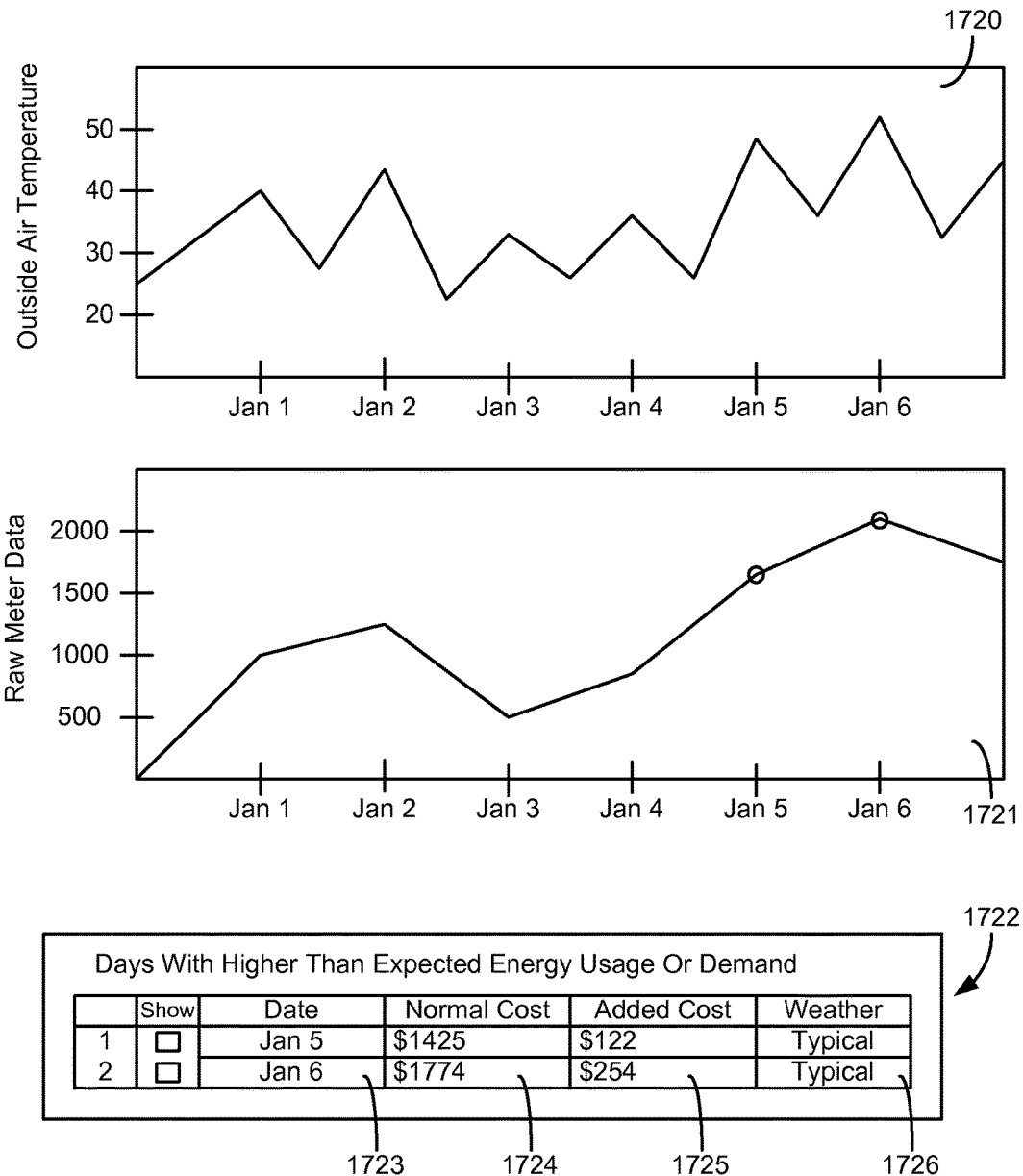
FIG. 17B is a graphical user interface for displaying detected chiller parameters and faults in a building, according to an exemplary embodiment.

Referring now to FIG. 17B, another embodiment of a graphical user interface that may be provided to a local display or remote user device is shown, according to an exemplary embodiment. The graphical user interface of FIG. 17B includes two graphs 1720, 1721 that illustrating outside air temperature and raw meter data for a collection of days. Graph 1720 shows outside air temperature information over a period of days and graph 1721 shows energy usage information over the period of days. By viewing the display of FIG. 17B, a user may visualize detected faults relative to the outside air temperature and the energy usage data (e.g., to obtain context for the estimated faults). The graphical user interface of FIG. 17B additionally includes a table 1722 including fault details.

Table 1722 includes a column 1723 for the date of the fault. Table 1722 also includes a column 1724 showing a normal cost associated with energy usage for a given day. The normal cost may be determined or calculated based on past history of energy usage for a given day or time period, based on expected cost given the weather conditions, or on a combinations of factors. Table 1722 also includes an added cost column 1725 showing the added cost (actual minus expected). For example, for the first fault listed, the cost of energy usage was $122 above normal cost. If the added cost is inferred to be attributed to a fault, column 1725 allows the user to view the cost associated with a fault. Table 1722 further includes a weather column 1726 which may provide the user with weather condition information which may have affected the energy usage. The information in columns 1724-1726 may be generated using the same data behind graphs 1720, 1721. Automated FDD methods for evaluating the effects of weather on energy usage is described in greater detail in FIG. 12.

Referring further to FIG. 17B, indicia such as the circles at the peaks of the meter data for January 5 and January 6 can graphically identify detected faults. The system may be configured to allow the user to select or click on the indicia to obtain more information about the fault (e.g., the cost attributed to the fault). For example, in response to a user click on the circles identifying fault days January 5 and January 6, more information regarding the faults and their magnitude (e.g., with an indication of added cost, with an indication of distance from an expected value or line, with data influencing the fault determination, etc.) may be popped up or otherwise shown on a graphical user interface (e.g., table 1722 may pop-up in response to a click on one of the circled faults). Advantageously, by providing fault indicia, temperature data, and meter data on the same graphical user interface, a user may be able to determine whether the faults are true or false positives. In the example of FIG. 17B, a user might be able to see that while weather was described as "typical" the peaks associated with the January 5 and January 6 "faults" could be attributed (at least in part) to higher than average temperatures. Furthermore, it should be appreciated that FIG. 17B provides an example of a graphical representation of fault day identifications relative to non-fault day identifications.

In the tables of FIGS. 17A-B, the columns of the graphical user interfaces may be sortable by a user. For example, a user may sort the faults based on the cost associated with the fault, a date or timestamp of the fault, the type of fault, or another property.

Figure 17C:
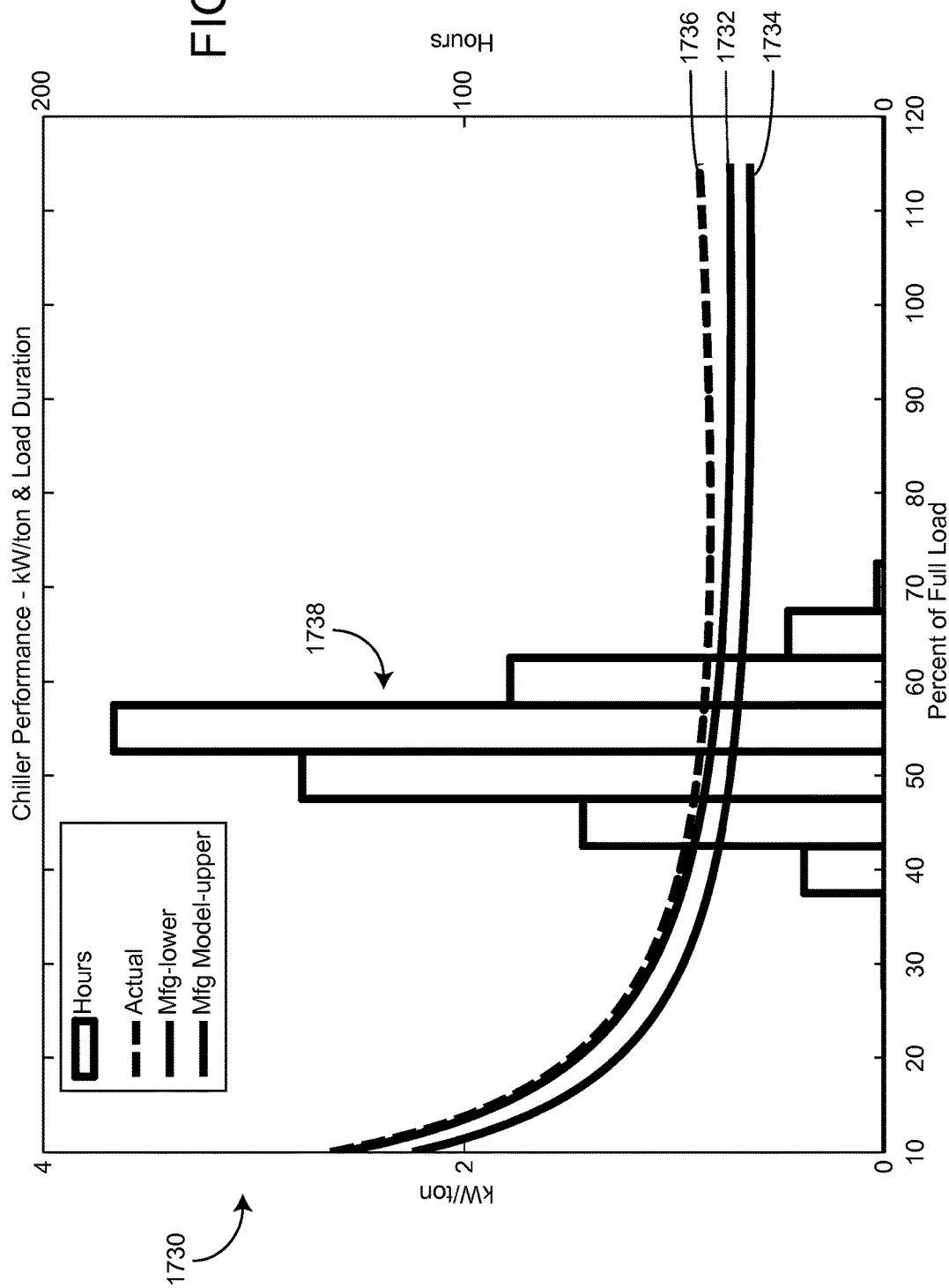
FIG. 17C is a graphical user interface for displaying detected chiller parameters and faults in a building, according to an exemplary embodiment.

Referring now to FIG. 17C, an exemplary graphical user interface displaying chiller performance is shown. Graph 1730 includes showing an upper limit 1732 and lower limit 1734 of manufacturer-estimated chiller performance described in terms of kW/chiller ton relative to percentage of full load. Graph 1730 further shows actual chiller performance 1736 relative to percentage of full load. Since actual energy usage 1736 falls outside of the bounds formed by the upper limit 1732 and lower limit 1734, an FDD system for a user may determine that there is a fault. An FDD system may determine the cost of the fault and report it (e.g., using a table as shown in FIGS. 17A/17B).

Graph 1730 further includes a bar graph 1738 descriptive of actual chiller use. Bar graph 1738 shows for how long (in terms of hours) a chiller was operating at a given percent of full load. For example, in the embodiment of FIG. 17C, the chiller operates for approximately 175 hours at 55% capacity, approximately 75 hours at 60% capacity, and so forth. Bar graph 1738 may be used in conjunction with the actual energy usage information displayed in graph 1730 to determine context for disparities between actual to manufacturer-predicted performance. For example, if the chiller had operated at or near 100% capacity at any time and graph 1730 indicates a fault based on limits 1732, 1734 and energy usage 1736, the user might be able to predict that chiller performance was impacted by less than optimal use of the chiller, not by a problem with the chiller. As another example, if the chiller had operated at a normal capacity (e.g., as shown in FIG. 17C, the chiller mostly operated at around 50-60% capacity) and graph 1730 indicates a performance disparity, then the user may determine that a fault exists that can be optimized. By viewing FIG. 17C a user may advantageously be able to view the magnitude of the faulty performance or actual performance relative to expected values (e.g., manufacturer provided thresholds).

Figure 17D:
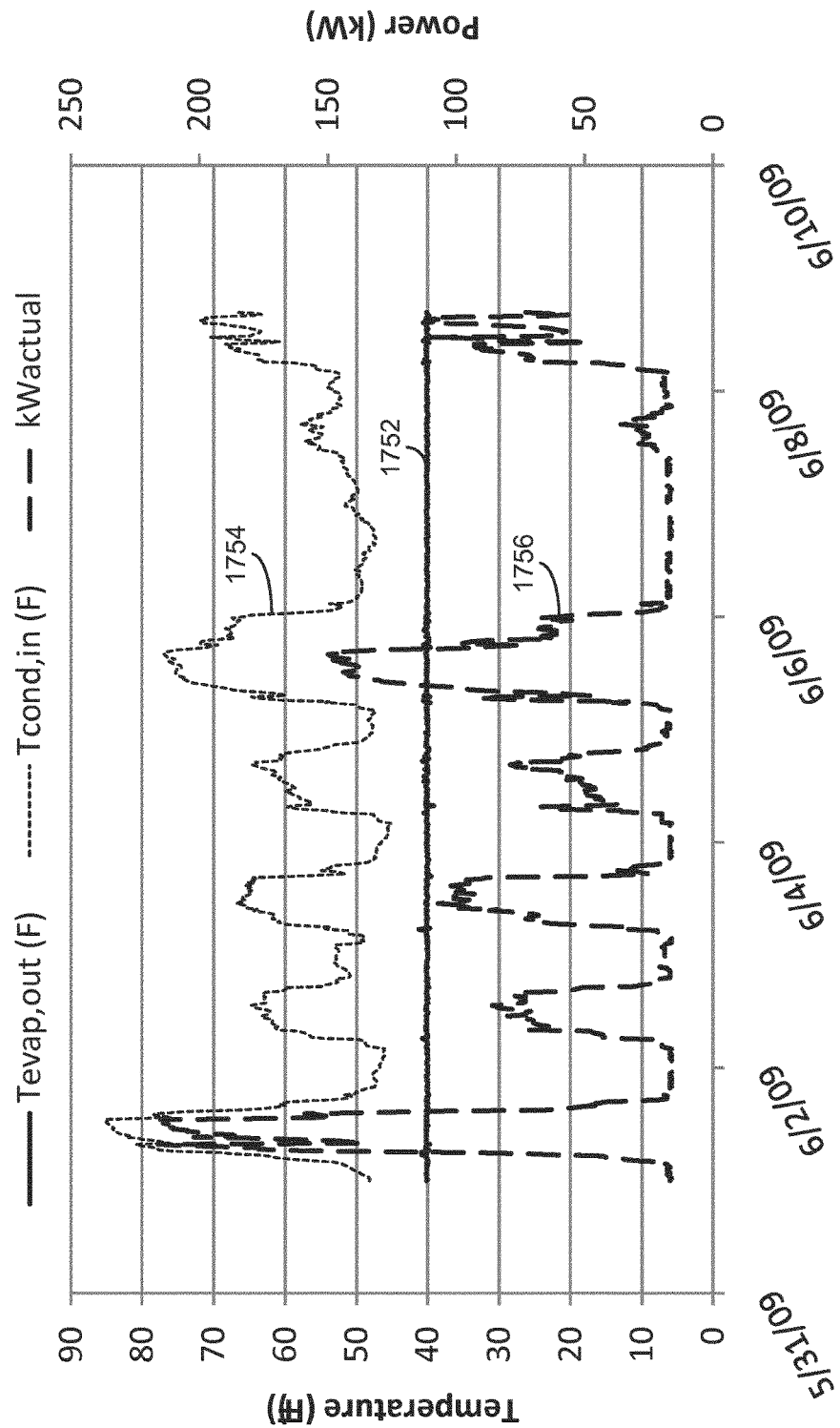
FIG. 17D is a graphical user interface for displaying detected chiller parameters and faults in a building, according to an exemplary embodiment.

Referring now to FIG. 17D, an exemplary graphical user interface showing raw data used for use in fault detection is shown, according to an exemplary embodiment. In the embodiment of FIG. 17D, graph 1750 illustrates chiller energy usage. Graph 1750 includes a plot 1752 of the temperature of the water leaving the evaporator of the chiller (e.g., $T_{e,w,o}$) and a plot 1754 of the temperature of the water entering the condenser of the chiller (e.g., $T_{c,w,i}$). Plot 1756 illustrates the energy usage of the chiller during times associated with plots 1752, 1754. According to various embodiments, other plots relating to building properties may be presented (e.g., a plot of outside air temperature that may be used to view how outside temperature is affecting chiller energy usage). FIG. 17D may be displayed by a presentation module in response to a user clicking on an identified fault in a first graphical view (e.g., after clicking on an aspect of FIG. 17C, etc.). Therefore, an aspect of the presentation modules described herein may be to provide a user with the ability to "drill down" into the data behind a fault with mere clicks on user interfaces that first identify the fault to the user.

Figure 17E:
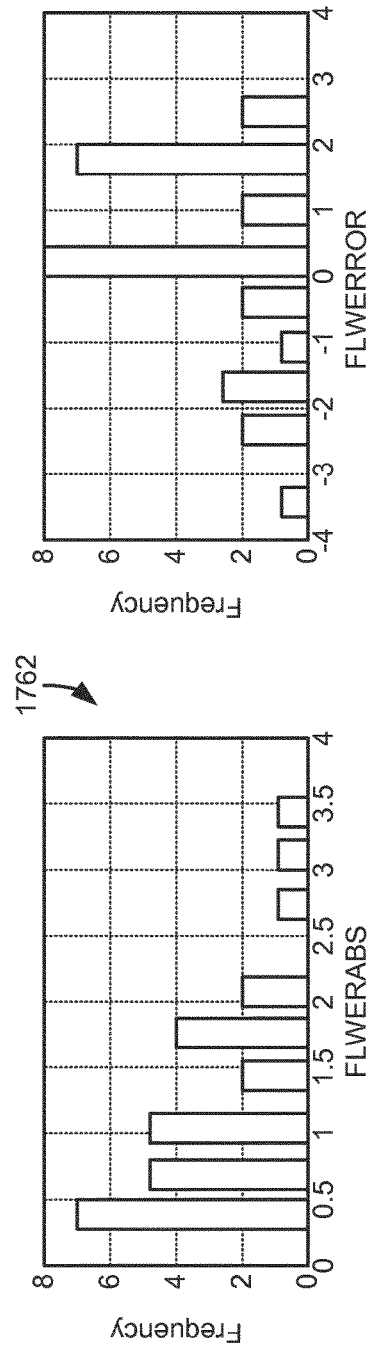
FIG. 17E is a graphical user interface for displaying detected chiller parameters and faults in a building, according to an exemplary embodiment.
Figure 17E:
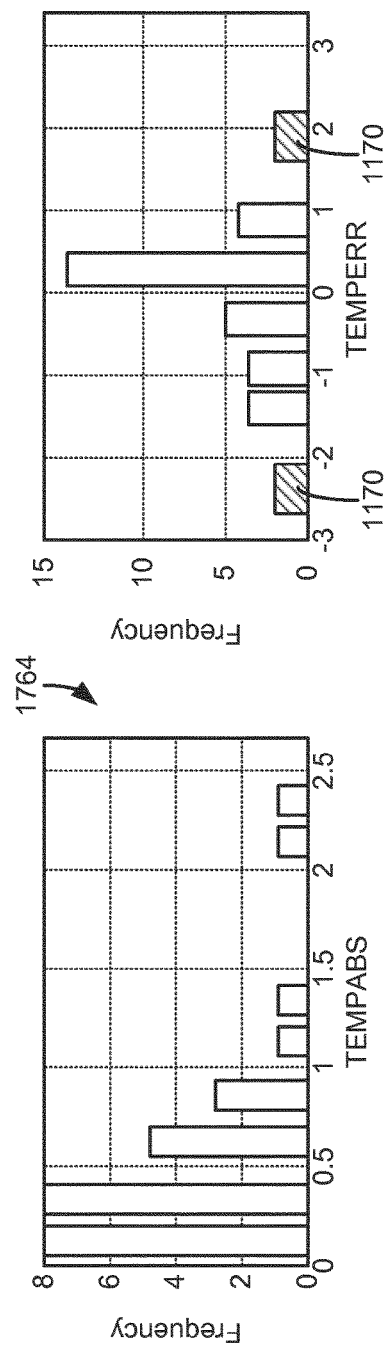

Referring now to FIG. 17E, another exemplary graphical user interface for reporting building equipment energy outliers is shown, according to an exemplary embodiment. The graphical user interface includes a table 1760 that is configured to show statistical outliers. Table 1760 includes data values for describing the data and/or statistical outliers. In the illustrated example, table 1760 includes four values: FLWERABS (an absolute value of a flow error), FLWERROR (an actual flow error), TEMPABS (an absolute value of a temperature error), and TEMPERR (an actual temperature error). Table 1760 includes further information relating to the statistical outliers such as the campus, building, floor, or other location where the statistical outliers were observed, a system and name of the system or other equipment associated with the statistical outliers, and a date and time stamp.

The graphical user interface of FIG. 17E further includes various plots for the error values. Plot 1762 plots the FLWERABS values against frequency, plot 1764 plots the TEMPABS values against frequency, plot 1766 plots the FLWERROR values against frequency, and plot 1768 plots the TEMPERR values against frequency. For values for which determined to be associated with a fault, the plot may be highlighted. For example, bars 1770 are shown highlighted and show the user that the highlighted values are associated with a fault. The user may click on shaded bars 1770 to receive further information about the faults (e.g., information such as shown in FIG. 17A or 17B). The graphical user interfaces of FIG. 17E advantageously allows for faults to be presented relative to non-fault equipment or data. The graphic 1768, for example, shows the distribution of faulty equipment relative to non-fault equipment. In alternative embodiments, the graphic of 1768 may be modified to illustrate faulty data relative to non-faulty data for a single piece of equipment.

Configurations of Various Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on memory or other machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products or memory comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures may show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

The invention claimed is:

1. A controller for detecting energy usage faults in a building management system, the controller comprising:
   a processing circuit configured to maintain a history of energy usage values for the building management system;
   wherein the processing circuit is configured to calculate a threshold parameter using a first subset of the history of energy usage values defined by a sliding time window, the threshold parameter establishing an energy usage value limit relative to the history of energy usage values;
   wherein the processing circuit is configured to identify energy outlier days by comparing energy use for a first day with the threshold parameter;
   wherein the processing circuit is configured to dynamically update the threshold parameter by sliding the time window forward in time to define a second subset of the history of energy usage values and using the second subset of the history of energy usage values to calculate an updated threshold parameter;
   wherein the processing circuit is configured to identify energy outlier days by comparing energy use for a second day with the updated threshold parameter.

2. The controller of claim 1, wherein the sliding time window defines a time period of a predetermined duration ending at a current date;
   wherein the processing circuit is configured to slide the time window forward in time and to calculate the updated threshold parameter in response to updating the current date.

3. The controller of claim 1, wherein the processing circuit is configured to calculate a first average daily cost using the history of energy usage values with the outlier days and a second average daily cost using the history of energy usage values excluding the outlier days;
   wherein the processing circuit is configured to estimate an additional cost of the energy outlier days by calculating a difference between the first average daily cost and the second average daily cost; and wherein the processing circuit is configured to assign the estimated additional cost of the energy outlier days to a cost of energy usage faults in the building management system.

4. The controller of claim 3, wherein the processing circuit is configured to output the cost of the energy usage faults to at least one of a remote device and a local electronic display.

5. The controller of claim 1, wherein energy usage comprises at least one of demand and consumption of an energy utility;

wherein the energy utility comprises at least one of an electric utility, a gas utility, a steam utility, and a water utility.

6. A controller for detecting energy usage faults in a building management system, the controller comprising:

a processing circuit configured to maintain a history of energy usage values for the building management system;

wherein the processing circuit is configured to use the history of energy usage values to identify a daily energy usage feature for each of a plurality of days represented in the history of energy usage values;

wherein the processing circuit is configured to group like days based on the identified daily energy usage features to create a plurality of day-type groups;

wherein the processing circuit is configured to calculate a threshold parameter of daily energy usage for each day-type group using the history of energy usage values for the days in the day-type group for which the threshold parameter is calculated;

wherein the processing circuit is configured to identify energy outlier days by comparing energy use for a day with one of the calculated threshold parameters.

7. The controller of claim 6, wherein comparing energy usage for a day with the threshold parameter comprises:

metering energy usage during the day;
identifying a day-type group associated with the day; and
comparing the metered energy usage with the threshold parameter calculated for the identified day-type group to determine whether the day is an energy outlier relative to other days in the same day-type group.

8. The controller of claim 6, wherein energy usage comprises at least one of demand and consumption of an energy utility;

wherein the energy utility comprises at least one of an electric utility, a gas utility, a steam utility, and a water utility.

9. The controller of claim 6, wherein calculating the threshold parameter for each day-type group comprises:

determining a peak energy demand for the days in the day type group for which the threshold parameter is calculated; and
using the peak energy demand as the threshold parameter for the day-type group.

10. The controller of claim 6, wherein the processing circuit is configured to generate an alarm and to cause the alarm to be transmitted to a remote device in response to a determination, by the processing circuit, that the day for which energy usage is metered is an energy outlier relative to other days in the same day-type group.

11. The controller of claim 10, wherein the processing circuit is configured to generate the alarm and to cause the alarm transmission during the day of the metered energy usage.

12. The controller of claim 10, wherein the processing circuit is configured to generate the alarm and to cause the alarm transmission in near real-time in response to the metered energy usage exceeding the threshold value.

13. The controller of claim 6, wherein the processing circuit is configured to identify weather outlier days by comparing a weather parameter for the day to a history of weather parameters.

14. The controller of claim 13, wherein the processing circuit is configured to determine whether the energy outlier day is also a weather outlier day;

wherein the processing circuit is configured to exclude the energy outlier day from consideration as a fault in response to a determination that the energy outlier day is also a weather outlier day.

15. The controller of claim 6, wherein the processing circuit is configured to forecast energy usage during a day and to use the forecasted energy usage to determine whether the forecasted energy usage exceeds the threshold parameter calculated for the day-type group associated with the day.

16. A computerized method for detecting faults in building equipment, the method comprising:

comparing an actual performance of building equipment to an expected performance of the building equipment, wherein the comparison comprises calculating an error between the actual performance and the expected performance;

applying results of a statistical analysis to the comparison to identify a deviation from the expected performance, wherein identifying a deviation from the expected performance comprises maintaining an exponentially weighting moving average of the error and comparing the exponentially weighted moving average to a threshold;

determining whether to identify the error as associated with an equipment fault based on whether the exponentially weighted moving average exceeds the threshold; and generating an output signal indicative of an equipment fault in response to the exponentially weighted moving average exceeding the threshold.

17. The computerized method of claim 16, further comprising:

applying utility rate information to the actual performance of the building equipment and the expected performance of the building equipment to obtain a cost difference;

outputting an indication the cost difference as attributed to the equipment fault in response to a determination that the error should be identified as associated with the equipment fault.

18. The computerized method of claim 17, further comprising:

determining whether the actual performance of the building equipment for a period of time is better than a previously determined best performance storing the actual performance as a new best performance parameter in response to a determination that the actual performance of the building equipment for the period of time is better than a previously determined best performance;

using the new best performance parameter to build a new regression model for calculating expected performance in a subsequent period of time.

* * * * *